United States Patent [19]

Kumamoto et al.

[11] Patent Number: 5,629,700
[45] Date of Patent: May 13, 1997

[54] PIPELINE TYPE ANALOG TO DIGITAL CONVERTER INCLUDING PLURAL SERIES CONNECTED ANALOG TO DIGITAL CONVERTER STAGES

[75] Inventors: Toshio Kumamoto; Osamu Matsumoto; Takahiro Miki; Masao Ito; Takashi Okuda, all of Tokyo, Japan

[73] Assignee: Mitsubishi Denki Kabushiki Kaisha, Tokyo, Japan

[21] Appl. No.: 552,016

[22] Filed: Nov. 2, 1995

[30] Foreign Application Priority Data

May 25, 1995 [JP] Japan ................................ 7-126529

[51] Int. Cl.$^6$ ........................................ H03M 1/34
[52] U.S. Cl. ..................... 341/161; 341/155; 341/156
[58] Field of Search ................................ 341/101, 144, 341/145, 154, 156, 161

[56] References Cited

U.S. PATENT DOCUMENTS

| | | | |
|---|---|---|---|
| 5,291,198 | 3/1994 | Dingwall et al. | 341/159 |
| 5,387,914 | 2/1995 | Mangelsdorf | 341/156 |
| 5,436,629 | 7/1995 | Mangelsdorf | 341/165 |
| 5,499,027 | 3/1996 | Karnicolas et al. | 341/120 |
| 5,534,864 | 7/1996 | Ono et al. | 341/156 |
| 5,548,287 | 8/1996 | Gendai | 341/133 |

OTHER PUBLICATIONS

IEEE 1991 Custom Integrated Circuits Conference, pp. 26.4.1–26.4.4, Stephen H. Lewis, et al., "A Pipelined 9–Stage Video–Rate Analog–To–Digital Converter".

IEEE 1992 Custom Integrated Circuits Conference, pp. 16.7.1–16.7.4, Michio Yotsuyanagi, et al., "A 10BIT 50Msample/sec Pipelined CMOS A/D Converter with S/H".

Analog Devices, Design–In Reference Manual, Part Numbers AD875 and 873 Aug. 1994.

Primary Examiner—Jeffrey A. Gaffin
Assistant Examiner—Jason H. Vick
Attorney, Agent, or Firm—Oblon, Spivak, McClelland, Maier & Neustadt, P.C.

[57] ABSTRACT

An A/D converter block A/D1 converts an analog input signal Vin to a digital signal and outputs its D/A output. First SH/SUBT7, 8 sample the signal Vin and a voltage VRM at the same timing with said A/D conversion and output the results of subtraction of the respective sampling values and the D/A output during holding, respectively. The both results of subtraction are several tens mV and there is no need of taking account of the linearity of a differential amplifier DIFF11. During the sampling, a circuit SHR1 outputs the differential voltages between each reference tap voltage taken out from specific 2 points of the ladder-type resistor in the A/D converter block A/D1 and the voltage VRM while a differential amplifier DIFF12 applies the reference voltages to the next A/D converter block A/D2. Such operations are performed in each stage. Thus, it becomes possible to make any S/H circuit and amplifier of excellent linearity in the first stage unnecessary to reduce the electric power consumption.

14 Claims, 44 Drawing Sheets

SH1/SUBT1

| FIG. 13 |
| FIG. 14 |

A/D 1 B

REDUCTION OF IN-PHASE POTION OF OUTPUT OF Cc $$Vin1 : \left(Vb - \frac{\Delta V1h + \Delta V1\ell}{2}\right)$$

$$Vin2 : \left(Vb - \frac{\Delta V2h + \Delta V2\ell}{2}\right)$$

SH4/SUBT3H

PIPELINE TYPE ANALOG TO DIGITAL CONVERTER INCLUDING PLURAL SERIES CONNECTED ANALOG TO DIGITAL CONVERTER STAGES

BACKGROUND OF THE INVENTION

1. Field of the Invention The present invention relates to a pipeline type analog to digital converter including plural series connected analog to digital converter stages.

2. Description of the Background Art

FIG. 46 indicates the construction of a conventional pipeline type A/D converter. The A/D converter shown in this drawing is one which was disclosed in "IEEE 1991 CUSTOM INTEGRATED CIRCUITS CONFERENCE, P.P.26.4.1 ~26.4.4, STEPHEN H. LEWIS ET AL". Each stage is composed of a 2-bit A/D conversion sub-block ADSC, a D/A converter DAC for converting the result of A/D conversion to an analog value, a subtracting circuit $\Sigma$ and a sampling & holding amplifier SHA having a degree of amplification to double value, and this converter generates 10 bits of digital output values in total by taking a 9-stage construction.

In the pipeline type A/D converter indicated in FIG. 46, the subtracting circuit $\Sigma$ and the double amplifier SHA must be of high accuracy among the constituting elements of the respective stages.

Here, the description will be given on the operating principle of this type of A/D converter. FIG. 47 indicates the operating principle.

In this drawing, the A/D converter in the first stage roughly performs A/D conversion in 2 bits. In this case, the value of input voltage Vin is, in its relation with voltages Vr1, Vr2, Vr3 of intermediate taps obtained by resistively dividing the voltage between the upper limit value VRT of reference voltage and the lower limit value VRB of reference voltage., larger than the tap voltage Vr2 but smaller than the tap voltage Vr3. Therefore, the result of A/D conversion in the first stage becomes code "10".

Here, if the electric potential difference (Vin-Vr2), defined as $\Delta V$, can be multiplied by 4 accurately, the A/D converter in the next stage can share the input voltage range determined by the reference voltage VRT and the reference voltage VRB in the first stage as its input voltage range VRT2 to VRB2, and therefore, the voltage 4·$\Delta V$ obtained by multiplying the voltage $\Delta V$ with 4 is larger than the lower limit value VRB2 of the reference voltage in the second stage but smaller than the tap voltage Vr1. Consequently, the result of A/D conversion in the second stage becomes code "00".

Moreover, if the electric potential difference (4·$\Delta V$-VRB2) between the voltage 4·$\Delta V$ obtained by multiplying the voltage $\Delta V$ with 4 and the lower limit value VRB2 of the reference voltage in the second stage can be further multiplied by 4 accurately, the A/D converter in the further next stage can also share the input voltage range VRT to VRB in the first stage as its input voltage range VRT3 to VRB3, and, as a result, the voltage (4·4·$\Delta V$) obtained by multiplying the voltage (4·$\Delta V$) with 4 becomes larger than the tap voltage Vr2 but smaller than the tap voltage Vr3. Therefore, the result of A/D conversion in the third stage becomes code "10". In the same way, the output codes in the respective stages are determined one after another.

As a result, the analog input voltage Vin in the case of FIG. 47 can be obtained by adding sequentially from the output of the A/D converter in the first stage to the output of the A/D converter in the final stage, taking account of their weights. Namely, a digital code reading as 100010 . . . is output, so that the digital code corresponding to the analog input voltage Vin is determined.

On the other hand, FIG. 48 indicates the construction of another conventional 10-bit A/D converter disclosed in "IEEE 1992 CUSTOM INTEGRATED CIRCUITS CONFERENCE, P.P.16.7.1~16.7.4, MICHIO YOTSUYANAGI ET AL". This A/D converter is a pipeline type A/D converter of 3-stage construction, each stage consisting of a 4-bit A/D converter block. The S/H circuit and the subtracting block in each stage are designed for sampling an inputted analog value and holding the sampled value for a certain period of time to perform the A/D conversion, D/A conversion and subtraction during that period.

(First Problem of the Conventional Arts)

Conventional A/D converters are constructed as described above. Therefore, in the case stated in FIG. 47, it is necessary to amplify the difference between the analog input voltage and the reference voltage or the intermediate tap voltage accurately to 4.00 times the initial value and the linearity of the A/D converter is lost in case of poor accuracy of this amplification degree.

Therefore, in the prior arts, it is necessary to realize the sampling & holding amplifier as a high-accuracy amplifier. For that reason, the method conventionally practiced for realizing high-accuracy amplification to 4.00 times the initial value, etc. consists in giving feedback to a high-speed amplifier of sufficiently large amplification degree (ideally with gain $\infty$, realistically with gain of at least magnification 1000) to realize the high-accuracy amplifier and set the amplification degree exactly to 4.00 times.

However, a large amount of electric power must be consumed to actually realize such high-speed amplifier of large amplification degree in the predetermined precision. This presents a problem of large electric power consumption in both the S/H circuit SHA provided in the input portion of the A/D converter and the sampling & holding amplifier on output side in each stage of FIG. 46.

In the same way, also in the case of the A/D converter in FIG. 48, high-speed amplifiers of large amplification degree operated with feedback are utilized in the S/H circuit and the subtractor. For that reason, the same problem of increased electric power consumption is produced also with the A/D converter of FIG. 48.

(Second Problem of the Conventional Arts)

In a conventional pipeline type A/D converter, the analog input signal is first applied to the S/H circuit, as it is also indicated in both FIG. 46 and FIG. 48. Therefore, in the case where the S/H circuit is provided in the first stage this way, the S/H circuit concerned is requested to have an accuracy of the range of a size equal to the dynamic range of the input signal. For example, when the voltage range of the analog input signal is 1 Vpp, the S/H circuit which receives such analog input signal must have the accuracy over the range of 1 V and its linearity must be controlled to no more than 0.5 mV when constituting a 10-bit A/D converter.

However, it is practically difficult to construct a S/H circuit having such sufficient linearity over such a wide input range and, for that reason, a S/H circuit as described above is usually realized by applying feedback to a high-speed amplifier with high gain.

Therefore, (with conventional pipeline type A/D converter), there was a problem that the electric power consumption in the S/H circuit which receives the analog input signal gets larger, increasing the electric power consumption of the entire A/D converter.

SUMMARY OF THE INVENTION

In the invention of the first aspect, the pipeline type analog to digital converter comprises an analog to digital converter block provided in each stage for analog to digital convening its input signals in predetermined number of bits and for digital to analog converting the result of the analog to digital conversion to output the digital to analog conversion result, the input signals consisting of 2 signals of differential input type signals, each of the analog to digital converter blocks which belong to the stage next to the first stage to the final stage comprising 2 ladder-type resistors composed of serially connected plural number of resistors, and the pipeline type analog to digital converter further comprises, in a path between the analog to digital converter block of a certain stage and the analog to digital converter block of its next stage, between successive stages from the second stage to the final stage, S/H & subtracting for input signals means for sampling each of the input signals input in the analog to digital converter block of the certain stage at the same timing as the analog to digital converter block concerned and, at the time of holding, for subtracting each of the 2 digital to analog outputs output by the analog to digital converter block of the certain stage from each of corresponding the sampled input signals, differential amplifying for input signals means for differentially amplifying 2 outputs of the S/H & subtracting for input signals means to output its 2 outputs as the input signals of the analog to digital converter block of the next stage and, at the same time, for applying the 2 outputs to both ends of the ladder-type resistor on one side in the analog to digital converter block of the next stage, S/H for reference voltages means, provided with the same circuit constants and the same circuit construction as the S/H & subtracting for input signals means, for sampling and holding each of tap voltages taken out from specific 2 taps inside the ladder-type resistor in the analog to digital converter block of the certain stage, and differential amplifying for reference voltages means for differentially amplifying 2 outputs of the S/H for reference voltages means and for applying its 2 outputs, as reference voltages in the analog to digital converter block of the next stage, to both ends of the ladder-type resistor on the other side in the analog to digital converter block of the next stage, and the S/H & subtracting for input signals means and the S/H for reference voltages means alternately performing their sampling operation and holding operation.

In the invention of the second aspect, the specific 2 taps in the pipeline type analog to digital converter as defined in the first aspect are selected in such a way that the potential difference between corresponding the tap voltage and an intermediate value of 2 the reference voltages applied respectively to both ends of the ladder-type resistor may correspond respectively to +0.5 LSB, −0.5 LSB.

In the invention of the third aspect, in the pipeline type analog to digital converter as defined in the first aspect, the analog to digital converter block of the first stage comprises one other ladder-type resistor equivalent to the ladder-type resistor, a signal which corresponds to one of the input signals in the first stage is an analog input signal input as single end, another signal which corresponds to the other of the input signals in the first stage is a DC voltage equal to an intermediate value of an upper limit value of the reference voltage and a lower limit value of reference voltage applied respectively to both ends of the other ladder-type resistor in the analog to digital converter block of the first stage, and the difference between 2 specific tap voltages in the other ladder-type resistor and the intermediate value of the upper and lower limit values of the reference voltage is a potential difference corresponding respectively to +0.5 LSB, −0.5 LSB, and the pipeline type analog to digital converter further comprises, in a path between the analog to digital converter block of the first stage and the analog to digital converter block of the second stage, other S/H & subtracting for input signals means for sampling each of the analog input signal and the DC voltage input in the analog to digital converter block of the first stage at the same timing as the analog to digital converter block concerned and, at the time of holding, for subtracting each of 2 digital to analog outputs output by the analog to digital converter block of the first stage from the corresponding analog input signal and the DC voltage after sampling respectively to output the subtraction results, other differential amplifying for input signals means for differentially amplifying 2 outputs of the other S/H & subtracting for input signals means to output its 2 outputs as the input signals of the analog to digital converter block of the second stage and, at the same time, for applying the 2 outputs to both ends of the ladder-type resistor in the analog to digital converter block of the second stage, other S/H for reference voltages means, provided with the same circuit constants and the same circuit construction as the other S/H & subtracting for input signals means, for sampling and holding each of the tap voltages in the other ladder-type resistor in the analog to digital converter block of the first stage, and other differential amplifying for reference voltages means for differentially amplifying 2 outputs of the other S/H for the reference voltages means and for applying its 2 outputs, as the reference voltages in the analog to digital converter block of the second stage, to both ends of the other ladder-type resistor on the other side in the analog to digital converter block of the second stage, respectively, the other S/H & subtracting for input signals means and the other S/H for reference voltages means alternately performing their sampling operation and holding operation.

In the invention of the fourth aspect, the pipeline type analog to digital converter comprises an analog to digital converter block provided in each stage for analog to digital converting its input signal in predetermined number of bits and for digital to analog converting the result of the analog to digital conversion to output the digital to analog conversion result, the analog to digital converter block of the first stage directly receiving an analog input signal to be submitted to analog to digital conversion, the analog to digital converter block of the first stage comprising ladder-type resistor composed of serially connected plural number of resistors, and voltage comparators, provided in correspondence to each of predetermined taps of the ladder-type resistor, for sampling the analog input signal at certain timing and for comparing the sampled analog input signal and a corresponding reference tap voltage at the time of holding, the pipeline type analog to digital converter further comprises, in a path between the analog to digital converter block of the first stage and the analog to digital converter block of second stage, S/H & subtracting means for sampling the analog input signal at the timing and, at the time of holding, for performing subtraction of a digital to analog output which is being sampled to output the result of the subtraction of the analog to digital converter block of the first stage and the analog input signal, and amplifying means for amplifying an output of the S/H & subtracting means to output an output obtained on the basis of that amplification as the input signal of the analog to digital converter block of the second stage.

In the invention of the fifth aspect, the pipeline type analog to digital converter as defined in the fourth aspect further comprises, in the path between the analog to digital converter block of the first stage and the analog to digital converter block of the second stage, S/H means, provided with the same circuit constants and the same circuit construction as the S/H & subtracting means, for sampling and holding 2 specific tap voltages in the ladder-type resistor, and differential amplifying for reference voltages means for differentially amplifying respective outputs of the S/H means and for outputting its 2 outputs as an upper limit value and a lower limit value of reference voltages in the analog to digital converter block of the second stage, respectively, and the S/H & subtracting means and the S/H means alternately performing their sampling operation and holding operation.

In the invention of the sixth aspect, in the pipeline type analog to digital converter as defined in the fifth aspect, each of the analog to digital converter blocks in the second stage to a final stage comprises an other ladder-type resistor, and voltage comparators, provided in correspondence to each of predetermined taps of the other ladder-type resistor, for sampling the input signal to be input in the analog to digital converter concerned at certain next timing and comparing, at the time of holding, the sampled input signal and a corresponding reference tap voltage on the other ladder-type resistor, and the pipeline type analog to digital converter further comprises, in respective paths between the each analog to digital converter block in the second stage to the final stage and the analog to digital converter block of next stage thereof, S/H & subtracting means for sampling the input signal at the certain next timing and, at the time of holding, for performing subtraction of a digital to analog output of the analog to digital converter concerned and the input signal which is being sampled to output the result of the subtraction, other amplifying means for differentially amplifying an output of the other S/H & subtracting means to an output obtained on the basis of the amplification as the input signal of the analog to digital converter block of the next stage, other S/H means, provided with the same circuit constants and the same circuit construction as the other S/H & subtracting means, for sampling and holding each of the 2 specific reference tap voltages in the other ladder-type resistor in the analog to digital converter block concerned to output, and other differential amplifying for reference voltages means for differentially amplifying respective outputs of the other S/H means and for applying its 2 outputs to both ends of the other ladder-type resistor in the analog to digital converter block of the next stage, the other S/H & subtracting means and the other S/H means alternately performing their sampling operation and holding operation.

In the invention of the seventh aspect, in the pipeline type analog to digital converter as defined in the sixth aspect, the S/H & subtracting means comprises a coupling capacitor which receives the analog input signal at its one end and a bias voltage at its other end during its sampling, and receives the digital to analog output of the analog to digital converter block concerned at the one end and has the other end connected to the output terminal of the S/H & subtracting means during its holding, and the S/H means comprises a new coupling capacitor which has the same value as the coupling capacitor and receives the reference tap voltage taken out from the ladder-type resistor at its one end and the bias voltage at its other end during its sampling, and receives a constant voltage at the one end and has the other end connected to an output terminal of the S/H means during its holding.

In the invention of the eighth aspect, in the pipeline type analog to digital converter as defined in the seventh aspect, each of the other S/H & subtracting means comprises an other coupling capacitor which receives the input signal at its one end and other bias voltage at its other end during its sampling, and receives the digital to analog output of the analog to digital converter block concerned at the one end and has the other end connected to an output terminal of the other S/H & subtracting means during its holding, and each of the other S/H means comprises further other coupling capacitor which has the same value as the coupling capacitor and receives the reference tap voltage taken out from the other ladder-type resistor at its one end and the other bias voltage at its other end during its sampling, and receives an other constant voltage at the one end and has the other end connected to an output terminal of the other S/H during its holding.

In the invention of the ninth aspect, in the pipeline type analog to digital converter as defined in the eighth aspect, the bias voltage applied to the S/H & subtracting means and the S/H means is also applied as a bias voltage of the voltage comparator in the analog to digital converter block of the first stage, and the other bias voltage applied to the other S/H & subtracting means and the other S/H means is also applied as a bias voltage of the other voltage comparators in corresponding the analog to digital converter block.

In the invention of the tenth aspect, the pipeline type analog to digital converter comprises an analog to digital converter block provided in each stage for analog to digital converting its input signals in predetermined number of bits and for digital to analog converting the result of the analog to digital conversion to output the digital to analog conversion result, the analog to digital converter block of the first stage directly receiving an analog input signal to be submitted to analog to digital conversion, and comprising a ladder-type resistor composed of serially connected plural number of resistors, and the pipeline type analog to digital converter further comprises, in a path between the analog to digital converter block of the first stage and the analog to digital converter block of the second stage, first S/H & subtracting means for sampling the analog input signal at the same timing as that of the analog to digital converter block of the first stage, for outputting a predetermined voltage value during the sampling and, during the holding, for subtracting a variation value from the sampling value of the analog input value to a value of the digital to analog output by the analog to digital converter block of the first stage from the predetermined voltage value to output the subtraction result, second S/H & subtracting means for sampling 2 specific tap voltages in the ladder-type resistor at the timing, for outputting the predetermined voltage value during the sampling and, during the holding, for subtracting the results obtained by subtracting the intermediate reference tap voltage from the 2 specific tap voltages from the predetermined voltage value to thereby output the subtraction result, and differential amplifying means for receiving both outputs of the first and second S/H & subtracting means to obtain differential signals of the both outputs and for outputting the differential signals on the analog to digital converter block of the second stage as the input signals.

In the invention of the eleventh aspect, in the pipeline type analog to digital converter as defined in the tenth aspect, the analog to digital converter block of the first stage further comprises a plural number of voltage comparators provided respectively for predetermined taps determined according to the bit number, of a plural number of taps of the ladder-type resistor, and each of the voltage comparators compares the relative size of a difference between the analog input signal and the intermediate reference tap voltage and a difference between the reference tap voltage at the predetermined tap and the intermediate reference tap voltage.

In the invention of the twelfth aspect, the pipeline type analog to digital converter comprises in each stage belonging to the first stage to the final stage, a differential amplifier for input signals and a differential amplifier for reference voltages, both provided in a path between the stage concerned and a stage preceding the stage concerned for performing differential operations in a way to complement each other, and an analog to digital converter block having a ladder-type resistor of which respective voltage values at both ends are 2 outputs of the differential amplifier for reference voltages, for receiving 2 differential type outputs of the differential amplifier for input signals as input signals, for analog to digital converting the input signals in predetermined bit number and for outputting the digital to analog conversion result, each the analog to digital converter block comprising for each predetermined tap determined according to the predetermined bit number of a plural number of taps of the ladder-type resistor, a differential amplifier for comparison of voltages, a first switch which is provided between a one input and a one output of the differential amplifier for comparison of voltages, for turning "on" when the differential amplifier for input signals outputs the input signals and a bias voltage is applied to two input terminals of the differential amplifier for reference voltages, for turning "off" when the differential amplifier for reference voltages outputs the outputs and the bias voltage is applied to two input terminals of the differential amplifier for input signals, a second switch which is provided between an other input and an other output of the differential amplifier for comparison of voltages, and for turning "on" when the differential amplifier for input signals outputs the input signals and the bias voltage is applied to two input terminals of the differential amplifier for reference voltages, for turning "off" when the differential amplifier for reference voltages outputs the 2 outputs and the bias voltage is applied to two input terminals of the differential amplifier for input signals, a first coupling capacitor of which a one end and an other end are connected to the one input of the differential amplifier for comparison of voltages and a one output of the differential amplifier for input signals, a second coupling capacitor of which a one end and an other end are connected to the one input of the differential amplifier for comparison of voltages and an other predetermined tap corresponding to the predetermined tap, respectively, a third coupling capacitor of which a one end and an other end are connected to the other input of the differential amplifier for comparison of voltages and the predetermined tap, respectively, and a fourth coupling capacitor of which a one end and an other end are connected to the other input of the differential amplifier for comparison of voltages and an other output of the differential amplifier for input signals, a potential difference between a voltage at the predetermined tap and an intermediate reference tap voltage being equal to a potential difference between a voltage at the other predetermined tap and the intermediate reference tap voltage, the intermediate reference tap voltage corresponding to an average value of respective voltage values at both ends of the ladder-type resistor, and the first to fourth coupling capacitors all having one same capacity value.

In the invention of the thirteenth aspect, the pipeline type analog to digital converter as defined in the twelfth aspect further comprises, in each of the stages, a fifth coupling capacitor of which a one end and an other end are connected to a one output of the differential amplifier for input signals and a one input of the differential amplifier for input signals provided in a path from the step concerned to the next step, respectively, a sixth coupling capacitor of which a one end and an other end are connected to a one digital to analog output of the analog to digital converter block of the step concerned and the other end of the fifth coupling capacitor, respectively, a seventh coupling capacitor of which a one end and an other end are connected to a one digital to analog output of the analog to digital converter block of the step concerned and an other input of the differential amplifier for input signals provided in the path from the step concerned to the next step, respectively, and an eighth coupling capacitor of which a one end and an other end are connected to an other output of the differential amplifier for input signals of the other end of the seventh coupling capacitor, respectively, a third switch of which a one end and an other end are connected to a bias voltage generating circuit for generating the bias voltage and the other end of the fifth coupling capacitor, respectively, for turning "on" when the differential amplifier for input signals outputs the input signals and the bias voltage is applied to the differential amplifier for reference voltages, and for turning "off" when the differential amplifier for reference voltages outputs the two outputs and the bias voltage is applied to the differential amplifier for input signals, a fourth switch of which a one end and an other end are connected to the bias voltage generating circuit and the other output of the seventh coupling capacitor, respectively, for turning "on" when the differential amplifier for input signals outputs the input signals and the bias voltage is applied to the differential amplifier for reference voltages, for turning "off" when the differential amplifier for reference voltages outputs the two outputs and the bias voltage is applied to the differential amplifier for input signals, and the respective capacity values of the fifth to eighth coupling capacitors being identical.

In the invention of the fourteenth aspect, the pipeline type analog to digital converter comprises, in each stage, an analog to digital converter block having a ladder-type resistor for analog to digital converting two input signals in predetermined number of bits and for digital to analog converting the analog to digital conversion result to output the digital to analog conversion result, and for transmitting, as reference voltages, the reference tap voltages at 2 specific points of the ladder-type resistor to the next stage, and the pipeline type analog to digital converter further comprises, in a path between the stage preceding the final stage and the final stage, a first switch for selectively outputting one of the input signals transmitted from the stage preceding the final stage, 2 digital to analog output signals output by the analog to digital converter block of the stage preceding the final stage, a bias voltage and one of the reference tap voltages, a second switch for selectively outputting other of the input signals, the 2 digital to analog output signals, the bias voltage and other of the reference tap voltages, a coupling capacitor having a one end connected to an output of the first switch and an other end receiving the bias voltage in synchronization with the output of the one of the input signals from the first switch, an other coupling capacitor having a one end connected to an output of the second switch and an other end receiving the bias voltage in synchronization with the output of the other of the input signals from the second switch, and a differential amplifier having a one input connected to an other end of the coupling capacitor and an other input connected to an other end of the other coupling capacitor, and 2 outputs being applied as the input signals to the analog to digital converter block of the final stage.

In the invention of the first aspect, the analog to digital converter block of a certain stage samples input signals, while the S/H & subtracting means samples the input signals at the same timing.

At this time, the S/H for reference voltages means is in the state of holding and is outputting 2 tap voltages to the differential amplifying for reference voltages means.

As a result, the differential amplifying for reference voltages means applies 2 outputs obtained by amplifying the difference between the 2 tap voltages, as reference voltages in the analog to digital converter block of the next stage, to the analog to digital converter block concerned.

After that, the analog to digital converter block of a certain stage performs the analog to digital conversion of the input signals, and outputs that digital to analog output to the S/H & subtracting for input signals means which is in the state of holding.

As a result, the S/H & subtracting for input signals means determines the result of subtraction of the sampled input signals and the digital to analog outputs, and outputs that result to the differential amplifying for input signals means.

The differential amplifying for input signals means amplifies the difference between the 2 results of subtraction and outputs the 2 outputs obtained as input signals for the analog to digital converter block in the next stage.

On the other hand, the differential amplifying for reference voltages means is in the state of sampling operation.

According to the invention of the first aspect, because reference voltages are transmitted, together with input signals, from a certain stage to the next stage through means having one same circuit construction, there is no need of having any high-accuracy amplifier for accurately amplifying the input signal to be input in the analog to digital converter block of the next stage up to the input range of the analog to digital converter block of the next stage, and this makes it possible to restrict increase of electric power consumption.

Moreover, according to the invention of the first aspect, because the S/H & subtracting for input signals means inputs, in the differential amplifying for input signals means, the results of subtraction of the sampled input signals and the digital to analog outputs output by the analog to digital converter block of a certain stage and that the results of subtraction are; at a sufficiently small level compared with the signals input in the analog to digital converter block of a certain stage, there is no need of using any differential amplifier of particularly excellent linearity as the differential amplifying for input signals means, and this also serves to restrict increase of electric power consumption.

Furthermore, according to the invention of the first aspect, the load of the differential amplifying for input signals means and the load of the differential amplifying for reference voltages means are both resistance loads, and this produces an effect of easy matching including loads.

In the invention of the second aspect, the potential difference given by [(tap voltage)−(intermediate voltage of 2 reference voltages applied respectively to both ends of ladder-type resistor)] corresponds to 1 LSB.

In the invention of the third aspect, the analog to digital converter block of the first stage samples the analog input signal, while the other S/H & subtracting for input signals means samples the analog input signals at the same timing.

At this time, the other S/H for reference voltages means is in the state of holding and is outputting 2 tap voltages in the analog to digital converter block of the first stage to other differential amplifying for reference voltages means.

As a result, the other differential amplifying for reference voltages means applies 2 outputs obtained by amplifying the difference between the 2 tap voltages, as reference voltages in the analog to digital converter block of the next second stage, to the analog to digital converter block concerned.

After that, the analog to digital converter block of the first stage performs analog to digital conversion of the analog input signal, and outputs that digital to analog output to other S/H & subtracting for input signals means which is in the state of holding.

As a result, the other S/H & subtracting for input signals means determines the result of subtraction of the sampled analog input signal and the digital to analog output, and outputs that result to the other differential amplifying for input signals means.

In response to it, the other differential amplifying for input signals means amplifies the difference between the 2 results of subtraction and outputs the 2 outputs obtained as input signals for the analog to digital converter block in the next second stage.

On the other hand, the other differential amplifying for reference voltages means is in the state of sampling operation.

According to the invention of the third aspect, the S/H circuit of analog input signal which was conventionally required in the first stage becomes unnecessary, it becomes possible to transmit the reference voltages determined in the first stage as reference voltages of the next second stage and there is no need of taking account of linearity of the amplifiers existing on the path from the first stage to the next second stage, enabling sufficient restriction of increase of electric power consumption.

In the invention of the fourth aspect, the voltage comparator in the analog to digital converter block of the first stage samples the analog input signal input.

Moreover the S/H & subtracting means samples the analog input signal at the same timing as above.

After that, the voltage comparator performs analog to digital conversion of the analog input signal, and the analog to digital converter block concerned outputs that digital to analog output to the S/H & subtracting means which is in the state of holding.

As a result, the S/H & subtracting means determines the result of subtraction of the sampled analog input signal and the digital to analog output, and outputs that result to the amplifier.

The output of the amplifier concerned becomes the input signal of analog to digital converter block in the next second stage.

According to the invention of the fourth aspect, the S/H circuit of analog input signal which was conventionally required in the first stage becomes unnecessary and the results of subtraction obtained by the S/H & subtracting means are at a sufficiently small level compared with the level of analog input signal, and this makes it unnecessary to use any amplifier of excellent linearity as the amplifying means provided in the path between the first stage and the next second stage and enables restriction of increase of electric power consumption.

In the invention of the fifth aspect, when the S/H & subtracting means is sampling the analog input signal, the S/H means is in the state of holding and is outputting 2 tap voltages in the analog to digital converter block of the first stage to the differential amplifying for reference voltages means.

As a result, the differential amplifying for reference voltages means applies 2 outputs obtained by amplifying the difference between the 2 tap voltages to the analog to digital converter block concerned respectively as the upper limit value and the lower limit value of reference voltages in the analog to digital converter block of the next second stage.

On the other hand, when the S/H & subtracting means is outputting its result of subtraction, the S/H means is in the sampling state.

According to the invention of the fifth aspect, in the case where the S/H circuit of the analog input signal which was conventionally required in the first stage is made unnecessary, the reference voltages are transmitted, together with the input signals, from the first stage to the next second stage through respective means having one same circuit construction and there is no need of having any high-accuracy amplifier for accurately amplifying the input signals to be input in the analog to digital converter block of this second stage up to the input range of the analog to digital converter block of this second stage, and this makes it possible to restrict increase of electric power consumption.

In the invention of the sixth aspect, for the respective stages from the second stage to the final stage, the analog to digital converter block of the stage samples the input signals input, while the other S/H & subtracting means samples the input signals at the same timing.

At that time, the other S/H means is in the state of holding and is outputting 2 tap voltages to the other differential amplifying for reference voltages means.

As a result, the other differential amplifying for reference voltages means applies the 2 outputs obtained by amplifying the difference between the 2 reference tap voltages, as reference voltages in the analog to digital converter block of the next stage, to the analog to digital converter block in the next stage.

After that, the analog to digital converter block of the stage concerned performs analog to digital conversion of the input signals, and outputs that digital to analog output to the other S/H & subtracting means which is in the state of holding.

As a result, the other S/H & subtracting means determines the result of subtraction of the sampled input signal and the digital to analog output, and outputs that result obtained to the other differential amplifier.

The other differential amplifier outputs the outputs obtained as input signals for the analog to digital converter block in the next stage.

On the other hand, the other S/H for reference voltages means is in the state of sampling operation.

According to the invention of the sixth aspect, also for respective stages from the second stage to the final stage, there is no need of using any amplifier of excellent linearity as amplifying means provided in the path between the stage concerned and the next stage and, moreover, it becomes possible to transmit the reference voltages determined in the current stage as reference voltages of the next stage making any high-accuracy amplifier unnecessary, and those points enable further restriction of increase of electric power consumption.

In the invention of the seventh aspect, the coupling capacitor of the S/H & subtracting means is charged with the analog input signal during its sampling and outputs, during its holding, the voltage value obtained by subtracting the portion of change from the analog input signal to the digital to analog output from the bias voltage, to the output terminal of the S/H & subtracting means.

In the same way, the new coupling capacitor of the S/H means is charged with the reference tap voltage during its sampling and outputs, during its holding, the voltage value obtained by subtracting the portion of change from the reference tap voltage to the constant voltage value from the bias voltage, to the output terminal of the S/H means.

According to the invention of the seventh aspect, it becomes possible to easily realize the S/H & subtracting means and the S/H means respectively with the coupling capacitor and new coupling capacitor.

In the invention of the eighth aspect, the other coupling capacitor of the other S/H & subtracting means is charged with the input signal during its sampling and outputs, during its holding, the voltage value obtained by subtracting the portion of change from the input signal to digital to analog output from the other bias voltage, to the output terminal of the other S/H & subtracting means.

In the same way, the further other coupling capacitor of the other S/H means is charged with the reference tap voltage during its sampling and outputs, during its holding, the voltage value obtained by subtracting the portion of change from the reference tap voltage to the other constant voltage value from the other bias voltage, to the output terminal of the other S/H means.

According to the invention of the eighth aspect, it becomes possible to easily realize the S/H & subtracting means and the S/H means respectively with the other coupling capacitor and further other coupling capacitor.

In the invention of the ninth aspect, the bias voltage applied to the S/H & subtracting means and the S/H means is also the bias voltage of the voltage comparators in the analog to digital converter block in the first stage.

Moreover, the other bias voltage applied to the other S/H & subtracting means and the other S/H means is also the bias voltage of the other voltage comparators in the corresponding analog to digital converter block.

According to the invention of the ninth aspect, it is possible to not only completely prevent occurrence of any lag of timing between the sampling made by the S/H & subtracting means and the sampling made by the voltage comparators of the analog to digital converter block in the first stage but also completely prevent occurrence of any lag of timing between the sampling made by other S/H & subtracting means of other stages and the sampling made by other voltage comparators of the analog to digital converter block in the current stage, and this enables realization of high accuracy in the analog to digital converter.

In the invention of the tenth aspect, during sampling of the analog to digital converter block in the first stage, the first and the second S/H & subtracting means are sampling the analog input signal and the intermediate reference tap voltage respectively at the same timing.

And, a predetermined voltage is applied to 2 inputs of the differential amplifying means at that time.

Next, during a holding when the analog to digital converter block outputs the result of digital to analog conversion, the first S/H & subtracting means inputs, in the differential amplifying means, the voltage value obtained by subtracting the portion of change by the digital to analog output by the analog to digital converter block in the first stage from the sampling value of the analog input signal, while the voltage value input in the differential amplifying means by the second S/H & subtracting means remains the predetermined voltage value.

Therefore, complete in-phase input of the differential amplifying means is realized, and the differential amplifying means concerned outputs the differential input signals accurately as input signals of the analog to digital converter block in the second stage.

According to the invention of the tenth aspect, it becomes possible to input, as input signals, differential signals of accurate results of subtraction from the first stage to the next second stage, and this enables realization of high accuracy of analog to digital converter.

In the invention of the eleventh aspect, the in-phase components applied to the amplifier in the respective voltage comparators become identical and, therefore, the respective voltage comparators compare the relative size accurately.

According to the invention of the eleventh aspect, it becomes possible to perform analog to digital conversion by the voltage comparators in the analog to digital converter block of the first stage with high accuracy, and this enables realization of high accuracy of analog to digital converter.

In the invention of the twelfth aspect, when the first and the second switches are "ON", the first and the fourth coupling capacitors are charged respectively with the output on the one side and the output on the other side of the differential amplifying for input signals means both containing an offset voltage in the differential amplifying for input signals means, and the third and the fourth capacitors are charged respectively with the other predetermined tap voltage and the predetermined tap voltage in the ladder-type resistor which is applied an offset voltage in the differential amplifying for reference voltages means.

After that, when the first and the second switches are turned "OFF", the first and the fourth coupling capacitors are applied the offset voltage in the differential amplifying for input signals means, while the second and the third capacitors are applied respectively with the other predetermined tap voltage and predetermined tap voltage in the ladder-type resistor which is applied two outputs including the offset voltage in the differential amplifying for reference voltages means.

And, the voltage comparator performs differential comparison of the voltage applied from the one ends of the first and the second coupling capacitors and the voltage applied from the one ends of the third and the fourth coupling capacitors.

As a result, the offset voltages in both the differential amplifying for reference voltages means and the differential amplifying for input signals means are cancelled.

According to the invention of the twelfth aspect, it becomes possible to cancel the respective offset voltages of the differential amplifier on input signal side and the differential amplifier on reference voltage side in the corresponding analog to digital converter blocks, and this enables realization of higher accuracy of analog to digital converter.

In the invention of the thirteenth aspect, because each of the fifth to the eighth coupling capacitors functions not only as a sample and hold circuit but also as a subtractor, the differential amplifying for input signals means on the path to the next step cancels the offset voltages in both the differential amplifying for input signals means and the differential amplifying for reference voltages means on the path from the previous step to the step concerned by its differential function.

According to the invention of the thirteenth aspect, it becomes possible to cancel the respective offset voltages of the differential amplifier on input signal side and the differential amplifier on reference voltage side in the corresponding S/H & subtracting means and S/H means respectively, and this enables realization of higher accuracy of analog to digital converter.

In the invention of the fourteenth aspect, the first switch, the second switch, the coupling capacitor, the other coupling capacitor and the differential amplifier function as a sampling & holding circuit and a subtracting circuit for transmitting the differential input signals and the differential reference voltages to the analog to digital converter block of the final stage.

According to the invention of the fourteenth aspect, it becomes possible to realize the S/H & subtracting means and the differential amplifier on the input signal side and the S/H means and the differential amplifier on the reference voltage side with one same circuit, and this enables realization of high accuracy of analog to digital converter.

(1) The first object of the present invention is to reduce electric power consumption in the pipeline type analog to digital converter by making any S/H circuit in the first stage unnecessary.

(2) The second object of the present invention is to reduce electric power consumption in the pipeline type analog to digital converter by making unnecessary any high-speed high-gain amplifier intended for accurately amplifying the results of subtraction in a certain stage to the input range of the analog to digital converter block of the next stage.

(3) The third object of the present invention is to reduce electric power consumption also in the pipeline type analog to digital converter of differential input construction.

(4) The fourth object of the present invention is to achieve high accuracy in the comparator inside the analog to digital converter block in each stage.

(5) The fifth object of the present invention is to achieve high accuracy in the transmission of the results of subtraction from first stage to second stage.

(6) The sixth object of the present invention is to achieve high accuracy in the respective comparators inside the analog to digital converter block in the first stage.

(7) The seventh object of the present invention is to achieve high accuracy in the pipeline type analog to digital converter by cancelling the offset voltage of the differential amplifier on the output side in each stage.

(8) The eighth object of the present invention is to realize high accuracy in the pipeline type analog to digital converter by constructing the differential amplifier on the signal path side and the differential amplifier on the reference voltage path side with one same circuit.

These and other objects, features, aspects and advantages of the present invention will become more apparent from the following detailed description of the present invention when taken in conjunction with the accompanying drawings.

BRIEF DESCRIPTION OF THE DRAWINGS

FIG. 33 is a timing chart showing the operations of the pipeline type A/D converter according to the fourth embodiment;

DESCRIPTION OF THE PREFERRED EMBODIMENTS (Embodiment 1)

FIG. 1 to FIG. 4 indicate the entire construction of a pipeline type A/D converter according to the first embodiment of the present invention. Especially, FIG. 1 indicates that the pipeline type A/D converter is composed of the respective parts given in FIG. 2, FIG. 3, FIG. 4. In those drawings, A/D1, A/D2, A/D3, A/D4 denote A/D converter blocks in the first, second, third and fourth stages constituting this pipeline type A/D converter, respectively. In this case, the respective A/D converter blocks (A/D1~A/D4) are blocks which perform the analog to digital (A/D) conversion by comparison of the differential input signal and the differential reference voltage respectively, and output the results of A/D conversion (28, 29), (30, 31), (35, 36), (45, 46) in 4 bits, 3 bits, 3 bits, 3 bits, respectively.

Especially, in the A/D converter block A/D1 in the first stage, its differential input signal corresponds to a difference signal between an analog input signal Vin and an intermediate reference voltage VRM, and its differential reference voltage corresponds to a differential voltage between 2 tap voltages in the ladder-type resistor having a top value VRT and a bottom value VRB of the reference voltage input from outside as voltage value at one end of the ladder-type resistor, respectively. And, the intermediate reference voltage VRM is given by the following relation. That is, VRM=(VRT+VRB)/2. The values VRT and VRB as well as the respective tap voltages will also be designated hereinafter simply as reference voltages or reference tap voltages.

As described above, because the analog input signal Vin is a single-end signal in this first embodiment and also in the respective subsequent embodiments, the intermediate reference voltage VRM is input in the A/D converter block A/D1 in the first stage as an analog signal corresponding to the analog input signal Vin, to realize a differential input type A/D converter.

The logic unit 27L adds the digital outputs (28, 29), (30, 31), (35, 36), (45, 46) of the A/D converter block in the respective stages to further perform error correction and timing adjustment and also outputs a 10-bit digital output OUT.

Figure 5:
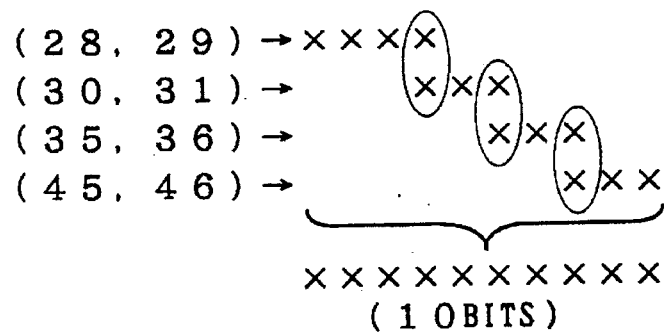
FIG. 5 is a drawing showing generation of 10-bit digital output signals.

Here, as shown in FIG. 5, the value of the least significant digit of the 4-bit digital outputs (28, 29) can be obtained in duplicate by the A/D converter block A/D2 in the next stage. For this reason, the value of the least significant bit of the digital outputs (28, 29) is corrected, even if it contains some error, by the value of the most significant bit of the 3-bit digital outputs (30, 31) in the next stage. The same is true about the relation between digital outputs (30, 31) and digital outputs (35, 36), and the relation between digital outputs (35, 36) and digital outputs (45, 46). Here, the logic unit 27L generates the 10-bit digital output OUT by performing such digital additions.

In FIG. 1 to FIG. 4, a reference numeral 1 denotes an analog input signal path, 2 denotes an intermediate reference voltage path, 3 and 4 denote D/A output paths, and 5 and 6 denote reference voltage paths for transmitting the tap voltages drawn out respectively from specific two nodes of the ladder-type resistor. The reference numerals 1 and 2 are generally tern:ted as input signal paths.

Moreover, circuits SH1/SUBT1, SH2/SUBT2, SH3/SUBT3 are sample and hold (S/H) circuits for transmitting subtraction signals from the first stage to the second stage, from the second stage to the third stage, from the third stage to the fourth stage respectively, and also function as subtracting circuits (corresponding to S/H & subtracting circuits for input signals). The S/H & subtracting circuit SH1/SUBT1 has a first S/H & subtracting unit 7 and a second S/H & subtracting unit 8. Of those units, the first S/H & subtracting unit 7 is a unit which samples & holds the analog input signal Vin at the same timing with the A/D converter block A/D1 and generates the result of subtraction between the analog input signal Vin and the D/A output value on the D/A output path 3, while the second S/H & subtracting unit 8 is a unit which samples & holds the voltage VRM corresponding to a specific tap voltage; of the ladder taps at the same timing as sampling of the analog input signal Vin and generates the result of subtraction between that holding value and the D/A output value on the D/A output path 4. Those two units 7, 8 have same circuit construction using same circuit constants, respectively. In the same way, circuits SH2/SUBT2, SH3/SUBT3 also have first S/H & subtracting units 21, 21a and second S/H & subtracting units 22, 21b, respectively.

Furthermore, circuits SHR1, SHR2, SHR3 are S/H circuits for transmitting the reference voltage from the first stage to the second stage, from the second stage to the third stage, from the third stage to the fourth stage respectively, equally have subtracting functions, and have same circuit construction consisting of same circuit constants as the circuits SH1/SUBT1 to SH3/SUBT3 described above, respectively. These circuits correspond to S/H circuits for reference voltage.

Figure 1:
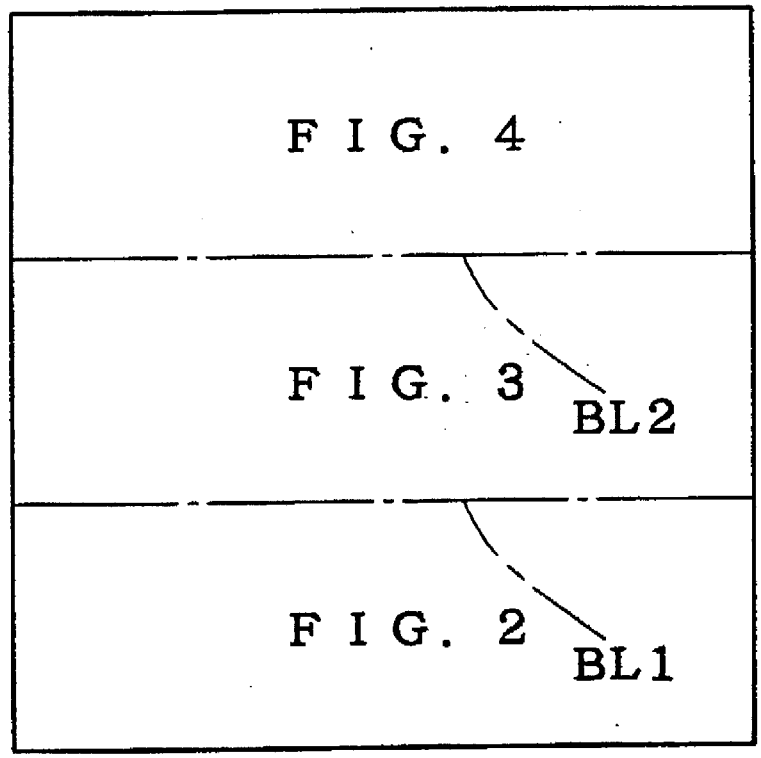
FIG. 1 is a drawing showing the construction of the pipeline type A/D converter according to the first embodiment of the present invention.
Figure 2:
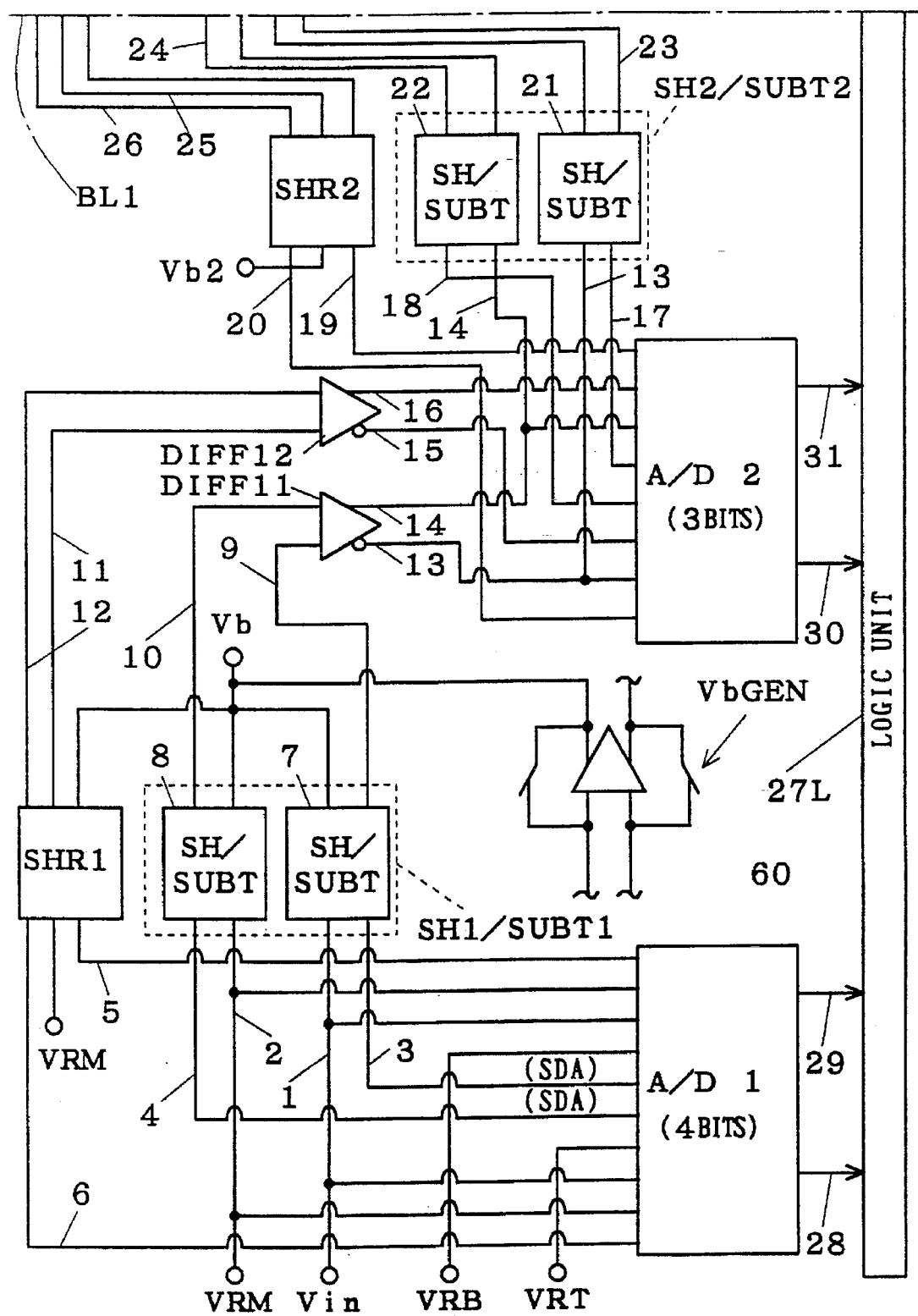
FIG. 2 is a drawing showing the construction of the pipeline type A/D converter according to the first embodiment of the present invention.
Figure 3:
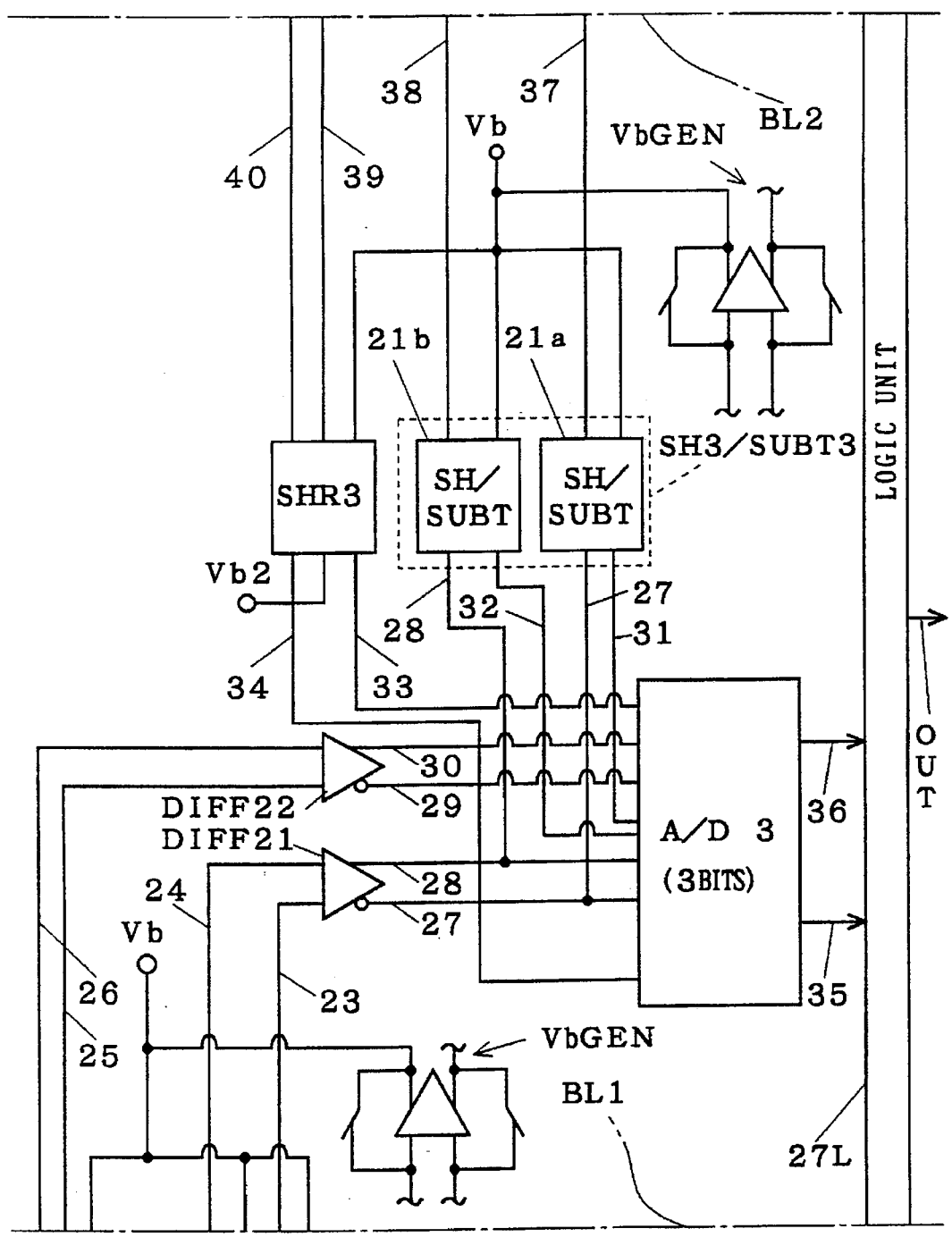
FIG. 3 is a drawing showing the construction of the pipeline type A/D converter according to the first embodiment of the present invention.
Figure 6:
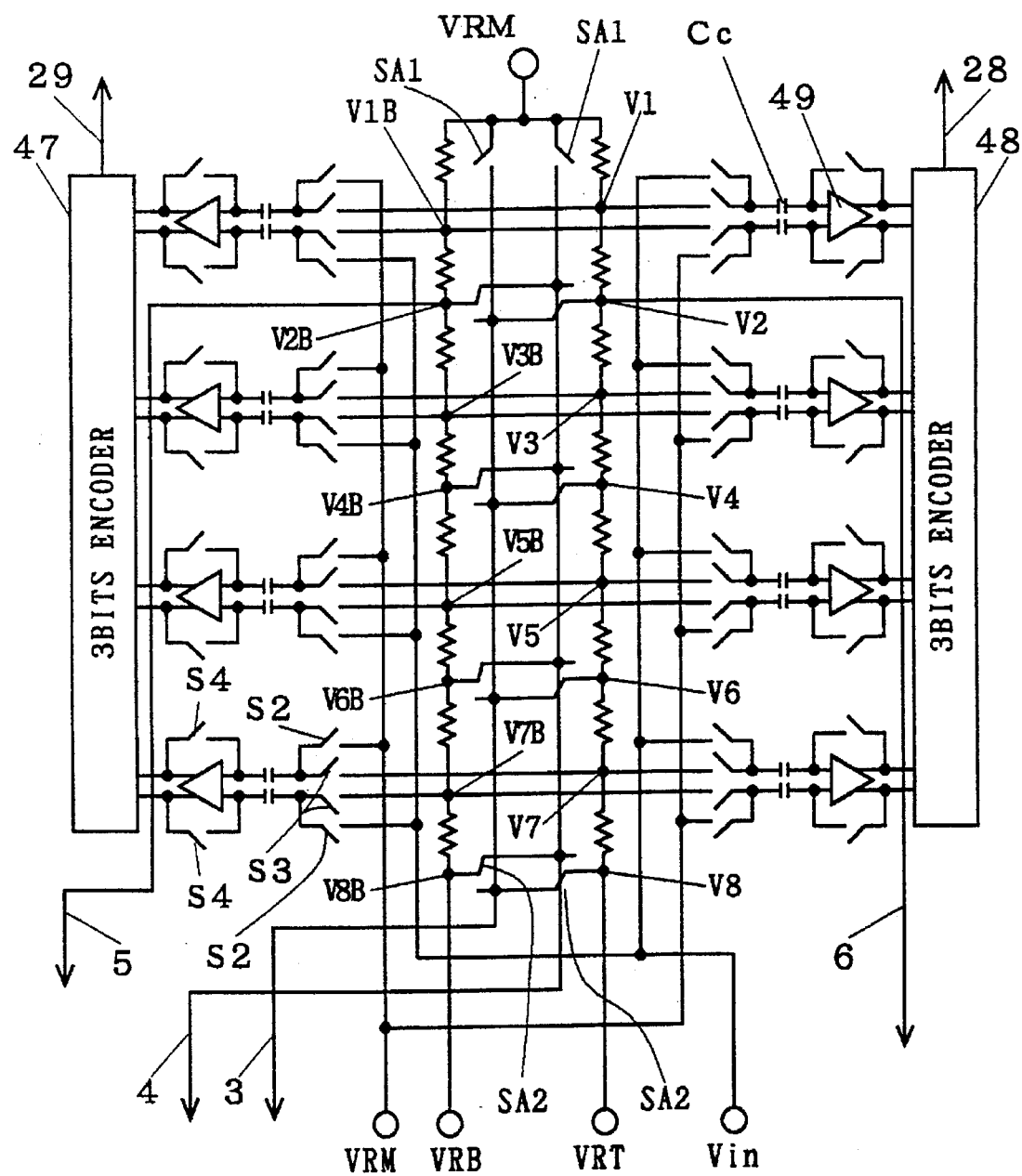
FIG. 6 is a drawing showing the construction of the A/D converter block in the first stage according to the first embodiment.

Still more, FIG. 6 is a circuit diagram showing the internal construction of the A/D converter block A/D 1 in the first stage indicated in FIG. 2. However, for the sake of simplification of illustration, the A/D convert block A/D1 which is essentially a 4-bit A/D converter block is expressed as a 3-bit A/D converter block in the figure.

As shown in this drawing, the block A/D1 has 8 voltage comparing units in correspondence respectively to 8 tap voltages (V7B, V5B, V3B, V1B, V1, V3, V5, V7) among 16 tap voltages (V8B to V1B, V8 to V1) in the ladder-type resistor having the intermediate reference voltage VRM as the intermediate value and the reference voltages VRB, VRT as the: bottom value and top value respectively. The respective voltage comparing units have 2 coupling capacitors Cc, 2 switches S2 which are turned ON/OFF by the same clock, 2 switches S3 which are turned ON/OFF by another same clock, 2 switches S4 which are turned ON/OFF by still another same clock, and one differential amplifier serving as the voltage comparator 49 (hereinafter also referred to as "comparator").

The respective clocks of the switches S2 and S4 are in phase, and the clock of the switches S3 is in opposite phase with the clock of the switches S2. Therefore, when both the switches S2 and the switches S4 are simultaneously turned ON and the switches S3 are turned OFF, the amplifier 49 is self biased, the coupling capacitor Cc on one side is charged by the analog input signal Vin, and the coupling capacitor on the other hand is charged by the intermediate reference voltage VRM.

Next, when the switches S2 and S4 are turned OFF and the switches S3 are simultaneously turned ON, the corresponding tap voltage is applied to the input terminal of the coupling capacitor on one side, while the another tap voltage corresponding to the tap voltage is applied to the input terminal of the coupling capacity on the other side.

For example, to look at the voltage comparing unit in the tap voltage V7, the differential amplifier for voltage comparator 49 in that unit calculates the difference between the subtraction value of the analog input signal Vin applied to its one input terminal and the tap voltage V7 and the subtraction value of the reference voltage VRM applied to its other input terminal and the tap voltage V7B. Namely, this amplifier 49 determines the relative size of (analog input signal Vin-VRM) and (V7-V7B).

Reference numerals 47, 48 are both 3-bit encoders.

From the respective nodes of the tap voltages V2 and V2B in the ladder-type resistor, reference voltage paths 5 and 6 are drawn out respectively. Therefore, voltages (V2-VRM) and (VRM-V2B) both correspond to a voltage value equal to 0.5 LSB.

Moreover, 2 switches SA1 and 8 switches SA2 are switches for outputting specific tap voltages obtained as a result of A/D conversion in this block A/D1 to the D/A output paths 3, 4 as the D/A outputs.

Figure 7:
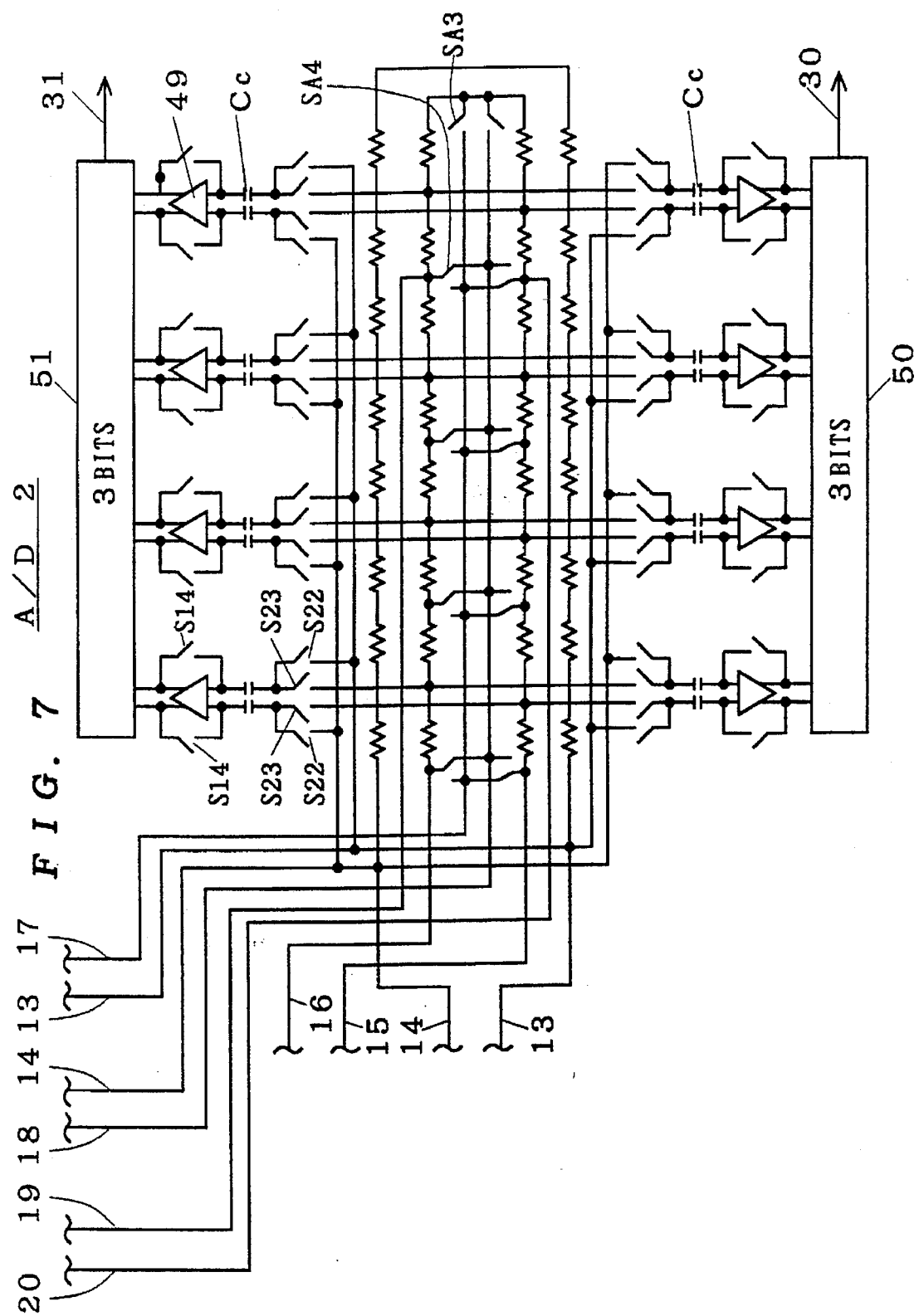
FIG. 7 is a drawing showing the construction of the A/D converter block in the second stage according to the first embodiment.

FIG. 7 is a circuit showing the internal construction of the A/D converter block A/D2 in the second stage. Except that the output signals 13, 14 of the differential amplifier DIFF11 are connected to each other through ladder-type resistor in the block A/D2, the construction and the operation of this block A/D2 are the same as those of the A/D converter block A/D1 in the first stage. Therefore, switches S22, S23, S14 correspond respectively to the switches S2, S3, S4 in FIG. 6. Reference numerals 50, 51 are both 3-bit encoders.

The A/D converter block A/D3 in the third stage has the same construction as that of the A/D converter block A/D2 in the second stage.

Figure 8:
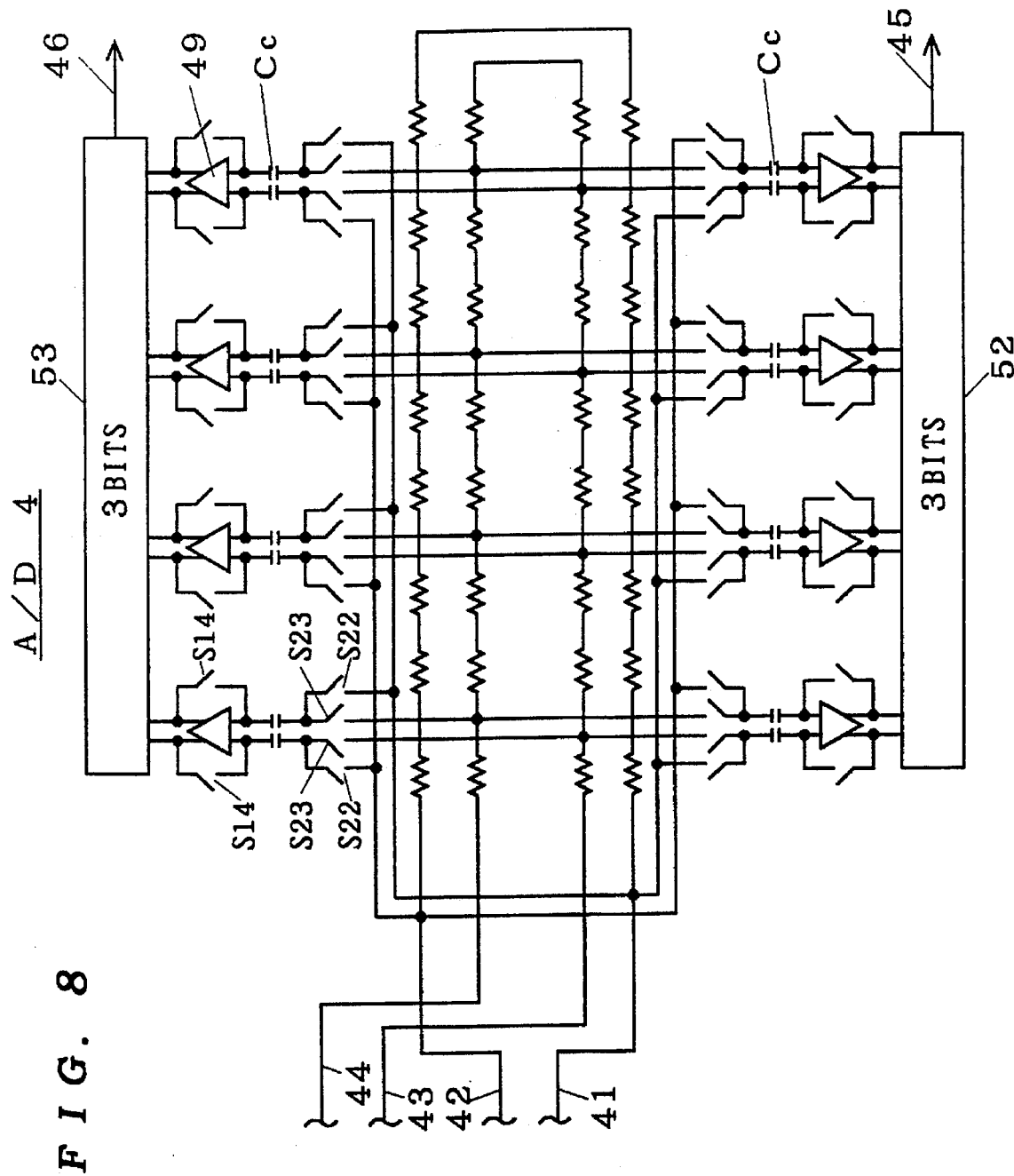
FIG. 8 is a drawing showing the construction of the A/D converter block in the final stage according to the first embodiment.

Moreover, FIG. 8 indicates the internal construction of the A/D converter block A/D4 in the fourth stage, which also performs the same operations as the A/D converter block A/D1. In FIG. 8, reference numerals 52, 53 are also 3-bit encoders.

Figure 9:
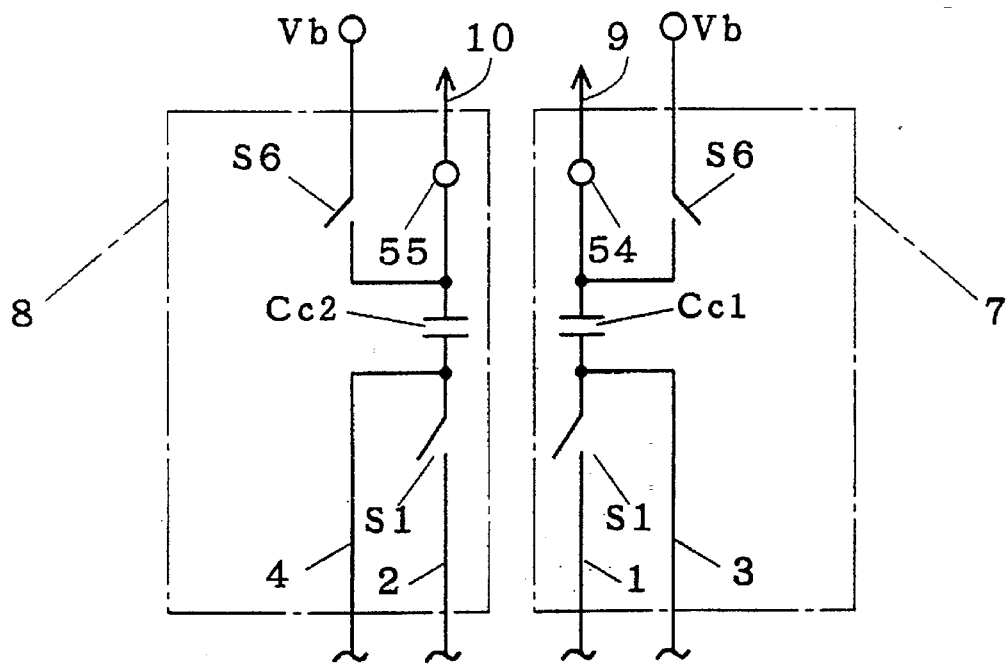
FIG. 9 is a drawing showing the construction of the S/H & subtraction circuit of the signal input path in the first stage according to the first embodiment.

FIG. 9 indicates the internal construction of the circuit SH1/SUBT1 in the first stage, and 2 coupling capacitors Cc1 and Cc2 both have the same capacity value as that of the coupling capacitor Cc(Cc1=Cc2=Cc).

The clock of the switches S1 and the clock of the switches S6 are in phase. Therefore, when both switches S1 and switches S6 are turned ON at a time, a bias voltage Vb is applied to both of output terminals of the coupling capacitors Cc1, Cc2, the analog input signal Vin is applied to an input terminal of the coupling capacitor Cc1, and the reference voltage VRM is applied to an input terminal of the coupling capacitor Cc2 on the other side.

The circuits SH2/SUBT2 in the second stage and SH3/SUBT3 in the third stage also have the same construction as that in FIG. 9.

Figure 10:
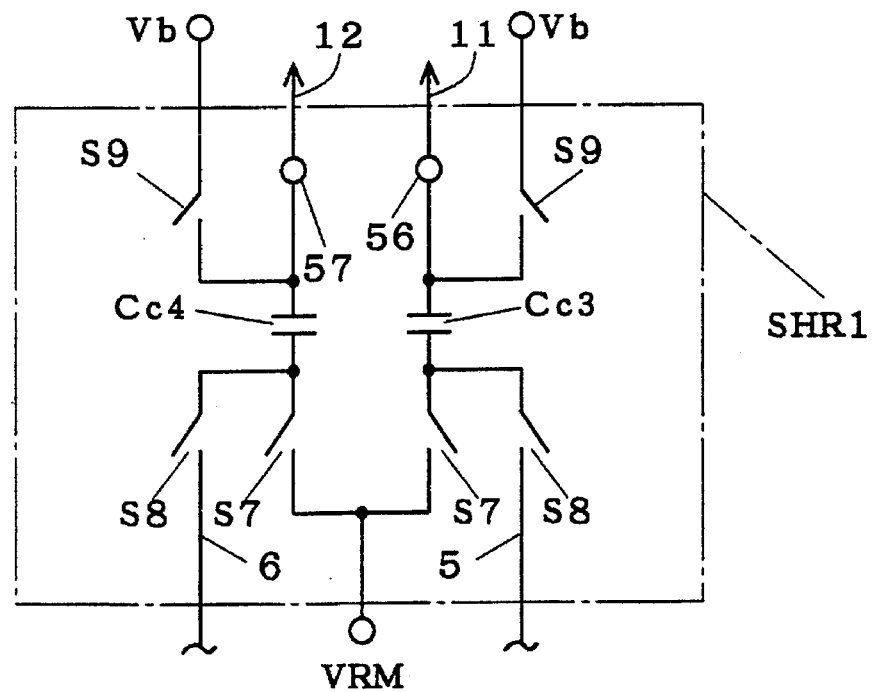
FIG. 10 is a drawing showing the construction of the S/H circuit of the reference voltage path in the first stage according to the first embodiment.

FIG. 10 is a drawing showing the internal construction of the S/H circuit SHR1 in the first stage. Coupling capacitors Cc3, Cc4 also have a capacity value equivalent to that of the coupling capacitor Cc (Cc3=Cc4=Cc). The both clocks of the switches S8, S9 are in phase,, while the clock of switches S7 is in opposite phase to the clock of switches S8.

Figure 11:
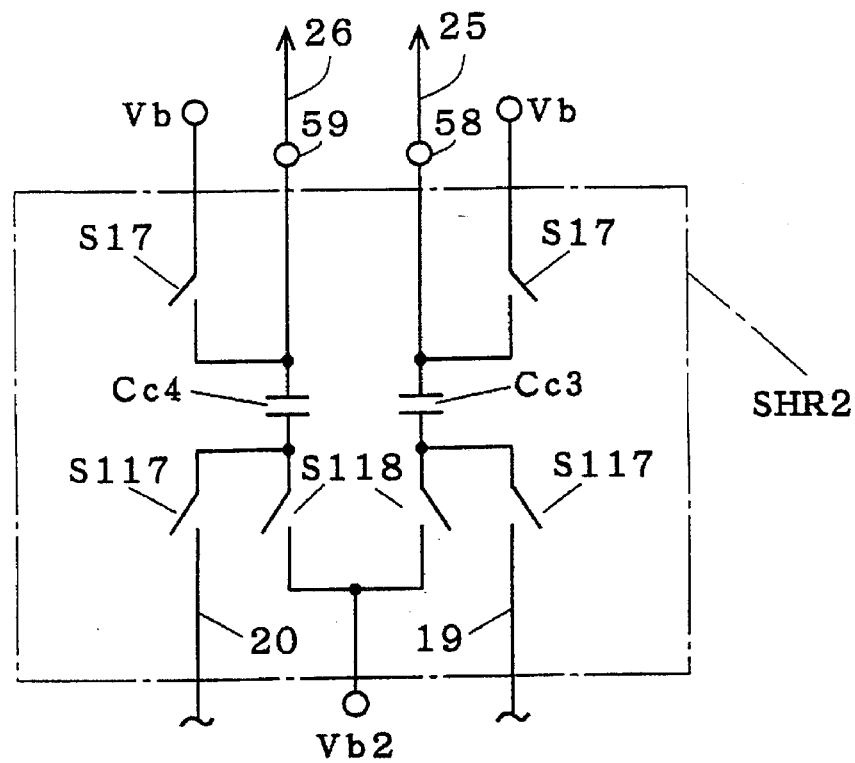
FIG. 11 is a drawing showing the construction of the S/H circuit of the reference voltage path in the second stage according to the first embodiment.

FIG. 11 is a drawing showing the internal construction of the S/H circuit SHR2 in the second stage. Switches S17, S117 correspond respectively to the switches S9, S8, and switches S118 correspond to the switches S7. The S/H circuit SHR3 in the third stage also has the same construction as that in FIG. 9.

As described above, the circuits SH1/SUBT1 to SH3/SUBT3 and SHR1 to SHR3 are composed of the coupling capacitor Cc and the switch circuits, and the input signal and the reference voltage are differentiated and supplied as complementary signals respectively. However, on the reference voltage side, the voltage of the in-phase portion is subtracted. Namely, the voltage VRM is the voltage of in-phase portion in the S/H circuit SHR1, and the voltage Vb2 is the voltage of in-phase portion in both the circuit SHR2 in the second stage and the circuit SHR3 in the third stage.

Moreover, bias voltage generating circuits VbGEN are constructed with identical circuits so that the bias voltage Vb on the output side of each coupling capacitor in the circuits SH1/SUBT1, SHR1, etc. may agree with the auto-zero level of the differential amplifier (not illustrated) in the differential amplifier for voltage comparator 49 used in the A/D converter blocks A/D1, A/D2, A/D3 of the respective stages.

Furthermore, the circuits DIFF11 and DIFF12 are differential amplifiers for performing the difference of the input signals (9, 10) and reference voltages (11, 12) to be input from the first stage to the second stage and amplifying the differences, respectively. The circuits DIFF21 and DIFF22 are differential amplifiers for the input signals (23, 24) and reference voltages (25, 26) to be input from the second stage to the third stage, respectively, and the circuits DIFF31 and DIFF32 are differential amplifiers for the input signals (37, 38) and reference voltages (39, 40) to be input from the third stage to the fourth stage, respectively. Here, the respective transistor sizes and arrangement directions of resistors in the respective differential amplifiers DIFF11, DIFF12, DIFF21, DIFF22, DIFF31, DIFF32 are aligned in a way to have same circuit characteristics.

The operations of the first embodiment will be described hereafter.

First, the analog input signal Vin is applied to the A/D converter block A/D1 in the first stage. At that time, because the A/D converter blocks A/D1 to A/D4 in the respective stages are of chopper type for judging the relative size by applying 2 voltages with a time lag by using capacitors and switches, the switches S2, S4 of FIG. 6 are turned ON and the switches S3 are turned OFF in a phase with clock (not illustrated) and, as a result, the respective differential amplifiers for voltage comparator 49 in the A/D converter block A/D1 sample the analog input signal Vin. At the same time, the analog input signal Vin is input in the circuit SH1/SUBT1 through the analog input path 1.

Namely, the bias voltage Vb is applied to the output side terminal of the coupling capacitor Cc1 of the circuit SH1/SUBT1 through the switch 56 while the input side terminal of the coupling capacitor Cc1 is charged with the analog input signal Vin.

Next, when the clock turns reversely, the switches S1, S6 of FIG. 9 and the switches S2, S4 of FIG. 6 are turned OFF and the switches S1, S3 are turned ON, the result of A/D conversion of the A/D converter block A/D1 is obtained and the reference tap voltage and code corresponding to the analog input signal Vin are determined. The reference tap voltage determined here is applied to the input side terminals of the coupling capacitors Cc1, Cc2 through the corresponding switches SA1 or SA2 and switches S1, respectively, and the output side terminals of the coupling capacitors Cc1, Cc2 at that time are both opened.

When the voltage at both ends of the coupling capacitors Cc1, Cc2 in the circuit SH1/SUBT1 changes this way, the potential of the output terminal 54 of the coupling capacitor Cc1 changes from the bias voltage Vb by the difference of potential obtained by subtracting the reference tap voltage on the voltage value side higher than the intermediate reference voltage VRM from the analog input voltage Vin. Moreover, the potential of the output terminal 55 of the coupling capacitor Cc2 changes from the bias voltage Vb by the difference of potential obtained by subtracting the reference tap voltage on the voltage value side lower than the voltage VRM from the intermediate reference voltage VRM. Therefore, only the portions of change of potential of the output side terminals 54, 55 of the coupling capacitors Cc1, Cc2 are input respectively to both input terminal of the differential amplifier DIFF1 in the next stage.

The operations of the S/H circuit SHR1 on the reference voltage side are also the same as on the input signal side. However, because the input signals Vin, VRM and the reference tap voltage are applied alternately to the differential amplifiers for voltage comparator 49 in the A/D converter block A/D1, the operation of this S/H circuit SHR1 also works complementarily with the operation of the circuit SH1/SUBT1 on the input signal side so that it may agree with the operating mode of the differential amplifiers for voltage comparator 49. Namely, while the switches S1, S6 are ON and the coupling capacitors Cc1, Cc2 are both under charging, the switches S8, S9 are turned OFF and only the switches S7 are turned ON and, as a result, a reference voltage, to be transmitted to the next stage, equal to 1 LSB is generated between the output terminals 56, 57 i.e. outputs 11, 12 of the S/H circuit SHR1. On the contrary, while the switches S1, S6 are OFF, the switches S8, S9 are turned ON and the coupling capacitors Cc3, Cc4 are charged.

Figure 12:
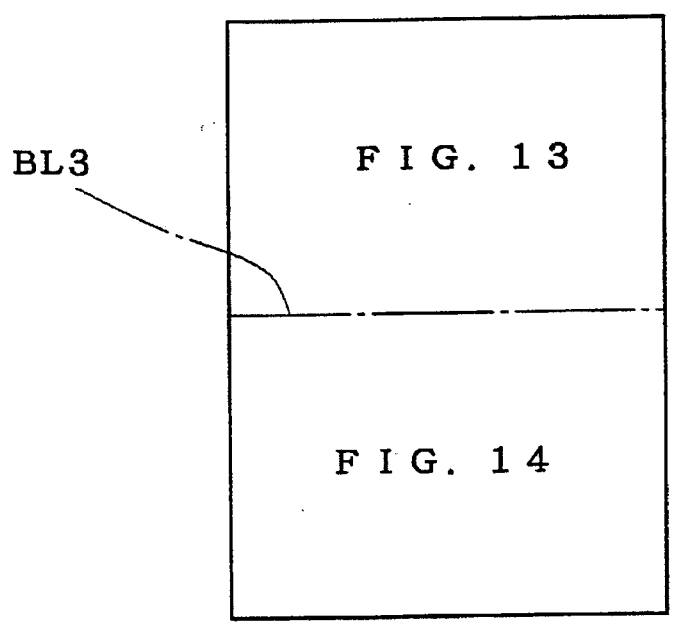
FIG. 12 is a timing chart showing the operations of the pipeline type A/D converter according to the first embodiment.
Figure 13:
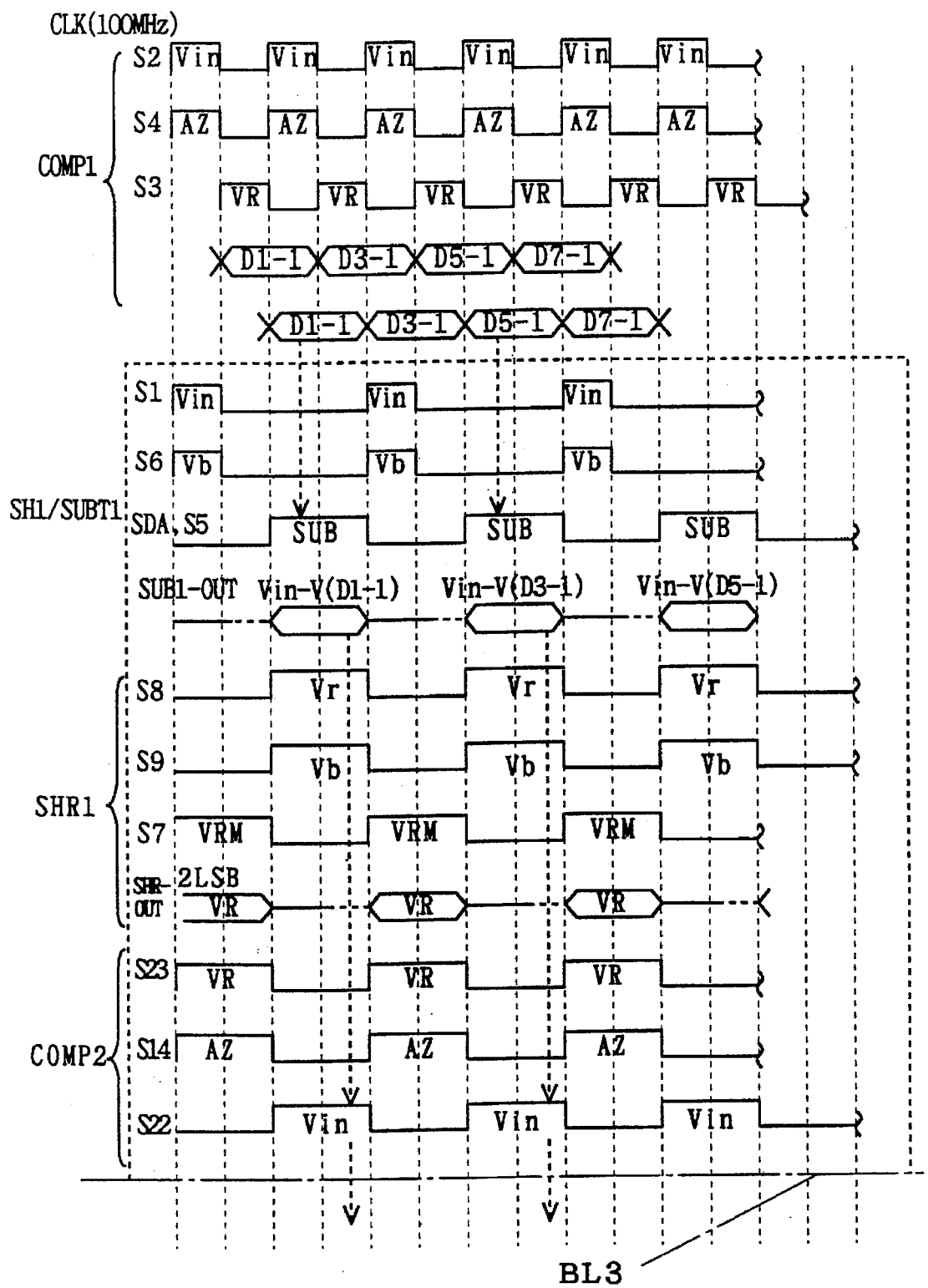
FIG. 13 is a timing chart showing the operations of the pipeline type A/D converter according to the first embodiment.
Figure 14:
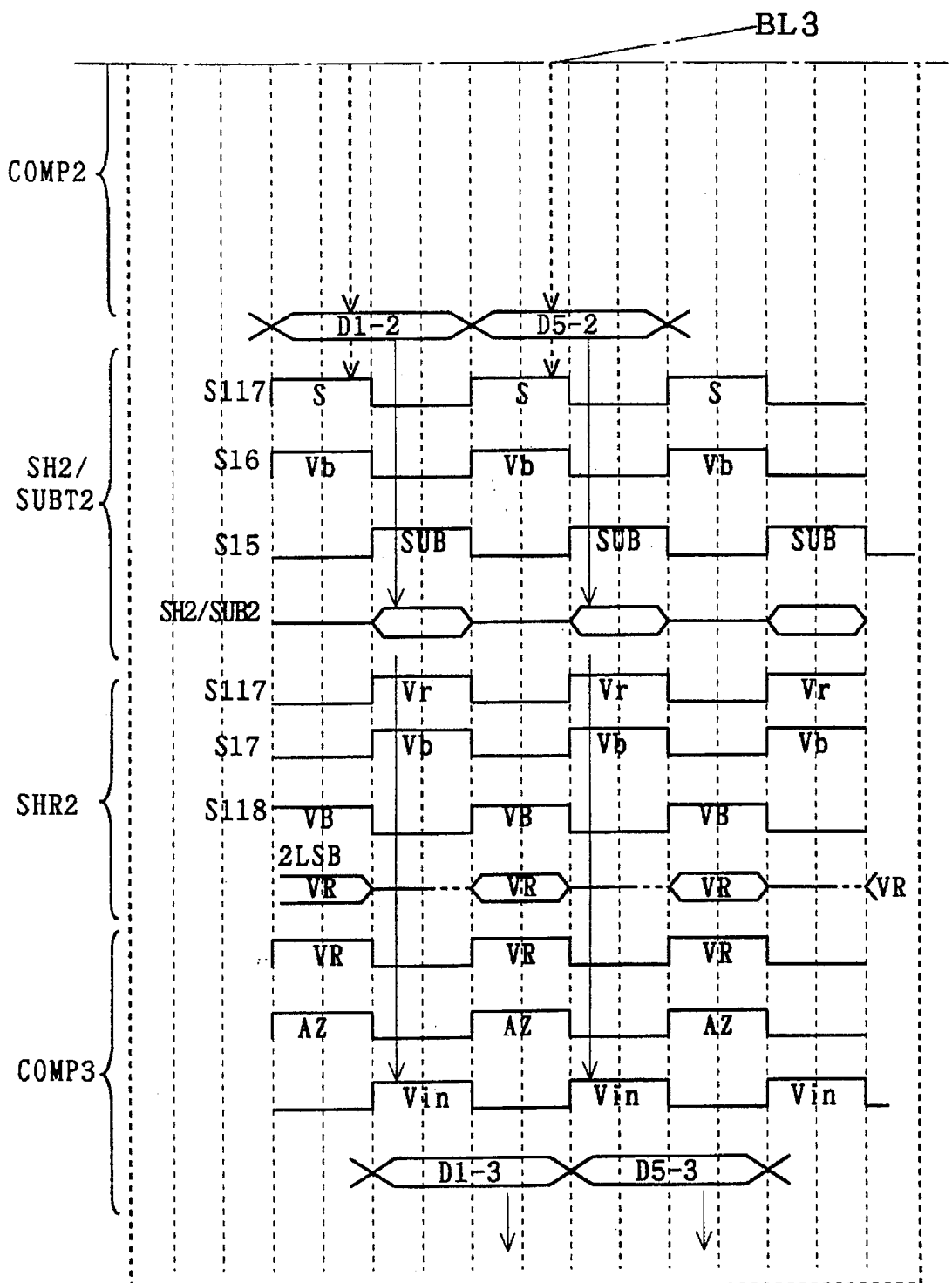
FIG. 14 is a timing chart showing the operations of the pipeline type A/D converter according to the first embodiment.
Figure 15:
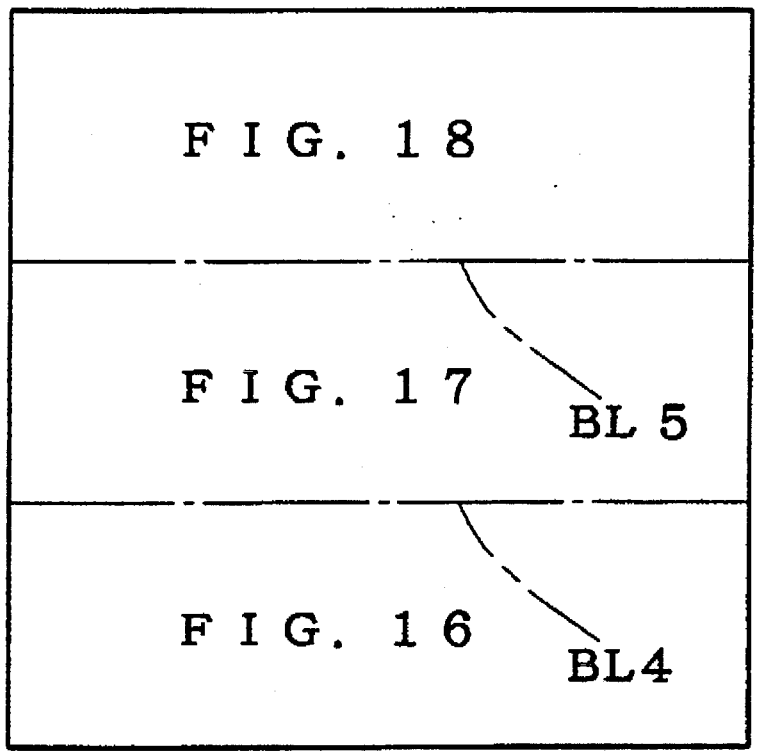
FIG. 15 is a drawing showing the construction of the pipeline type A/D converter according to the second embodiment of the present invention.
Figure 16:
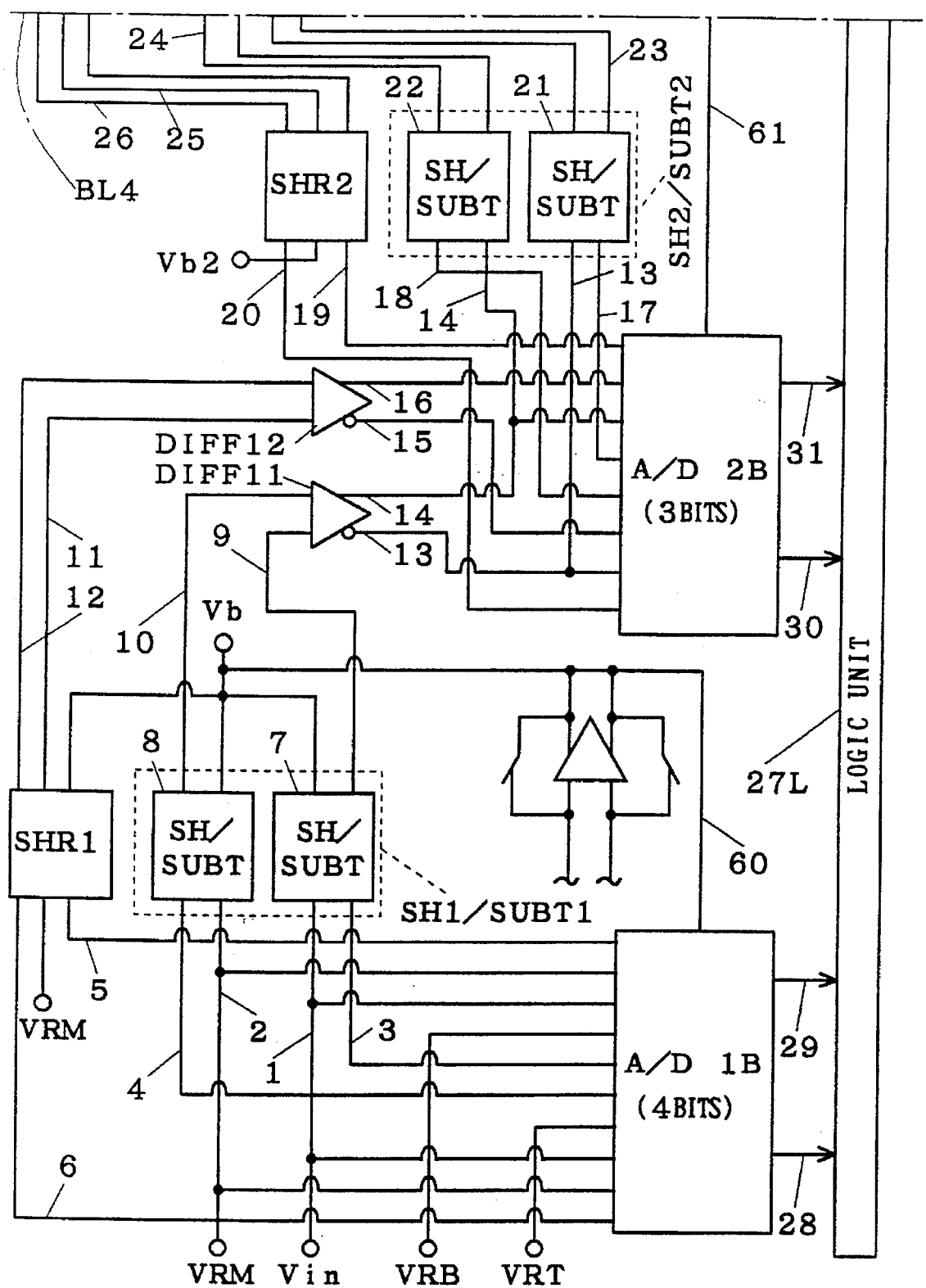
FIG. 16 is a drawing showing the construction of the pipeline type A/D converter according to the second embodiment of the present invention.
Figure 17:
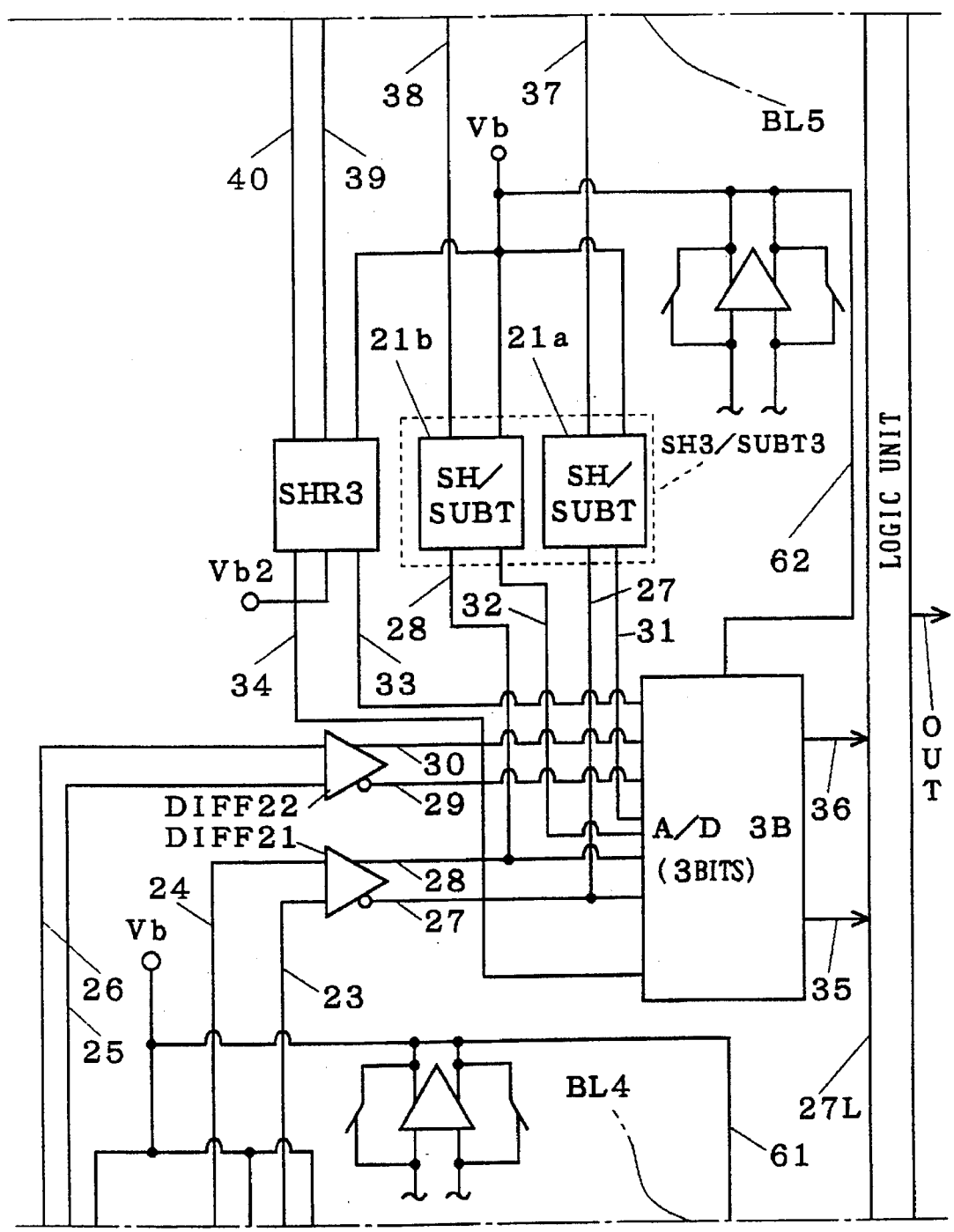
FIG. 17 is a drawing showing the construction of the pipeline type A/D converter according to the second embodiment of the present invention.
Figure 18:
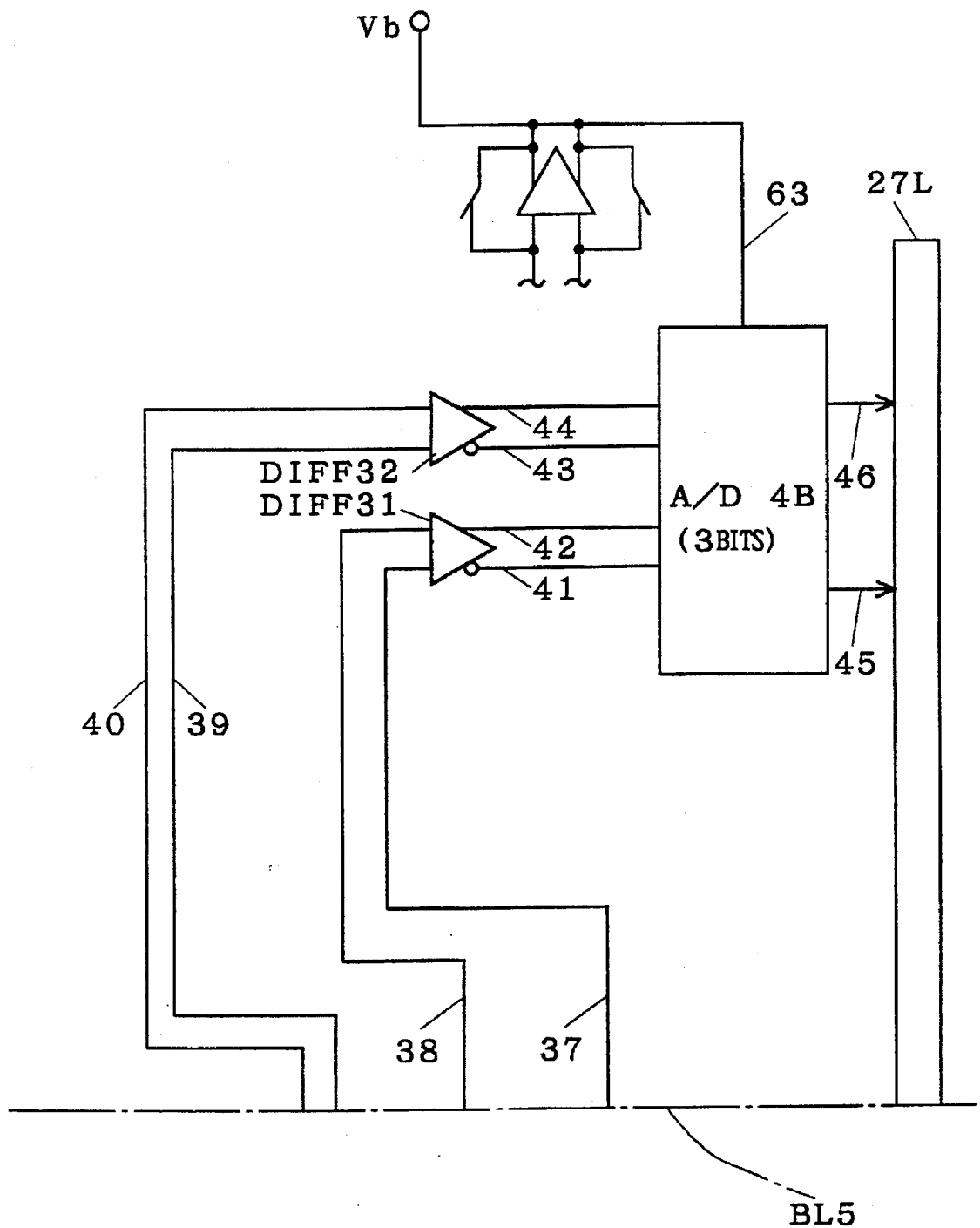
FIG. 18 is a drawing showing the construction of the pipeline type A/D converter according to the second embodiment of the present invention.

The respective parts work in the same way also in the second and the subsequent stages. FIG. 12 to FIG. 14 show examples of timing chart of respective parts in the first and the second stages. In those drawings, symbols COMP1, COMP2, COMP3 indicate the voltage comparing units inside the A/D converter blocks A/D1, A/D2, A/D3 in the first, second and third stages respectively. This point is the same also in other timing charts indicated hereafter.

As described above, the A/D converter of the first embodiment adopts a construction of drawing out tap voltages corresponding to the bottom and the top of the reference voltages in the next stage from 2 specific nodes corresponding to the difference of potential of 1 LSB among the ladder-type resistors inside the A/D converter block of the previous stage, and transmitting them to the A/D converter block of the next stage together with the result of subtraction on the input signal side. For that reason, the respective transmission paths of the input signals and reference voltage are constituted with circuits of one same construction having one same circuit constant. Moreover, also for the layout, it becomes possible to reduce deviations between elements and construct the above two paths in a way to have about the same characteristics for both paths by closely arranging them side by side in one same direction. Moreover, thanks to the adoption of differential input system, there is no fear of generation of noise resulting from switches, etc.

Therefore, in this embodiment, the range of the result of subtraction is automatically adjusted to the input range of the A/D converter block in the next stage and it becomes unnecessary to use any high-amplification gain high-speed amplifier for accurately amplifying the range of the result of subtraction to the input range of the A/D converter block in the next stage as with the prior art, thus enabling reduction of electric power consumption.

Moreover, in this first embodiment, the S/H circuit in the first stage becomes useless and, instead, the circuit SH1/SUBT1 and the circuit SHR1 functioning as S/H circuits are provided in parallel with the A/D converter block in the first stage, the circuit SH1/SUBT1 being constructed in a way to hold the portion remaining after subtracting the reference tap voltage, obtained by regenerating the result of A/D conversion of the analog input signal Vin concerned, from the analog input signal Vin. Therefore, the change in the potential of the output terminal 54 of the coupling capacitor Cc1 (=Cc) in the circuit SH1/SUBT1 becomes equal to the deviation of potential corresponding to the result of subtraction from the bias voltage Vb. This change of potential is of an amount no larger than 1 LSB of the A/D converter block A/D1. Therefore no input range as large as 1 V is required on the differential amplifier DIFF11 side receiving the output of this coupling capacitor Cc1 but only good accuracy in the small range of 63 mV will be enough for example. Namely, because the A/D converter block A/D1 in the first stage is given in 4 bits here, A/D conversion in 16 scales can be made to the analog input signal Vin of an input range of 1V and the input range of the differential amplifier DIFF11 becomes 1V/16=63 mV.

Usually, in the differential construction, the output current linearly changes with good accuracy when the difference of input potential is small, but the linearity remarkably deteriorates when the difference of input potential gets larger. And the differential amplifiers DIFF11, DIFF12 need exhibit linearity. And yet, in this embodiment it is only the relative size that must be detected with this comparator 49 as far as the differential amplifiers in the comparator 49 of the A/D converter block A/D1 in the first stage are concerned and therefore, their linearity is not particularly questioned. Therefore, by taking this construction it becomes possible to sufficiently reduce the electric power consumption because there is no need of using any feedback type high-amplification gain amplifier for the portion functioning as the S/H circuit used in the first stage.

While in the above first embodiment the intermediate reference voltage VRM is also input in addition to the analog input signal Vin to realize a differential type A/D converter, it is also all right to, realize the A/D converter as a single-end type A/D converter by inputting the analog input signal Vin only.

While, as one of the characteristics of this first embodiment, the upper & lower limit values of the reference voltage are transmitted to the next stage by providing the reference voltage paths, a construction similar to this construction is disclosed in FIG. 7, FIG. 8 of Japanese Patent Laying Open Gazette No. 5-252034. However, in the above reference, there is a problem of unmatching of loads because of the single-end construction adopted. On the other hand, because the above construction is realized as differential input type in this first embodiment, it requires a smaller number of differential amplifiers compared with that of the above reference and also has the advantage of easy matching including that of loads because the loads of the differential amplifiers are resistance loads both on the input signal path side and the reference voltage path side.

(Embodiment 2)

Figure 19:
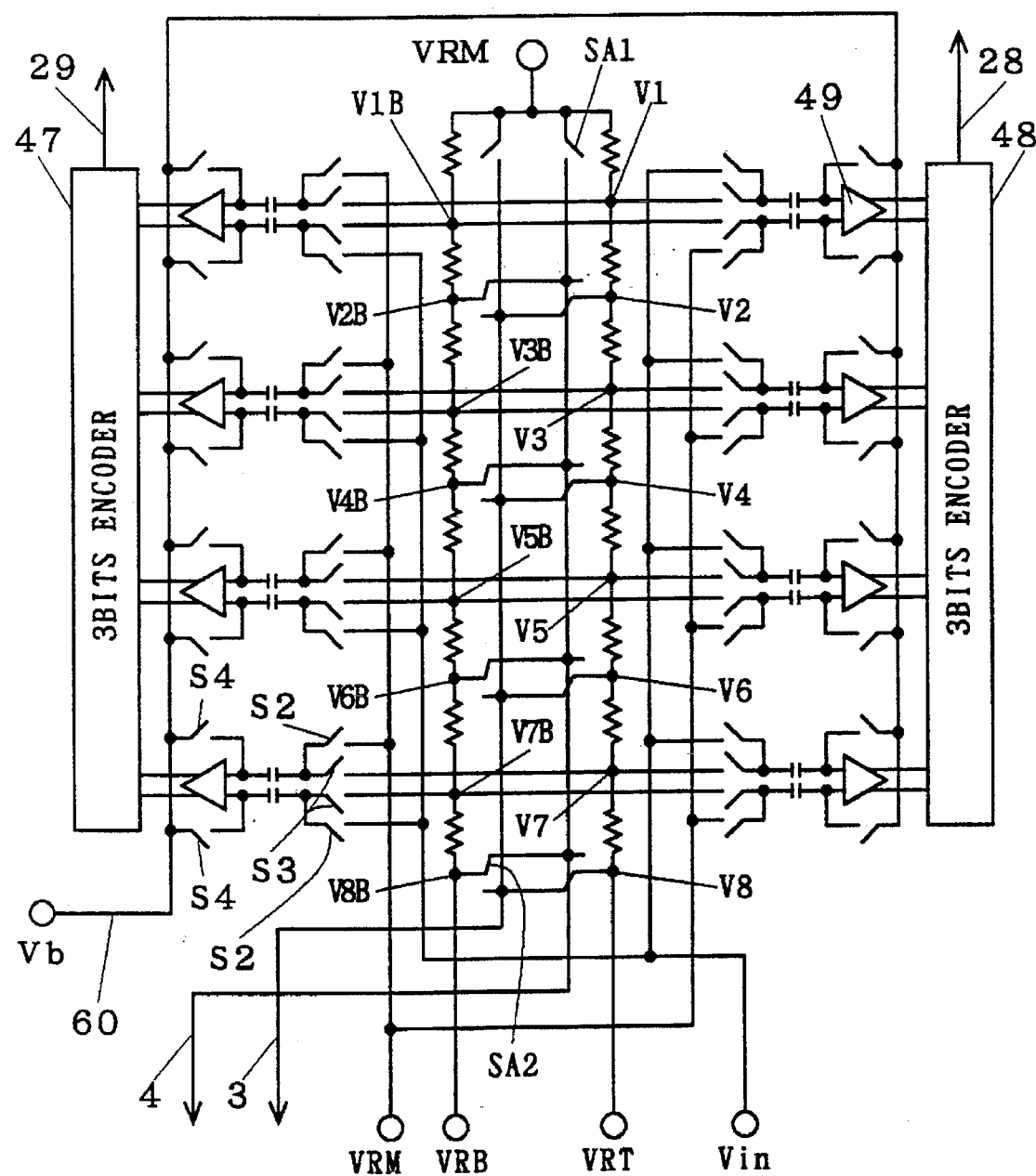
FIG. 19 is a drawing showing the construction of the A/D converter block in the first stage according to the second embodiment.
Figure 20:
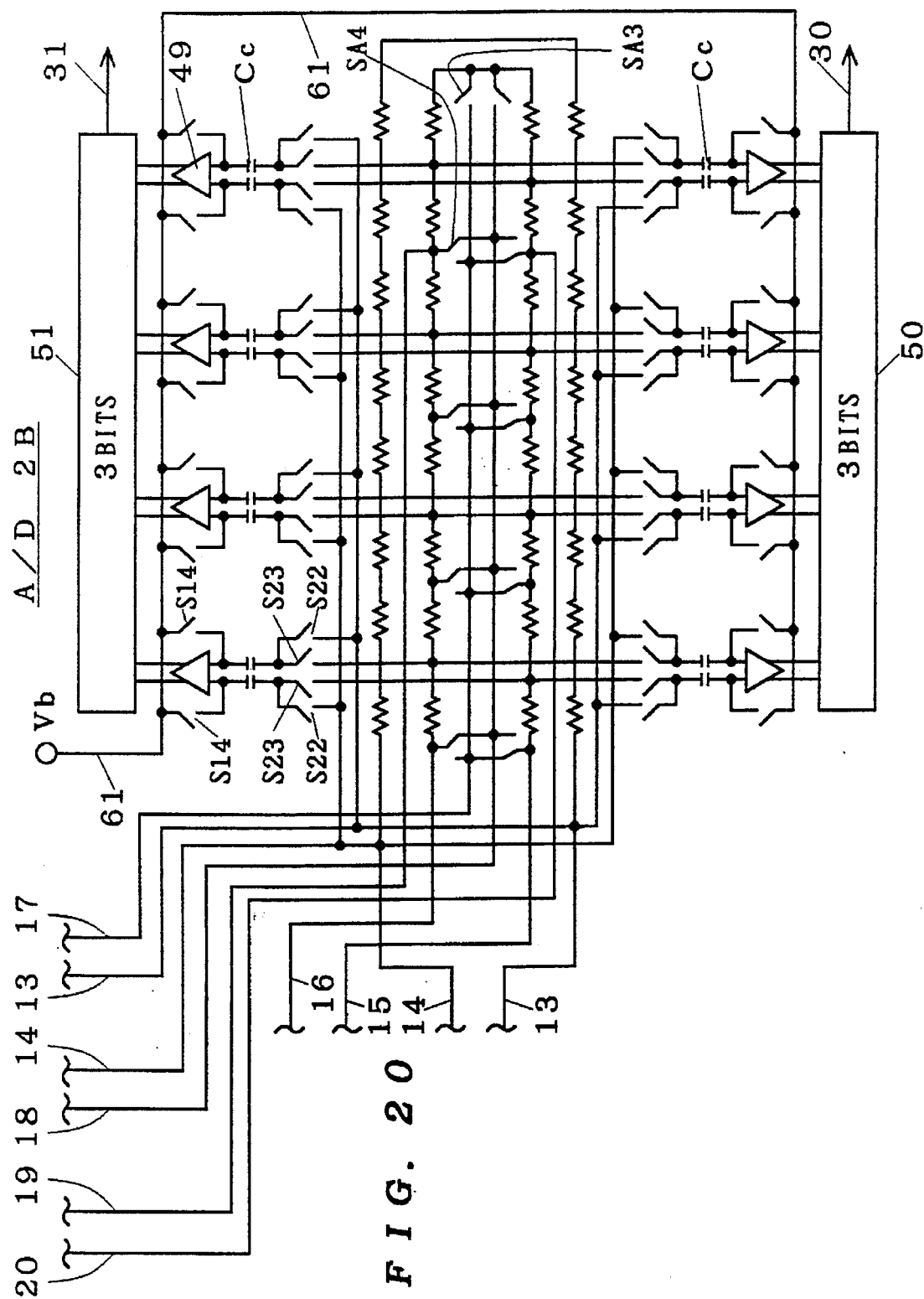
FIG. 20 is a drawing showing the construction of the A/D converter block in the second stage according to the second embodiment.
Figure 21:
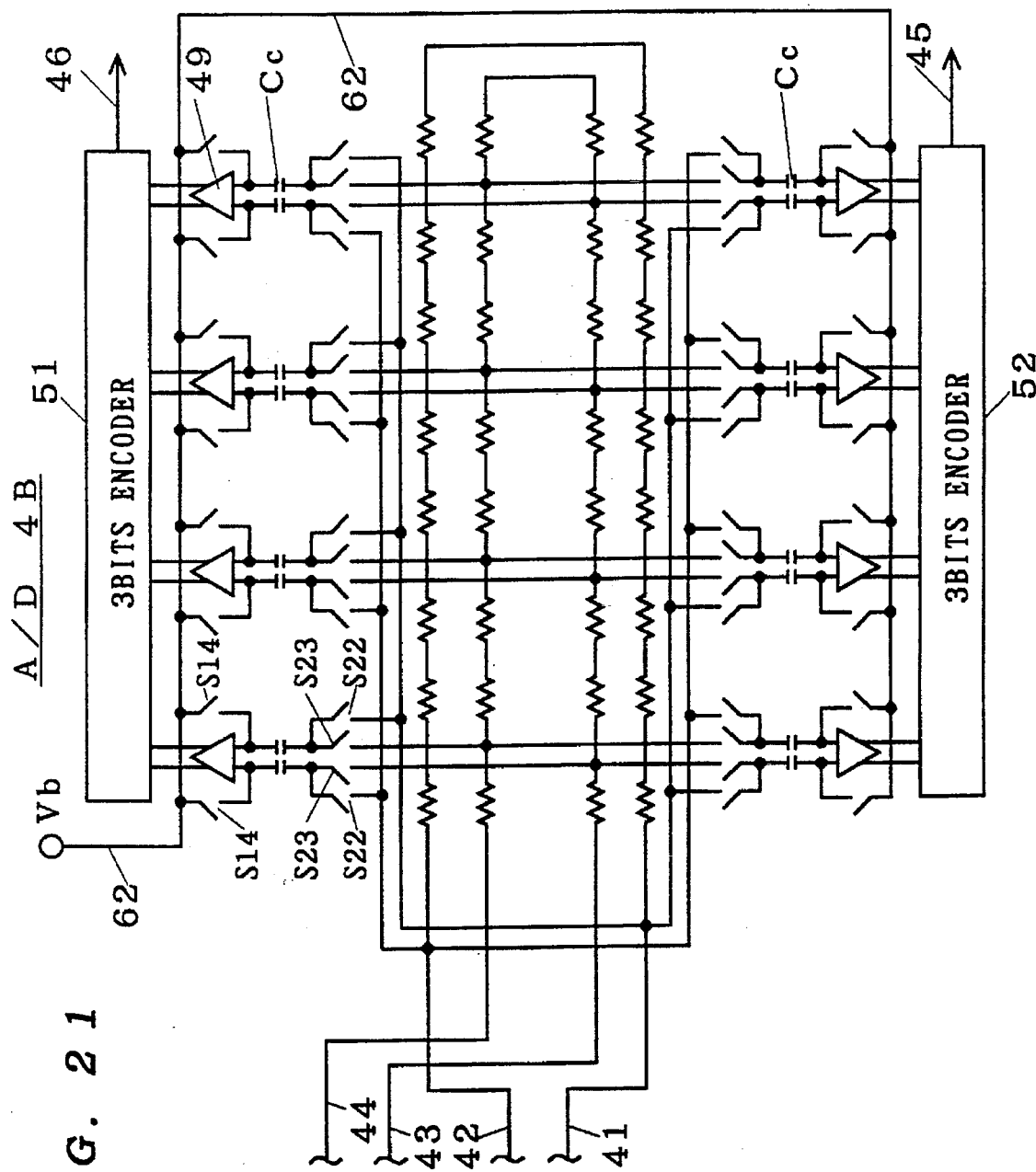
FIG. 21 is a drawing showing the construction of the A/D converter block in the final stage according to the second embodiment.

FIG. 15 to FIG. 18 indicate a pipeline type A/D converter according to the second embodiment. In those drawings, reference numerals 60 to 63 are bias voltage supply paths. Moreover, FIG. 19 to FIG. 21 indicate the internal construction of the A/D converter blocks in the first, second and fourth stages in the second embodiment respectively. Here again, the illustration of the A/D converter block A/D1B in the first stage is indicated with a 3-bit construction for the sake of simplification. In addition, the construction of the A/D converter block A/D3B in the third stage is the same as that of the A/D converter block A/D2B in the second stage.

The construction of the A/D converter of the second embodiment, though almost identical to that of the first embodiment, differs from the latter in that the bias voltage of the S/H circuit SHRi and S/H & subtracting circuit SHi/SUBTi (i =1 to 3) in the respective stages from the first to the third stages and the bias voltage on the input side of the differential amplifier (not illustrated) in the differential amplifiers for voltage comparator 49 in the corresponding A/D converter block A/Di (i=1 to 3) are supplied from one same bias circuit.

Figure 4:
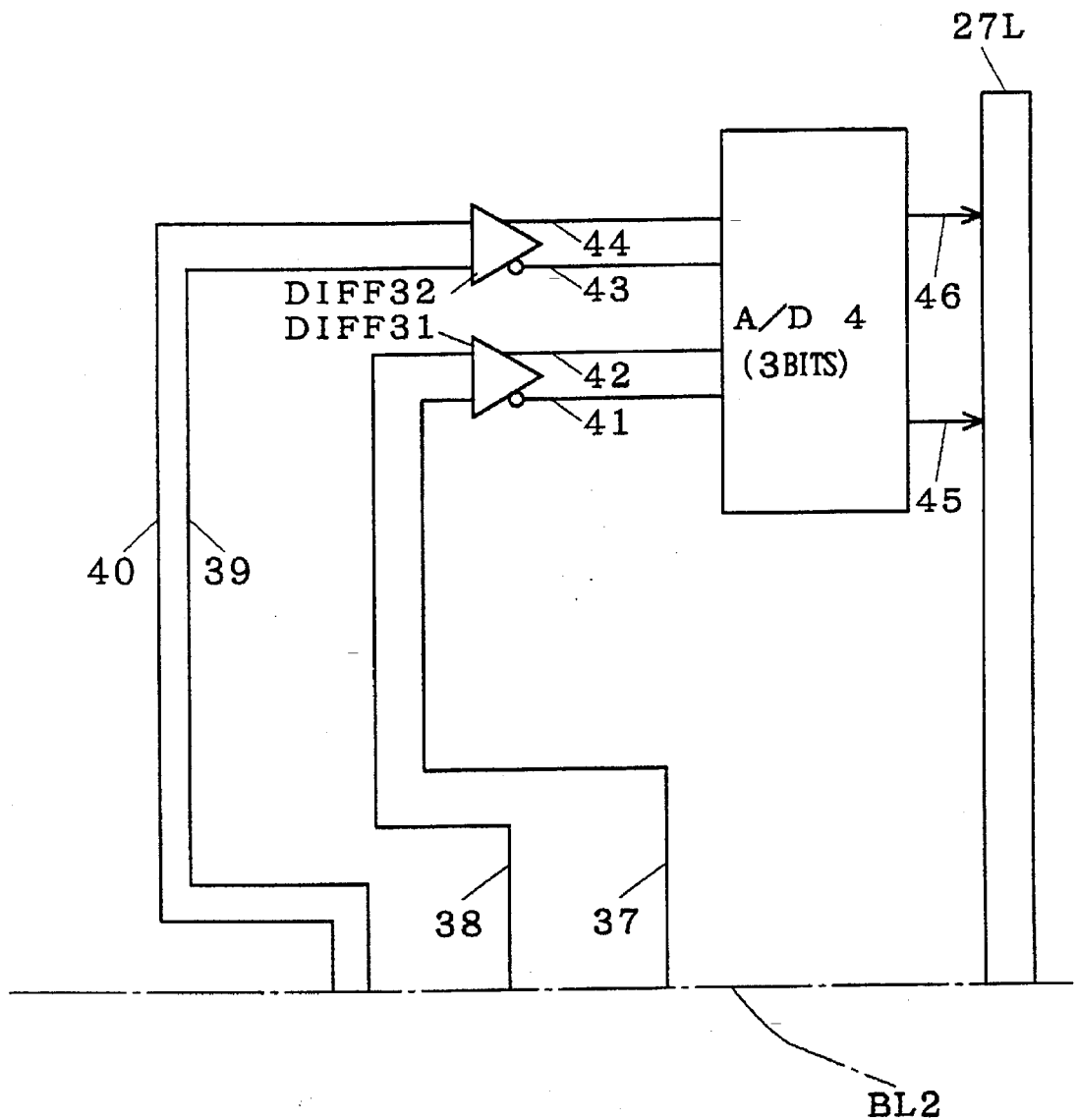
FIG. 4 is a drawing showing the construction of the pipeline type A/D converter according to the first embodiment of the present invention.

While the example given here is that of a case where a common bias voltage Vb is used for each stage, it is also all right to have the bias voltage shared by all stages through a single bias circuit. Moreover, while in the final stage (A/D converter block A/D4B of fourth stage here), the circuit diagram is given on the supposition of application of the circuit and the layout of the previous stage (see FIG. 18), the circuit may also be constructed with self bias as shown in FIG. 4, FIG. 8 of the first embodiment, or it is also possible not to have the respective bias for the respective input terminals of the differential amplifier of the differential amplifiers for voltage comparator 49 of FIG. 21 shared with the S/H circuit SHR3, etc.

The adoption of common bias voltage as described above is made for the reason given hereafter. Namely, to describe on the first stage for example, if, in the first embodiment, there is any difference between the bias voltage of the circuit SH1/SUBT1 and circuit SHR1 and the bias voltage of the differential amplifier for voltage comparator 49 in the A/D converter block A/D1, it produces a problem that the voltage of the signal input in the circuit SH1/SUBT1 and the voltage of the signal input in the differential amplifier for voltage comparator 49 become different from each other and that a value different from the normal value is selected as the reference tap voltage (D/A output) to be deducted in the circuit SH1/SUBT1t.

So, in the second embodiment, the lag of timing between the circuit SH1/SUBT1 and the differential amplifier for voltage comparator 49 is corrected by keeping the bias voltage for both of them, so that the sampling of analog input signal may be performed at high accuracy and at the same timing in the both circuits (SH1/SUBT, 49). This enables sampling of analog input signal Vin of exactly the same value in both of the above-mentioned circuits.

(Embodiment 3)

In the first embodiment, increase of consumed electric power can be suppressed as described above. However, in the first embodiment, the A/D converter of differential construction as shown in FIG. 6 is used as construction of the A/D converter block A/D1 of the first stage, so that there is a problem that it cannot perform the A/D conversion in the first stage with sufficient accuracy. Moreover, the first embodiment also has a serious problem that it cannot transmit the results of subtraction accurately, because the circuit SH1/SUBT1 receives the D/A output of the A/D conversion results in the first stage to transmit the subtraction results to the next stage.

Figure 22:
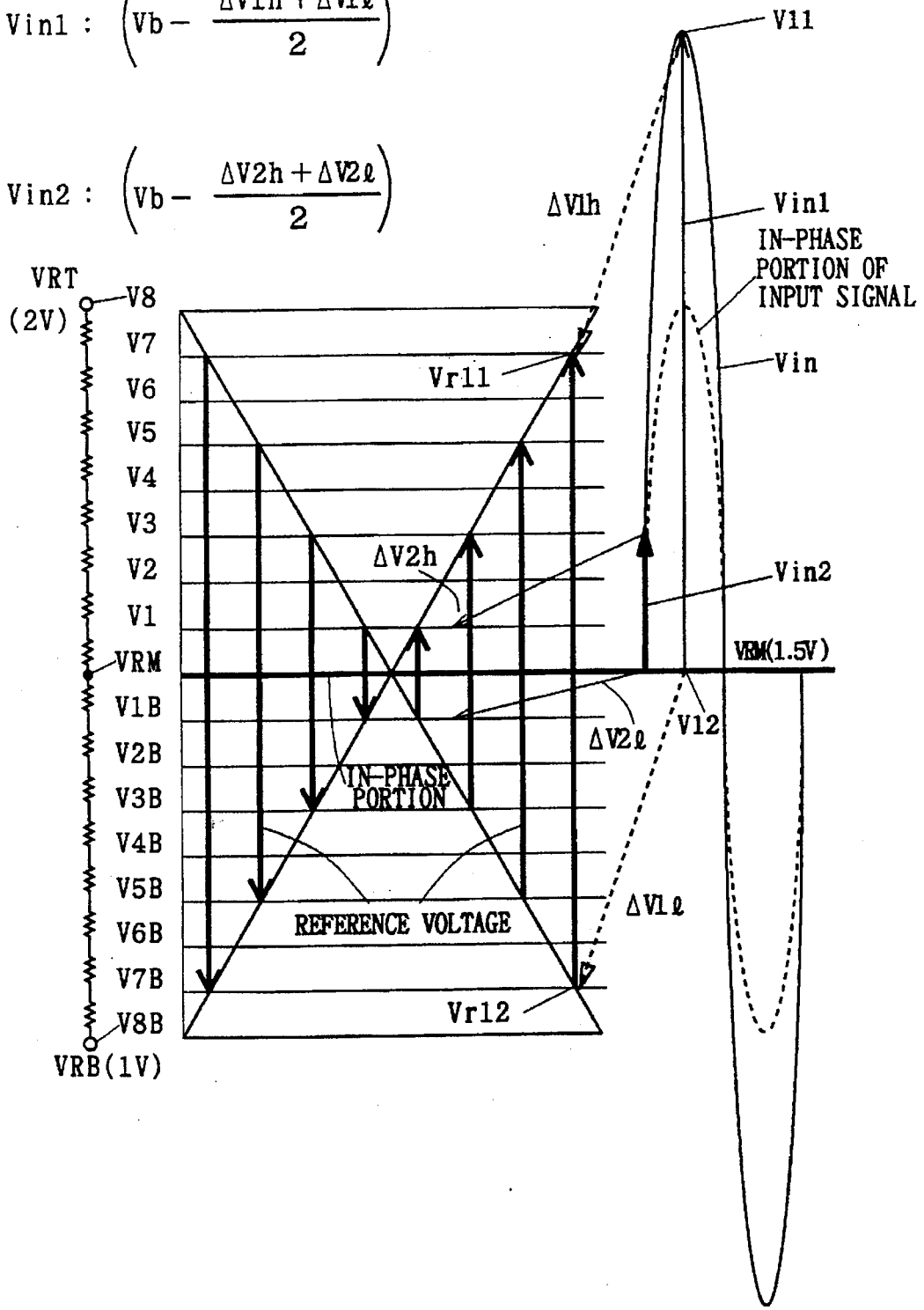
FIG. 22 is a drawing pointing out problems of the prior art and the first embodiment.

Here, an example of the form of taking out of the reference voltages in the A/D converter block A/D1 of the first stage is shown in FIG. 22 for the purpose of actualizing such problems. In this drawing, the respective reference voltages are constructed as difference of potential between the reference tap voltages (V8B to V1B, VRM, V1 to V8) presenting voltages over and below centering around 1.5 V (=VRM) which is the in-phase component.

As described earlier, the A/D conversion in the respective A/D converter blocks adopts the form of comparing input signals of differential type with reference voltages of differential type. However, hardly any input signals are given as differential signals usually. In this case, the analog input signal Vin is applied as a single end centering around 1.5 V equivalent to the in-phase component of the reference voltage i.e. VRM. And, a DC voltage must be applied as the other input signal and, as a result, the intermediate reference voltage VRM is input from outside. On the other hand, the reference voltage can be set in a range equal to one half of the input signal range because of differential construction. For that reason, in FIG. 22, the range on the reference voltage side is shown with a ½ range against the range of input signals.

However, with this construction in which one of the two input signals is a DC voltage (=VRM), there is a problem that the in-phase component of the analog input signal Vin is different from that of the reference voltage. Therefore, the in-phase components of signals applied to the circuit SH1/SUBT1 are different, and this makes the respective potential changes on the output side of the respective coupling capacitors Cc of the circuit SH1/SUBT1 greatly change in the in-phase component applied to the subsequent differential amplifier DIFF11 though results of subtraction are obtained by taking the difference between them with the differential amplifier DIFF11.

For example, supposing a case where the analog input signal Vin is given with Vin1 (=V11–V12, V12=VRM) as shown in FIG. 22, the two coupling capacitors Cc (Cc1, Cc2) of the circuit SH1/SUBT1 are charged with the voltages V11 and V12 as input signals, respectively. At that time, output sides of the two coupling capacitors Cc (Cc1, Cc2) are both fixed to the bias voltage Vb. After that, for example, when the reference voltage (Vr11–Vr12) is selected in a way to be subtracted in response to the A/D conversion results in the A/D converter block A/D1, the potential difference on the input side of the coupling capacitor Cc1 of the two coupling capacitors Cc of the circuit SH1/SUBT1 changes from the voltage V11 to the voltage Vr1 1, and that of the other coupling capacitor Cc2 changes from the voltage V12 to the voltage Vr12. Those portions of change are $\Delta V1h$, $\Delta V11$ respectively as shown in FIG. 22 and, therefore, the subtraction result obtained by the differential amplifier DIFF11 becomes ($\Delta V1h-\Delta V11$).

However, the in-phase component of the potentials on the output sides of the respective coupling capacitors Cc drops by the average value of the voltage differences $\Delta V1h$ and $\Delta V11$ and is given with $[Vb-(\Delta V1h+\Delta V11)/2]$. Moreover, when the input voltage level of the analog input signal Vin changes and, so that different reference voltages are subtracted from different input voltages as the case of the voltage Vin2 in FIG. 22 for example, the each drop of in-phase component on the output sides of the respective coupling capacitors Cc becomes equal to $[Vb-(\Delta V2h+\Delta V21)/2]$ and the fluctuations of that in-phase component are generated by different levels. Consequently, it becomes necessary to construct any differential amplifier DIFF11 receiving the outputs of the coupling capacitors Cc (Cc1, Cc2) in a way to be protected against any influences of the eventual fluctuations of the in-phase component.

However, it is very difficult to construct any differential amplifier sufficiently insensitive to fluctuations of in-phase component. For that reason, there is a problem of losing accuracy of A/D conversion in the case of the first embodiment.

The point described above also applies to the differential amplifier in the respective differential amplifiers for voltage comparator 49 of the A/D converter block A/D1 in the first stage.

Those points are solved by the third embodiment described hereafter.

Figure 23:
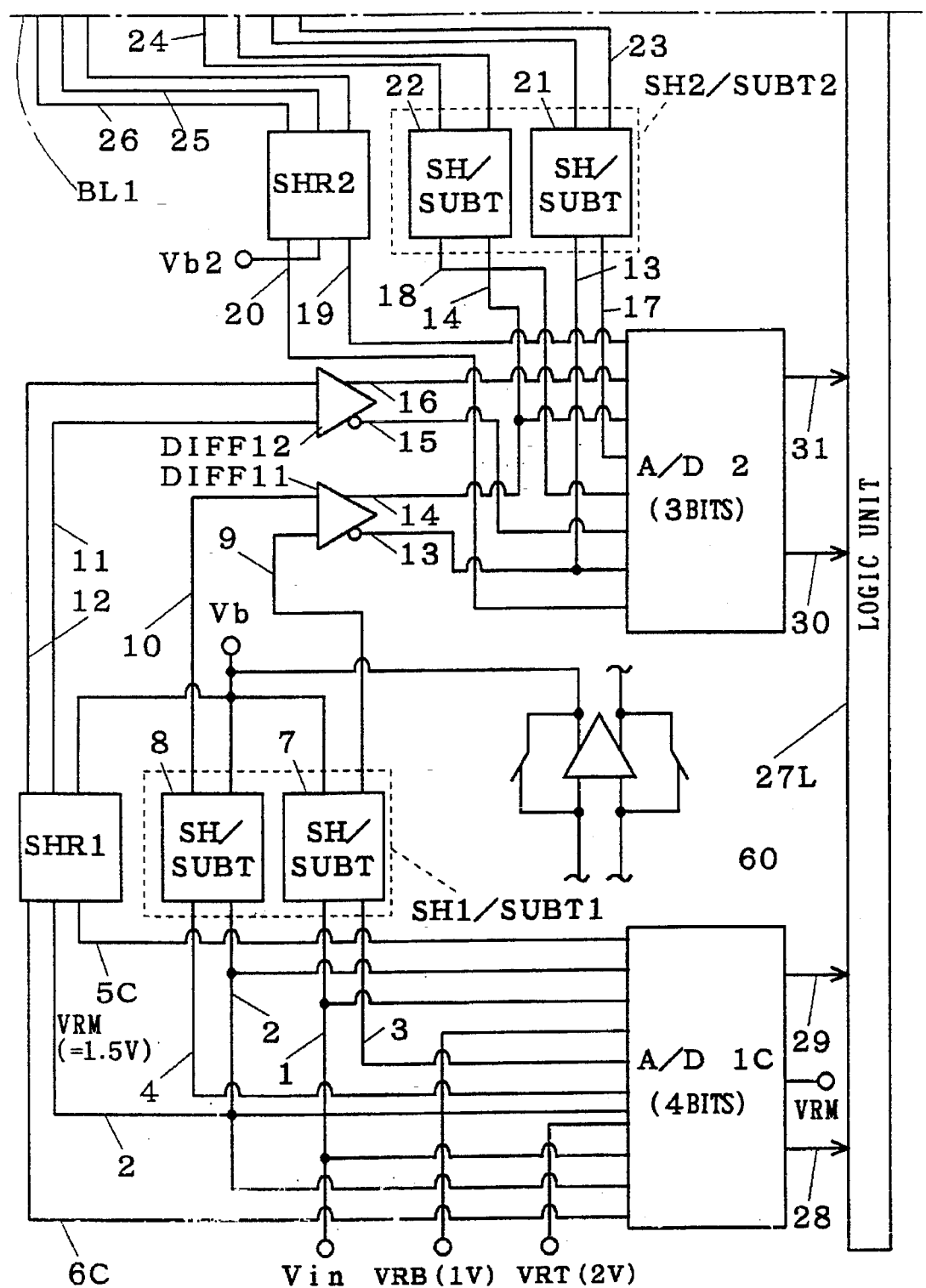
FIG. 23 is a drawing showing the construction of characteristic parts in the pipeline type A/D converter according to the third embodiment.

FIG. 23 indicates only characteristics portions of the third embodiment. FIG. 23 is a drawing showing the portions of both the first stage and the second stage of the A/D converter, while the constructions of the third stage and the fourth stage are the same as those illustrated in the first embodiment.

The third embodiment basically has the same construction as that of the first embodiment but is different in the method of application of reference voltages from the A/D converter block A/D1C in the first stage to the circuit SH/SUBT1 and the circuit SHR1.

Figure 24:
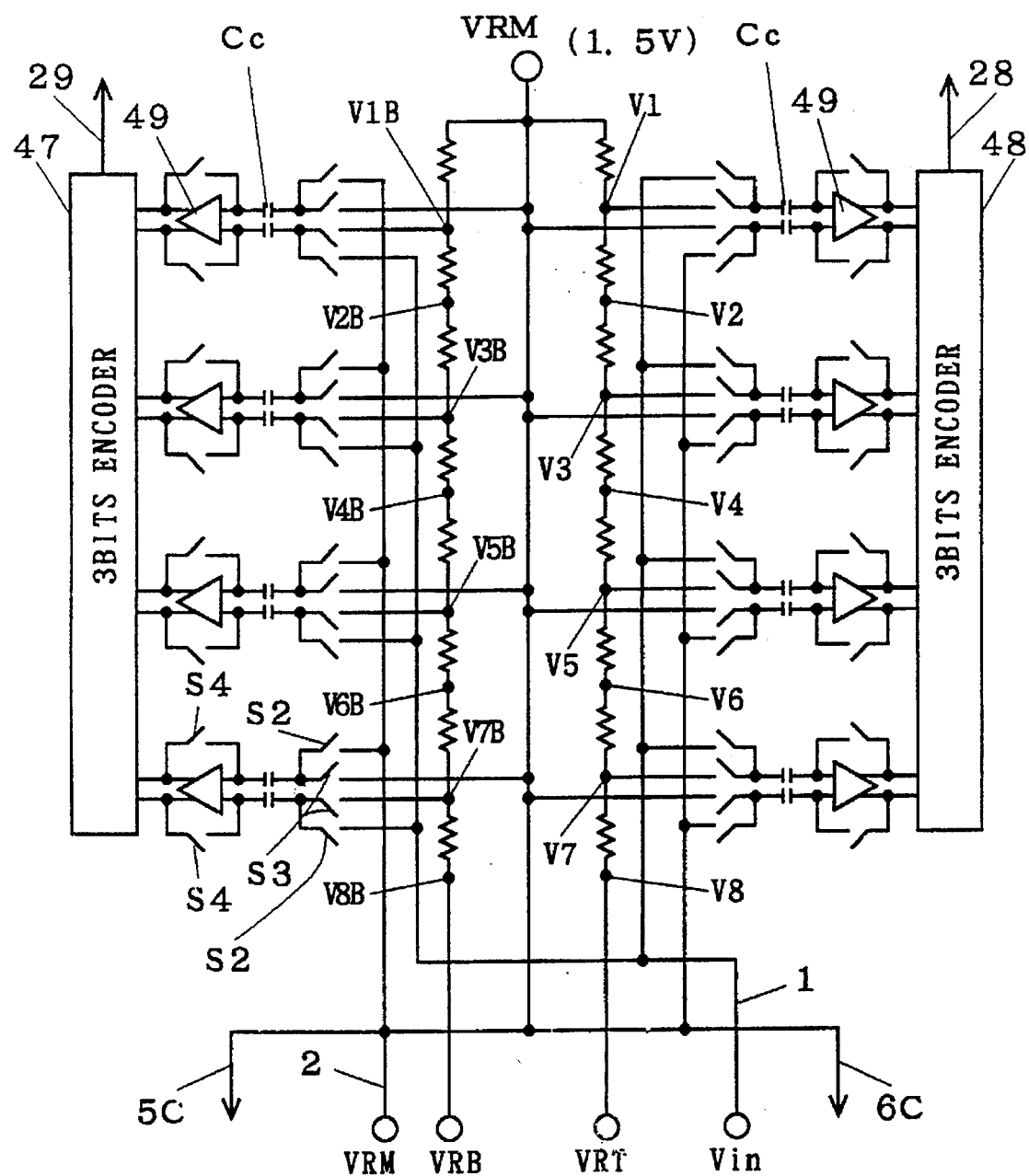
FIG. 24 is a drawing showing the construction of the A/D converter block in the first stage according to the third embodiment.
Figure 25:
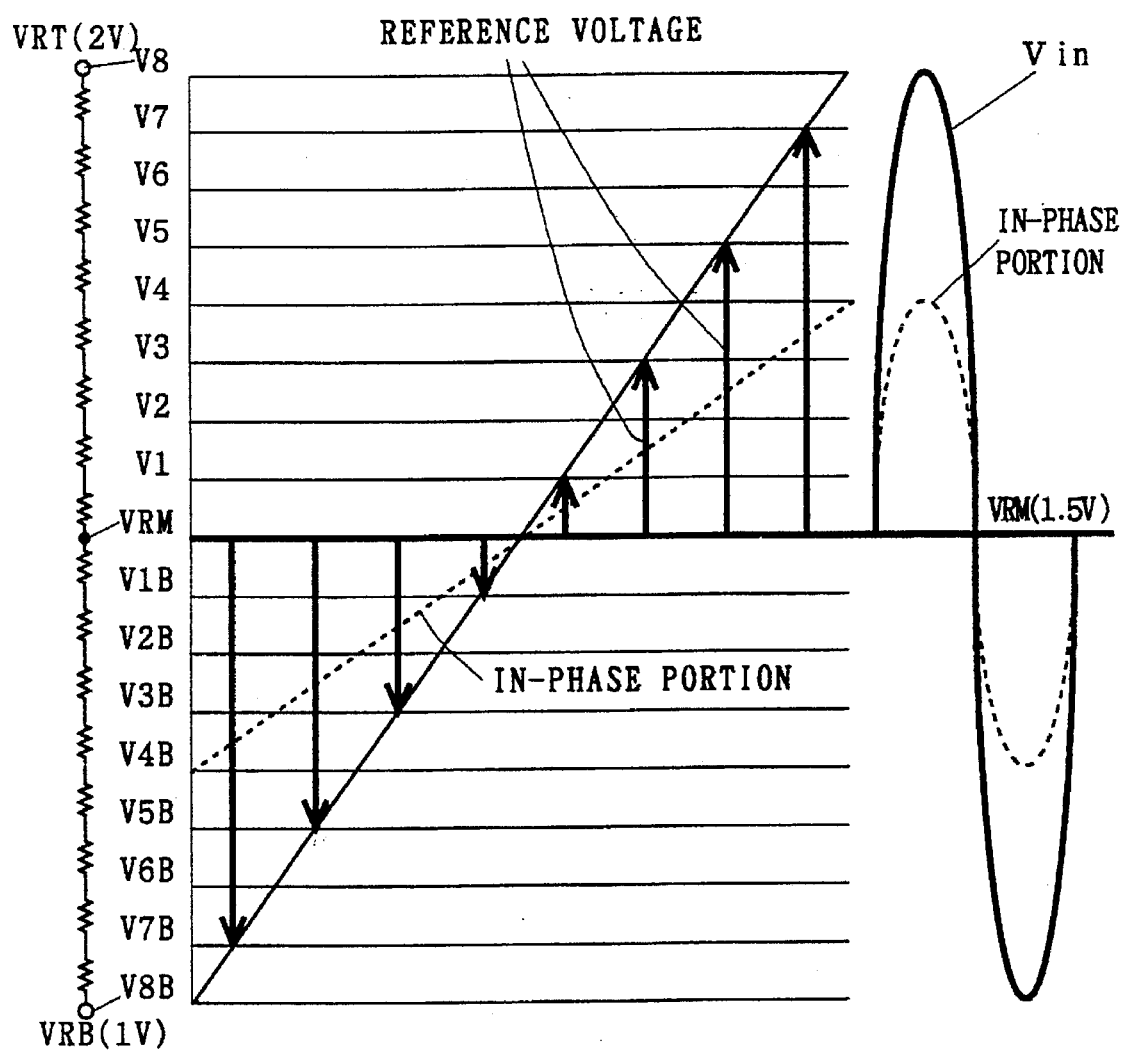
FIG. 25 is a drawing showing the relationship between reference voltage and input voltage in the first stage according to the third embodiment.
Figure 26:
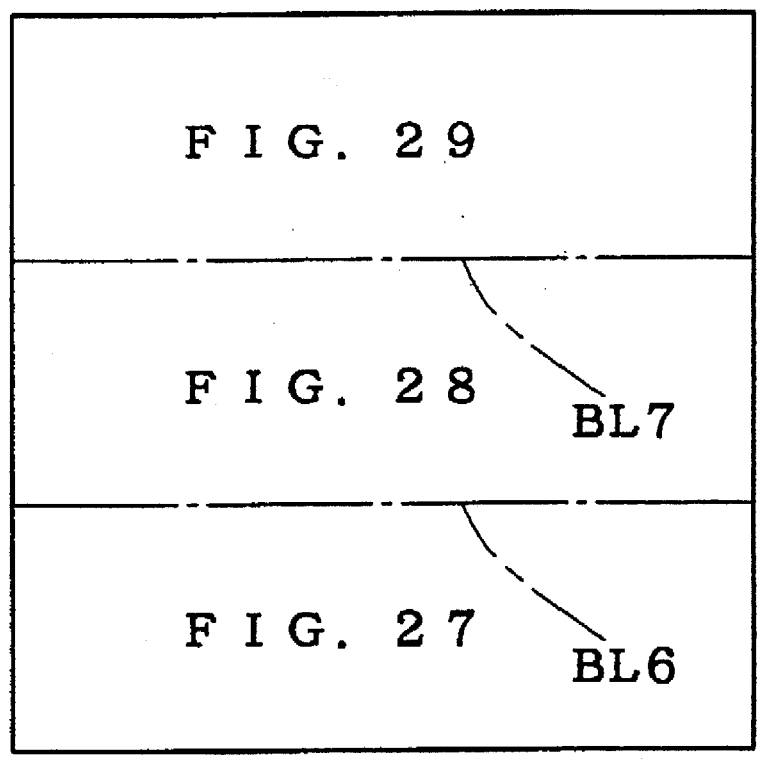
FIG. 26 is a drawing showing the construction of the pipeline type A/D converter according to the fourth embodiment of the present invention.
Figure 27:
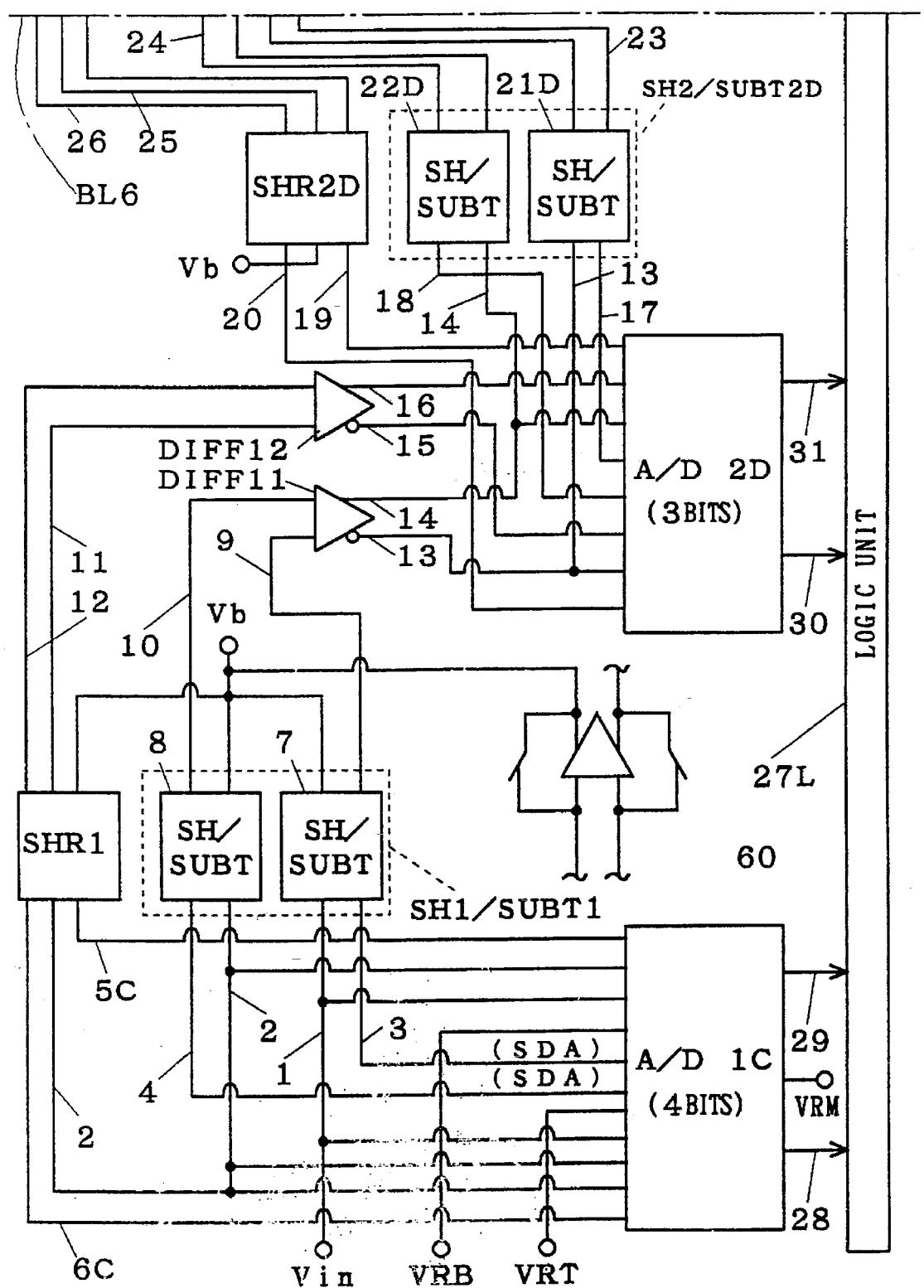
FIG. 27 is a drawing showing the construction of the pipeline type A/D converter according to the fourth embodiment of the present invention.
Figure 28:
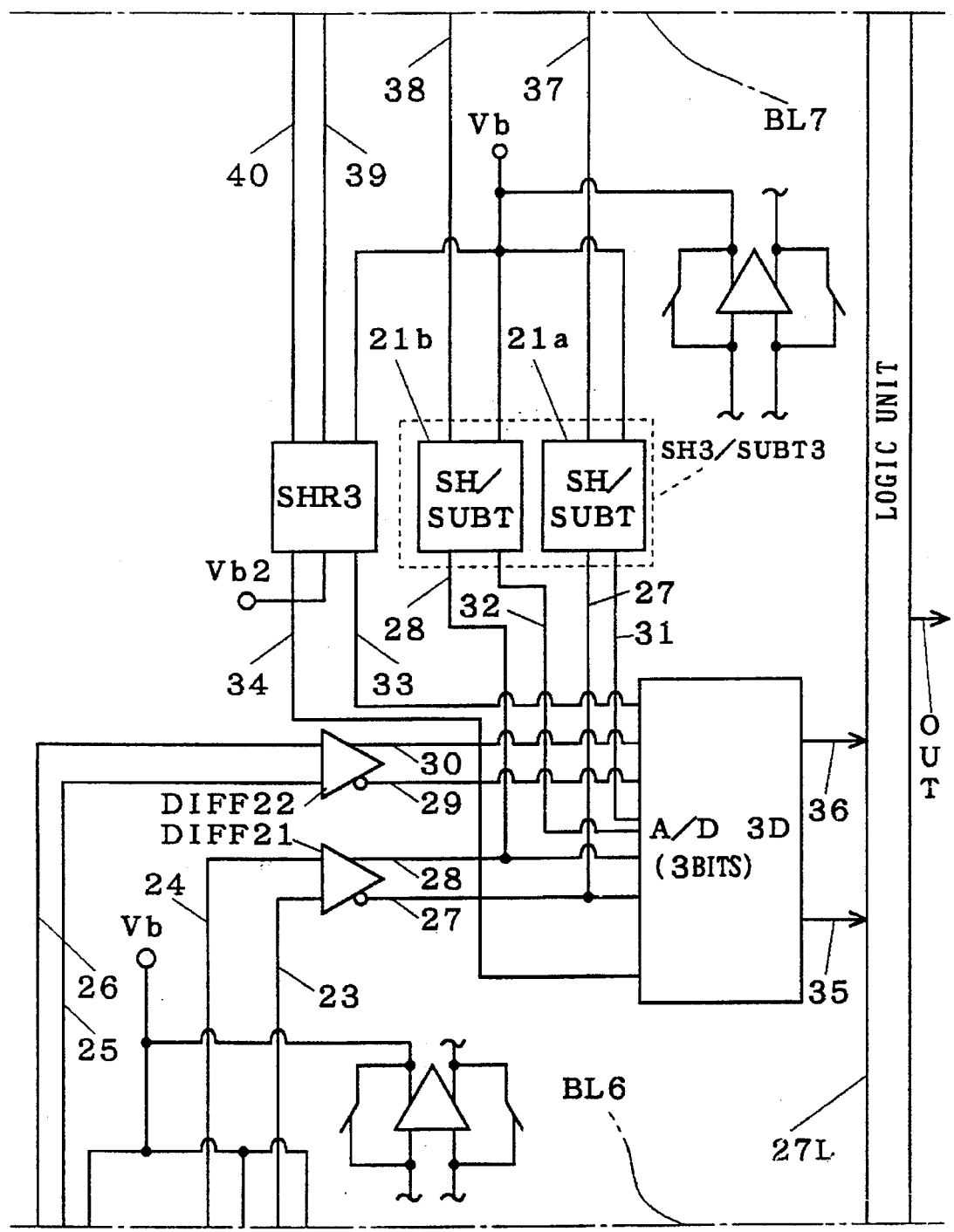
FIG. 28 is a drawing showing the construction of the pipeline type A/D converter according to the fourth embodiment of the present invention.
Figure 29:
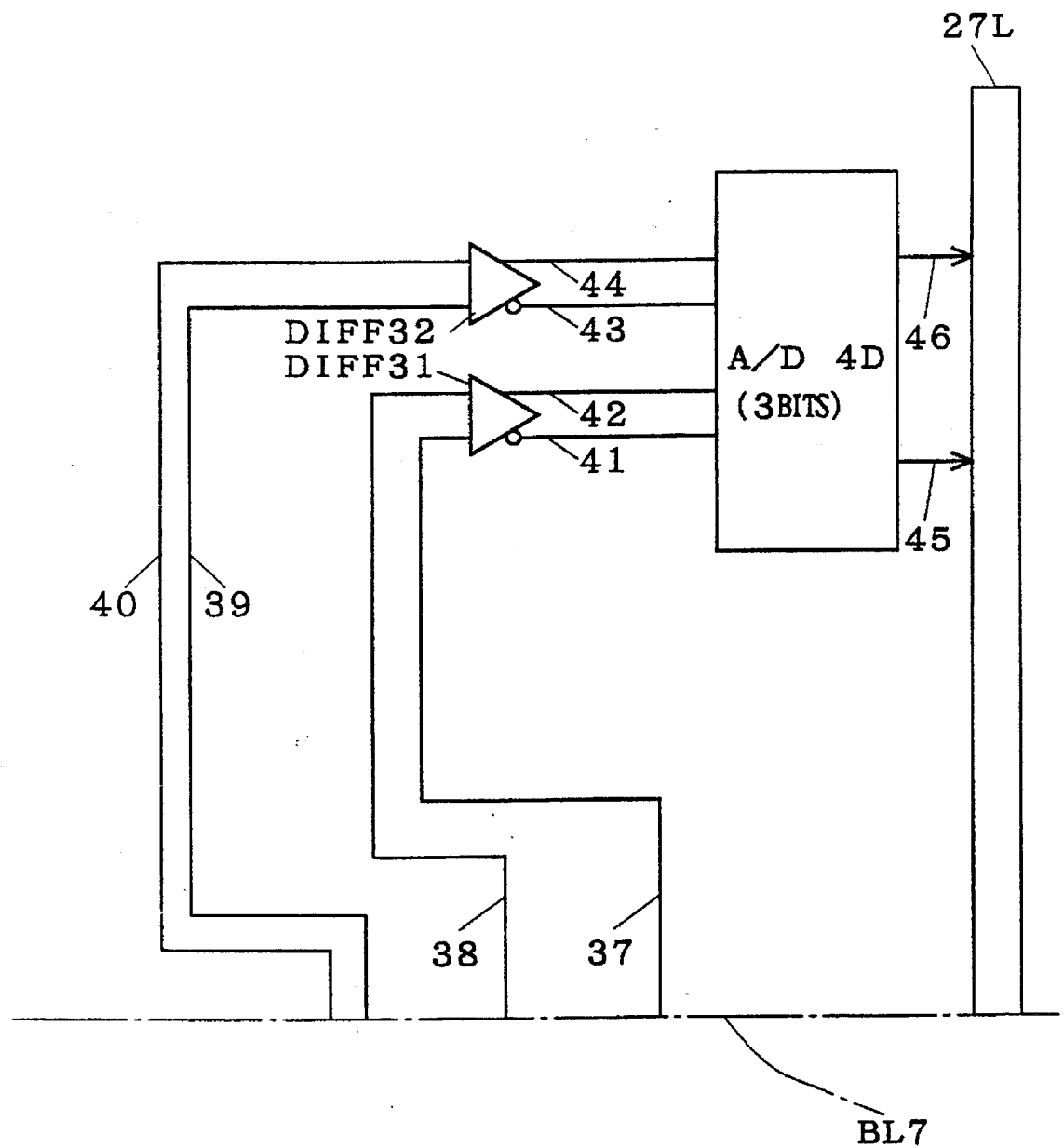
FIG. 29 is a drawing showing the construction of the pipeline type A/D converter according to the fourth embodiment of the present invention.

FIG. 24 is a drawing showing the circuit construction of the A/D converter block A/D1C in 3 bits for the sake of simplification of illustration, while FIG. 25 indicates the relationship between the reference voltages and the input signal voltage of the first stage.

Here, the A/D converter is constructed in a way to supply the reference voltage of the A/D converter block A/D1C in the first stage with the difference of potential between the 1.5 V intermediate tap (corresponding to an intermediate value VRM of the reference voltages) and the respective taps because the voltages VRB and VRT are given as 1 V, 2 V respectively. On the other hand, also the analog input signal Vin is applied to the intermediate tap, that is, the intermediate value VRM of the reference voltages. Therefore, the in-phase component of the reference voltages about agrees with that of the analog input signal Vin.

In this case, there is no change of potential at the input side terminal of the coupling capacitor Cc2 even if subtraction is made in the circuit SH1/SUBT1 because, while the potential at the input side terminal of the coupling capacitor Cc1 of the circuit SH1/SUBT1 changes by the portion of the result of subtraction, the voltage applied to the input side terminal of the other coupling capacitor Cc2 remains the intermediate value VRM of the reference voltages.

Therefore, the output side terminal of the coupling capacitor Cc1 changes by the portion of subtraction from the bias voltage Vb, but the output side terminal of the coupling capacitor Cc2 does not change from the bias voltage Vb. This point is the same at what level the analog input signal Vin may be, and this makes it possible to remarkably reduce the problem of the first embodiment that the in-phase component varies in accordance with the case of subtraction. Consequently, the deterioration of accuracy is greatly improved in the differential amplifier DIFF11 which receives the respective outputs of the coupling capacitors Cc1, Cc2 as its inputs, because the fluctuations of the in-phase component of the inputs are small. This makes it possible to realize ideal in-phase inputs in the differential amplifier DIFF11 and transmit the results of subtraction in the first stage to the next stage at high accuracy.

Moreover, the point stated about the differential amplifier DIFF11 is also established with the differential amplifier of the differential amplifiers for voltage comparator 49 of the A/D converter block A/D1 in the first stage. This also makes it possible to perform the A/D conversion in the first stage at high accuracy. However, because only the relative size may be determined inside the A/D converter block A/D1, the construction of the A/D converter block A/D1 may not necessarily be realized so rigorously as described above.
(Embodiment 4)

The conventional pipeline type A/D converter uses amplifiers of high-amplification gain which consumes a large amount of electric power for the setting of input range. Moreover, the first and the second embodiments of the present invention, though not consuming such great amount of electric power as with the prior art, have a problem of requiring sufficient matching of the input signal paths (SH1/SUBT1, DIFF11, for example) and the reference voltage paths (SHR1, DIFF12, for example) to realize any A/D converter of higher accuracy.

The threshold value voltage of MOS transistors produces variations because there is no way to make it uniform in the manufacture. Therefore, usually, the difference of the threshold value voltages between 2 MOS transistors forming a differential pair in differential amplifiers becomes several mV and variable. For that reason, offset voltages are generated in differential amplifiers on the input signal paths and differential amplifiers on the reference voltage paths, and the offset voltages also become variable because of the variation of threshold value voltages. Therefore, the first embodiment and the second embodiment of the present invention produce a problem that the resolution of the A/D converter is limited to a level at which the offset voltage is negligible. This point becomes a big problem in cases where high-accuracy A/D conversion is required, though not so much in rough A/D conversion. This fourth embodiment is designed to realize a high-speed high-accuracy A/D converter by compensating for the generation and the variations of this offset voltage.

FIG. 26 to 29 indicates the pipeline type A/D converter according to the fourth embodiment of the present invention. In the drawing, the A/D converter block A/D1C in the first stage is identical to that of the third embodiment. Here, improvement is made in the respective A/D converter blocks A/D2 to A/D4 in the second to the fourth stages and the corresponding circuit SHi/SUBTi and circuit SHRi (i=2 to 3) of the first embodiment.

Figure 30:
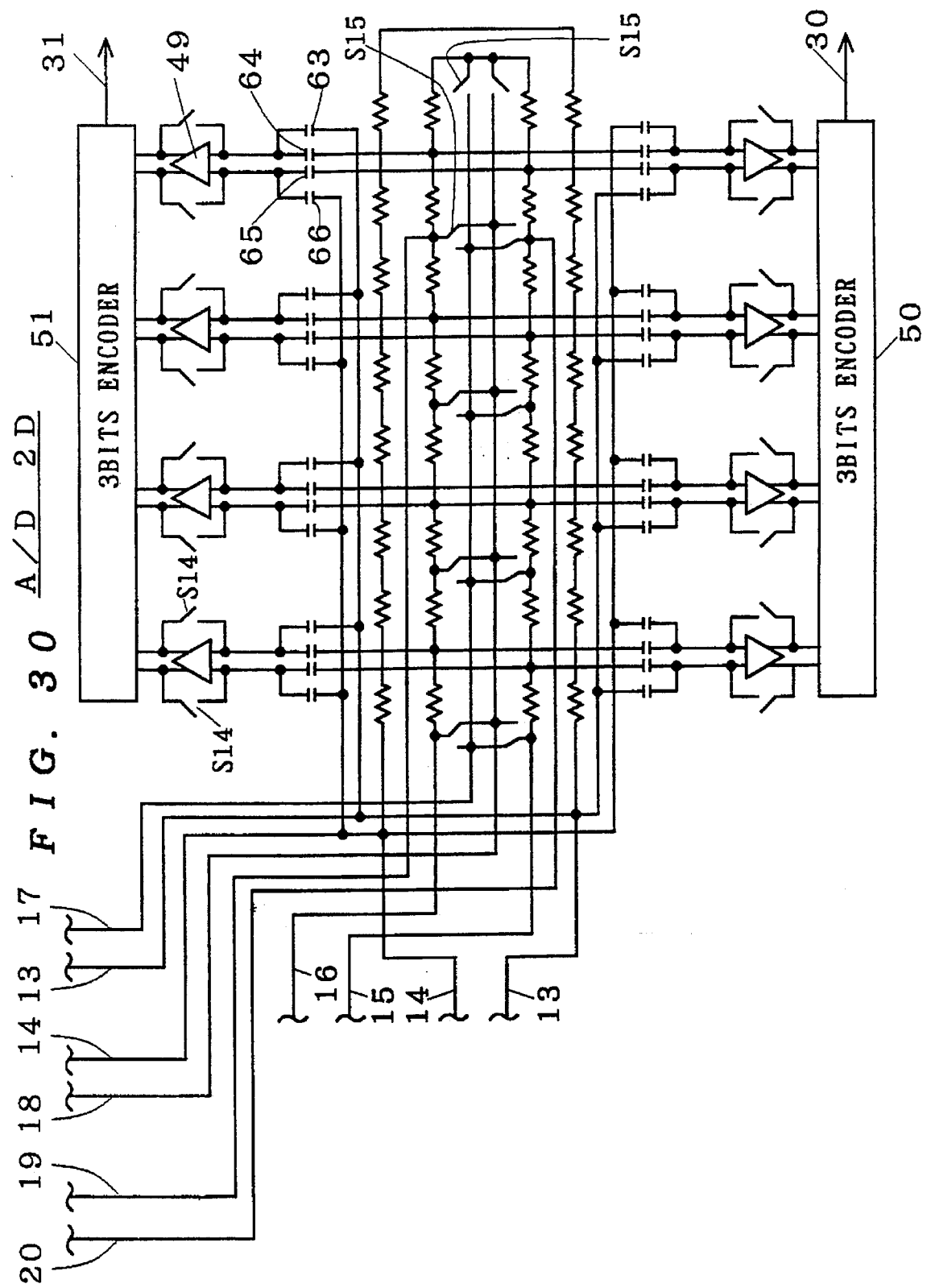
FIG. 30 is a drawing showing the construction of the A/D converter block in the second stage according to the fourth embodiment.

Moreover, FIG. 30 indicates the internal construction of the A/D converter block A/D2D. This circuit substitutes coupling capacitors Cc for the conventional construction with the switches S22, S23. In this drawing, the coupling capacitors 66, 65, 64, 63 correspond respectively to the first, second, third and fourth coupling capacitors, and the switch 14 connected to one end of the coupling capacitors 65, 66 is the first switch and the switch 14 connected to one end of the coupling capacitors 64, 63 is the second switch. The construction of other A/D converter blocks (A/D3D to A/D4D) is the same as that shown in FIG. 30.

Figure 31:
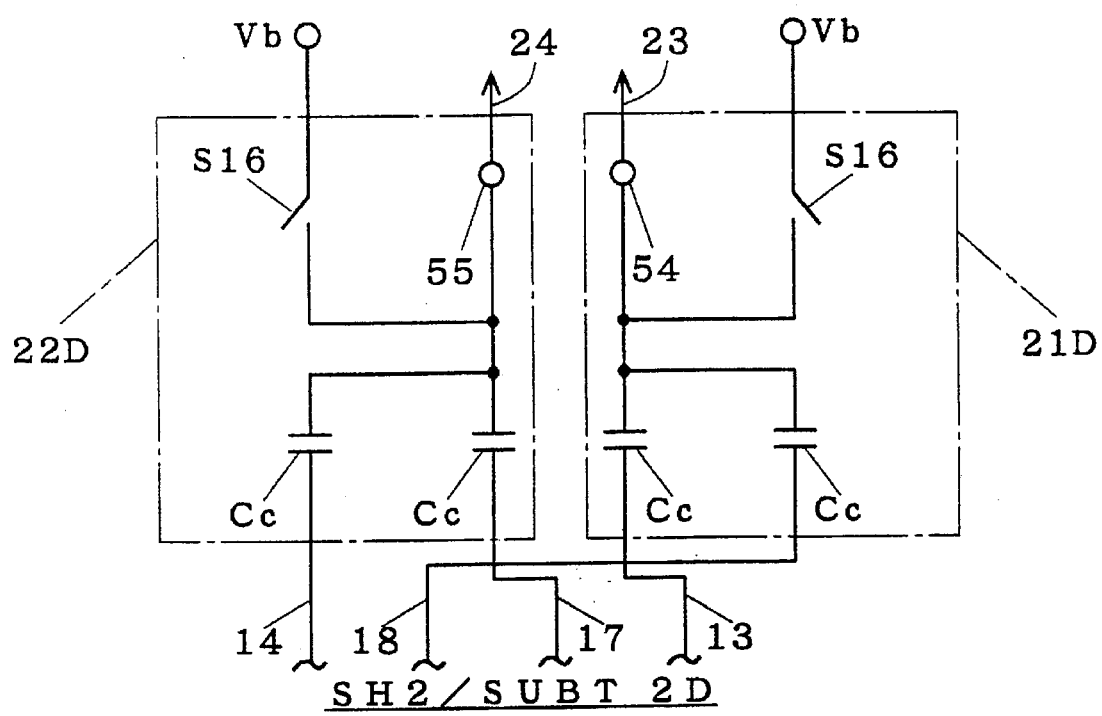
FIG. 31 is a drawing showing the construction of the S/H & subtraction circuit of the signal input path in the second stage according to the fourth embodiment.
Figure 32:
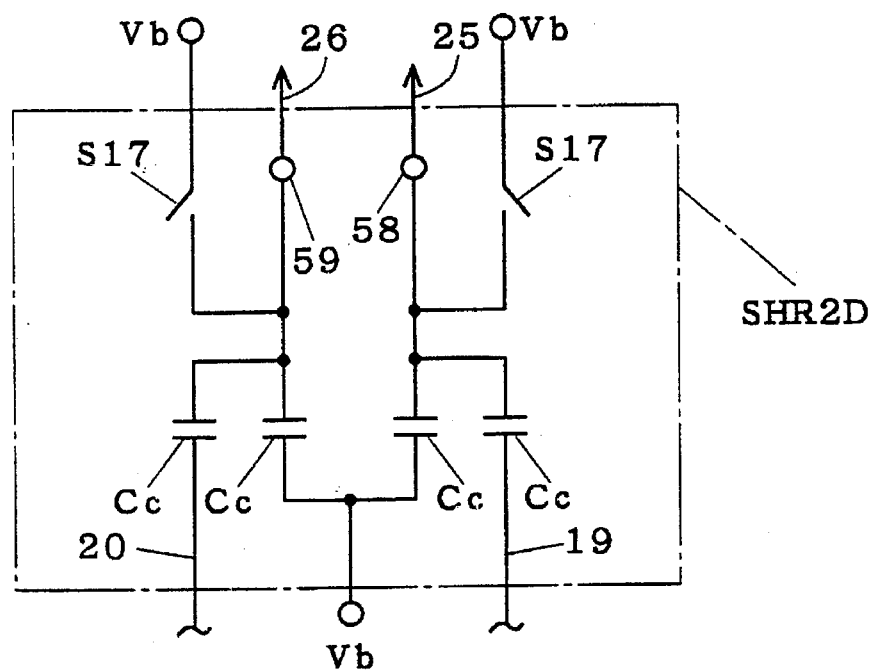
FIG. 32 is a drawing showing the construction of the S/H circuit of the reference voltage path in the second stage according to the fourth embodiment.

Furthermore, FIG. 31 and FIG. 32 show the construction of the circuits SH2/SUBT2D and SHR2, respectively. In the both circuits, the portion which was conventionally constructed with the switches S1, S7, S8 has been replaced by the coupling capacitors Cc. They are defined as the fifth, sixth, seventh and eighth coupling capacitors in order from the coupling capacitors positioned on the left side of the paper face in FIG. 31. Moreover, the switch S16 of which one end is connected to the output terminal 54 is the fourth switch, while the switch S16 connected at one end to the output terminal 55 is the third switch. The circuits SH3/SUBT3D and SHR3D are also the same as in FIG. 31, FIG. 32, respectively.

Figure 34:
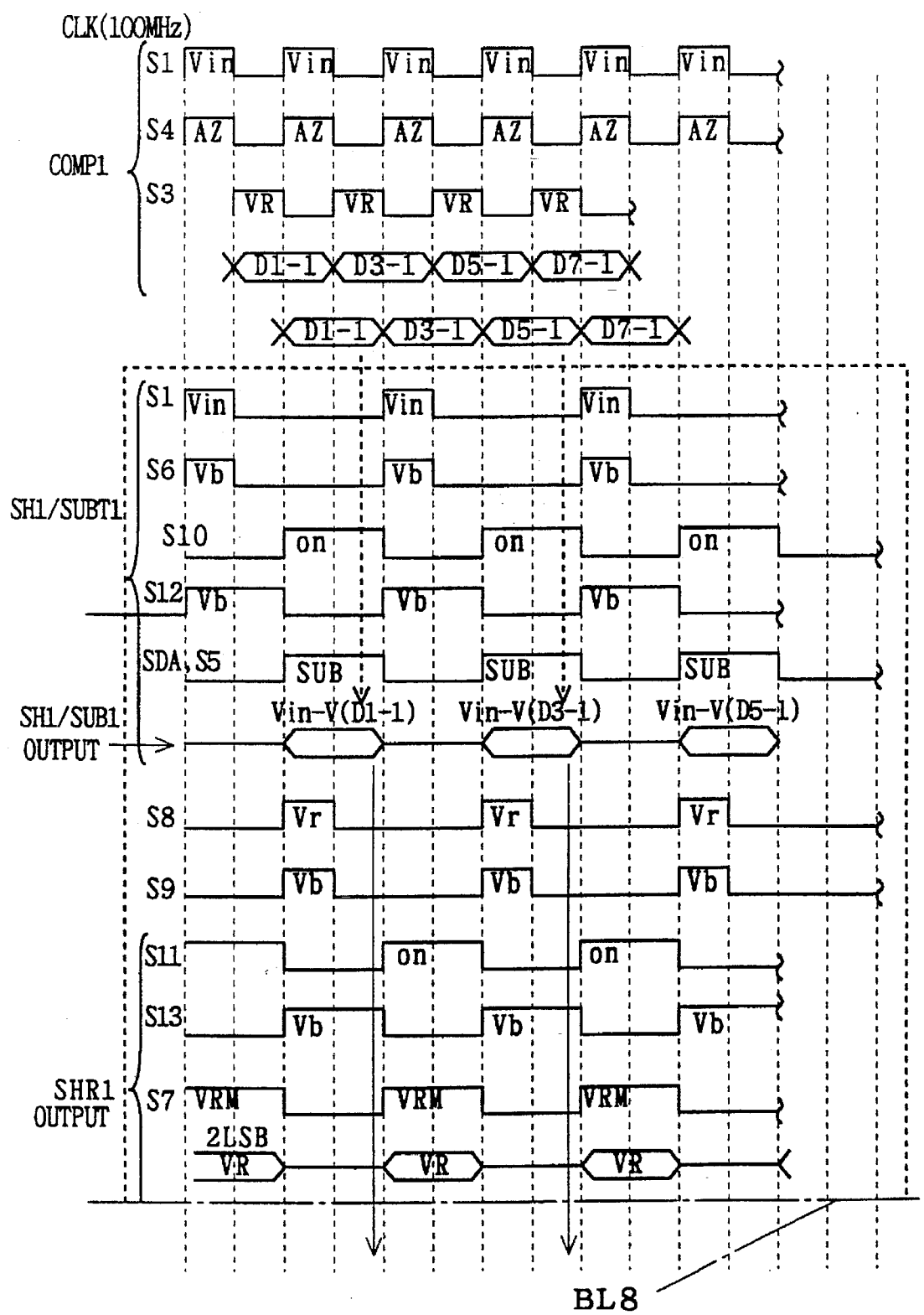
FIG. 34 is a timing chart showing the operations of the pipeline type A/D converter according to the fourth embodiment.
Figure 35:
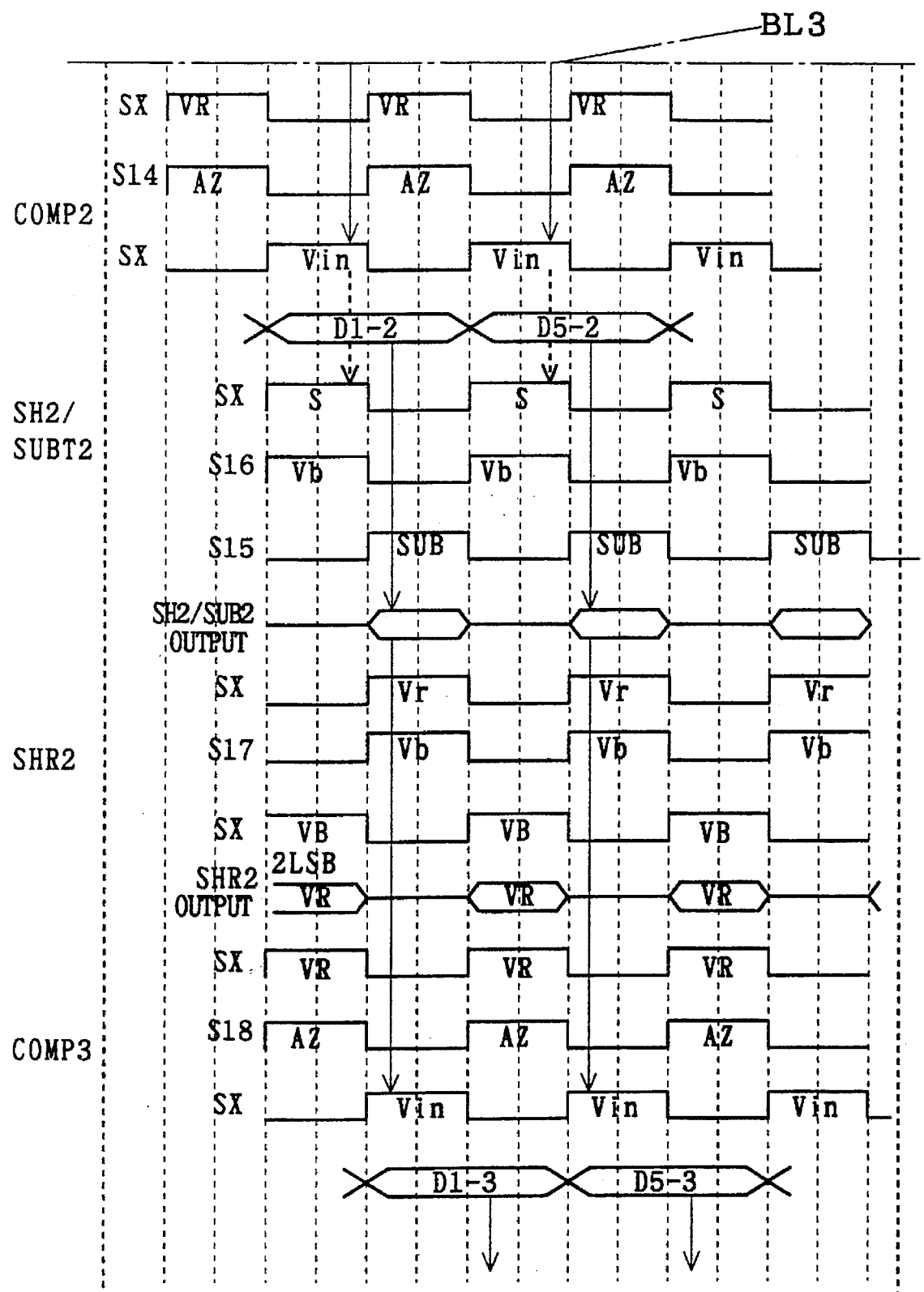
FIG. 35 is a timing chart showing the operations of the pipeline type A/D converter according to the fourth embodiment.

FIG. 33 to FIG. 35 indicate their timing chart.

In the respective drawings described above, the portions same as the first, second and third embodiments are indicated with the same symbols.

Figure 36:
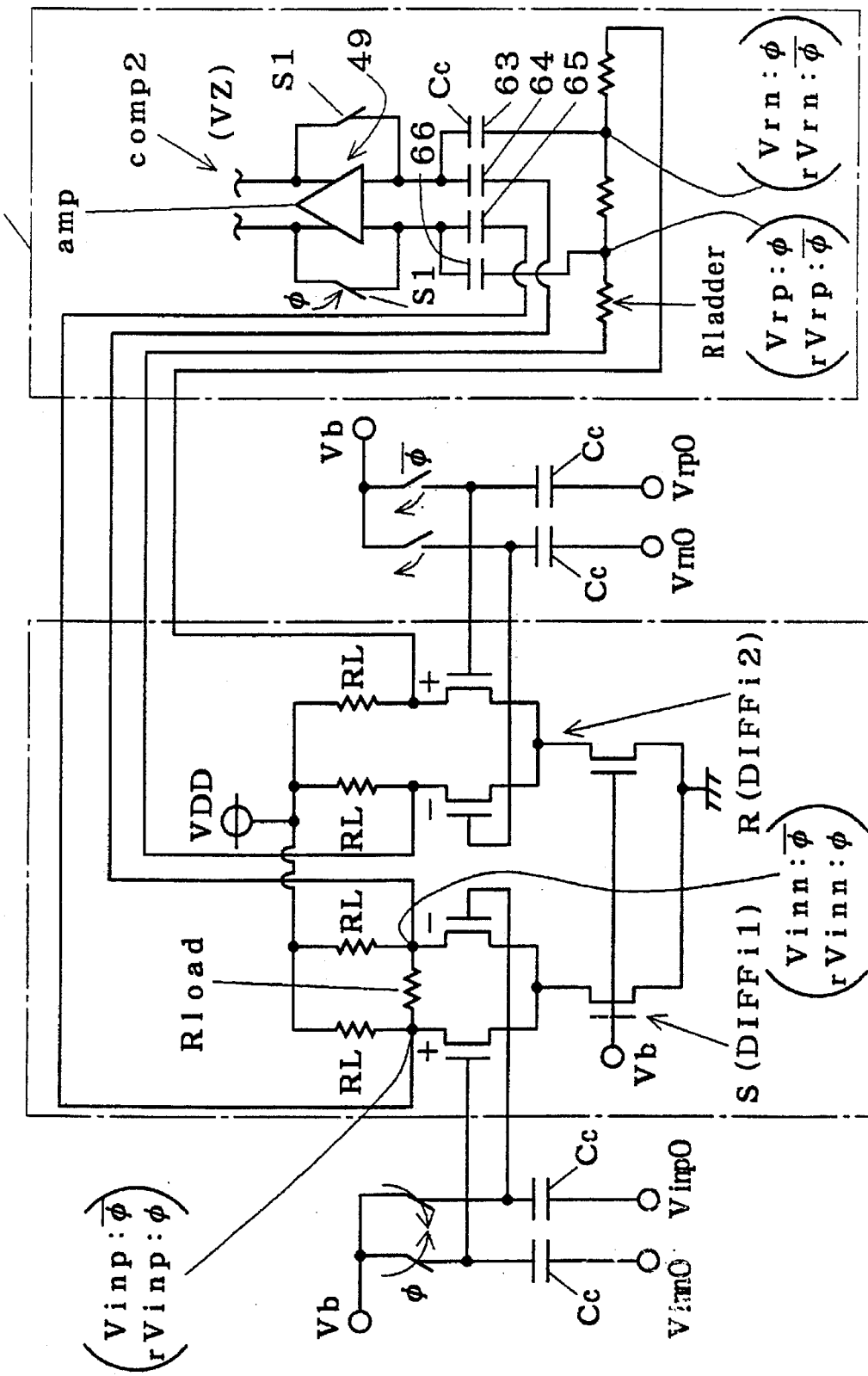
FIG. 36 is a circuit diagram for describing the principle of compensation of offset voltage in the fourth embodiment.

Moreover, FIG. 36 is a drawing for describing the functions & effects of this fourth embodiment by extracting, in a certain stage between the second to the fourth stages, 2 differential amplifiers of the previous stage as well as one voltage comparator and the ladder-type resistor in the A/D converter block of the stage concerned. In the drawing, a symbol S indicates a differential amplifier on signal side (corresponding to a differential amplifier DIFFi1 (i=1 to 3) in the i-th stage) and a symbol R represents a differential amplifier on reference voltage side (corresponding to an other differential amplifier DIFFi2 in the i-th stage). Moreover, a symbol comp2 denotes a voltage comparator of the A/D converter block A/D(i+1)D in the (i+1)th stage, a symbol Rladder denotes a ladder-type resistor in the A/D converter block A/D(i+1)D, a symbol RL denotes load resistors of the differential amplifiers (S, R) on both signal side and reference voltage side, a symbol Rload denotes a load resistor for matching characteristics between the differential amplifiers of the same layout as the ladder-type resistor Rladder, a symbol Cc denote coupling capacitors, a symbol VDD denotes a driving voltage of the two differential amplifiers (S, R), a symbol φ denotes clock signals of respective switches, a symbol φ̄ denotes reversed clock signals of the clock signal φ, and a symbol amp denotes a differential amplifier in the differential amplifier for voltage comparator 49.

Furthermore, symbols vinp, vinn denote output voltages of the differential amplifier on signal side S respectively and indicate the hold outputs, while symbols rvinp, rvinn denote voltages on plus side and minus side of the output voltage of the differential amplifier S respectively at the time when the input of the differential amplifier on signal side S is connected to the bias voltage Vb, namely when the input signal is charged in the coupling capacitors Cc in the circuit SHi/SUBTiD. Symbols vrp, vrn denote output voltages of the differential amplifier on reference voltage side R and indicate the hold outputs, and symbols rvrp, rvrn denote, respectively, plus side and minus side output voltages of the differential amplifier R at the time when the input of the differential amplifier on reference voltage side R is connected to the bias voltage Vb, namely when sampling is being made by charging the reference voltage with the coupling capacitors Cc in the circuit SHRiD in the i-th stage. A symbol vz indicates the voltage at the time when the input and the output of the differential amplifier amp in the differential amplifier for voltage comparator 49 are short-circuited through the switch S1 of FIG. 36.

Symbols vinp0, vinn0 indicate the plus side and the minus side of the input voltage applied to the differential amplifier on signal side S through the coupling capacitors Cc, respectively, while symbols vrp0, vrn0 indicate the plus side and the minus side of the reference voltage applied to the differential amplifier on reference voltage side R through the coupling capacitors Cc, respectively.

When the clock signal φ is "ON", the 2 switches connected to the input portion of the differential amplifier on signal side S are "OFF" and the switch S1 of FIG. 36 is "ON". When the clock signal φ is "OFF", the situation will be opposite to the situation described above.

Next, description will be made on operations. This fourth embodiment is intended to cancel the offset voltage with special attention to the complementary operations that, while the circuit SHi/SUBTiD of the previous stage ("i"th stage) is charged, the circuit SHRiD is not charged and the differential amplifier on signal side S, which has the output of the circuit SHi/SUBTiD for input, outputs the offset voltage, the other differential amplifier on reference voltage side R outputs a voltage given as (the reference voltage +the offset voltage) and that those motions are reversed during the charging of the circuit SHRiD.

In a phase of the clock signal φ, the switch S1 in the differential amplifier for voltage comparator 49 is "ON" and the input voltage of that amplifier amp is fixed to the voltage vz. At that time, the output of the differential amplifier on reference voltage side R remains in the holding state because the switch connected to its input portion is turned "OFF", and the reference voltages vrp, vrn which have been sampled immediately before are output. At the same time, the differential amplifier on signal side S remains in the sampling state because the switch on its input side is "ON", so that both of the coupling capacitors Cc connected to its input portion charge the analog input signal, voltages rvinp, rvinn of a case where the input of the differential amplifier S is fixed to the bias voltage Vb are generated at the output of the differential amplifier S. At this time, the both voltages rvinp, rvinn generated on its output side, when the input terminal of the differential amplifier S is connected to the bias voltage Vb, are not of equal potentials because of mismatching of the threshold values of the transistors constituting the differential pair, etc. and generate an offset voltage of the differential amplifier as shift of several mV. On the other hand, the outputs vrp, vrn become the reference voltages including the offset voltage.

Therefore, these outputs vrn, rvinp, rvinn and vrp are respectively applied to the respective input side terminals of the coupling capacitors 63 to 66 on the side of the differential amplifier for voltage comparator 49. On the other hand, the respective output sides of the coupling capacitors 63 to 66 are fixed to the voltage Vz which has been generated when the input/output terminal of the amplifier amp is short-circuited. Accordingly, the coupling capacitors 63 to 66 (Cc) are charged by the potential differences (vrn–vz), (rvinp–vz), (rvinn–vz) and (vrp–vz), respectively.

When the clock signal φ is inverted in this condition, the differential amplifier on reference voltage side R enters the sampling state. The differential amplifier for reference voltage side R samples the inputted reference voltage by the coupling capacitor Cc in the circuit SHRiD in the previous stage, while outputting the voltages vrvp and rvrn which are obtained when the 2 inputs of the differential amplifier on reference voltage side R is fixed to the bias voltage Vb. Therefore, the outputs rvrp and rvrn supply the offset voltage of the differential amplifier on reference voltage side R.

On the other hand, the differential amplifier on input voltage side S enters the holding state, and outputs the analog inputs vinp and vinn which have been sampled in the previous phase. Accordingly, both the outputs vinp and vinn are an analog input voltage including an offset voltage.

Furthermore, the switch S1 of the amplifier amp in the differential amplifier for voltage comparator 49 is released at this time, and therefore, the input terminal of the differential amplifier for voltage comparator 49 is continuously biased at the large point of the gain of the amplifier amp, and is in the floating state.

Therefore, by the redistribution of electric charge generated by the reversion of the clock signal φ, the input side voltage vxp of the amplifier amp is given with the formula (1) below. This formula (1) is led out by regarding the electric charge q (given with the formula (2)) stored in the coupling capacitors 65, 66 when the clock signal φ is "ON" and the electric charge q' (given with the formula (3)) stored in the coupling capacitors 65, 66 when the clock signal φ̄ is "ON" as equal (q=q').

As shown in formula (1), the offset voltages of the both differential amplifiers S, R are cancelled by the voltages (vinp–rvinp) and (vrp–rvrp).

$$vxp = (Cc/(2Cc+Cs)) \cdot ((vinp-rvinp)-(vrp-rvrp))+vz \quad (1)$$

$$q = -Cc\,(rvinp-vz) - Cc\,(vrp-vz) + Cs \cdot vz$$

$$= -Cc\,(rvinp+vrp) + (Cc+Cc+Cs) \cdot vz \quad (2)$$

$$q' = -Cc\,(vinp-vxp) - Cc\,(rvrp-vxp) + Cs \cdot vxp$$

$$= -Cc\,(vinp+rvrp) + (Cc+Cc+Cs) \cdot vxp \quad (3)$$

Similarly, the minus input side voltage vxn of the amplifier amp is given with the formula (4). Also for the minus side node, the offset voltages are corrected in the same way.

$$vxn = (Cc/(2Cc+Cs)) \cdot ((vinn-rvinn)-(vrn-rvrn))+vz \quad (4)$$

The amplifier amp in the comparator 49 amplifies the voltages vxp, vxn, so that the comparator 49 performs the comparison in the state where the offset voltages of the respective differential amplifiers S, R are corrected when comparing the input voltage and the reference voltage. As a result, high-accuracy comparison becomes capable.

In this fourth embodiment, this principle described in FIG. 36 is not only applied to the respective A/D converter blocks A/D2D to A/D4D but also is adopted for the S/H circuit SHRiD and S/H & subtracting circuit SH/SUBTiD provided between stages.

This makes it possible to promote high accuracy by eliminating the offset voltage of the differential amplifier not only in the parallel type A/D converter blocks A/D2D to A/D4D but also in the blocks making subtraction (SHR2D to SHR3D, SH2/SUBT2D to SH3/SUBT3D).

(Embodiment 5)

The A/D converter according to the fifth embodiment of the present invention is provided, in the final stage of the pipeline type A/D converter, with a block having the reference voltage side path and the input signal side path in common, but various examples of construction are conceivable because it is also effective to form the parallel type A/D converter in the final stage only as described later. Moreover, the technical idea of this fifth embodiment is applicable not only to the final stage but also to the respective stages on the way.

Figure 37:
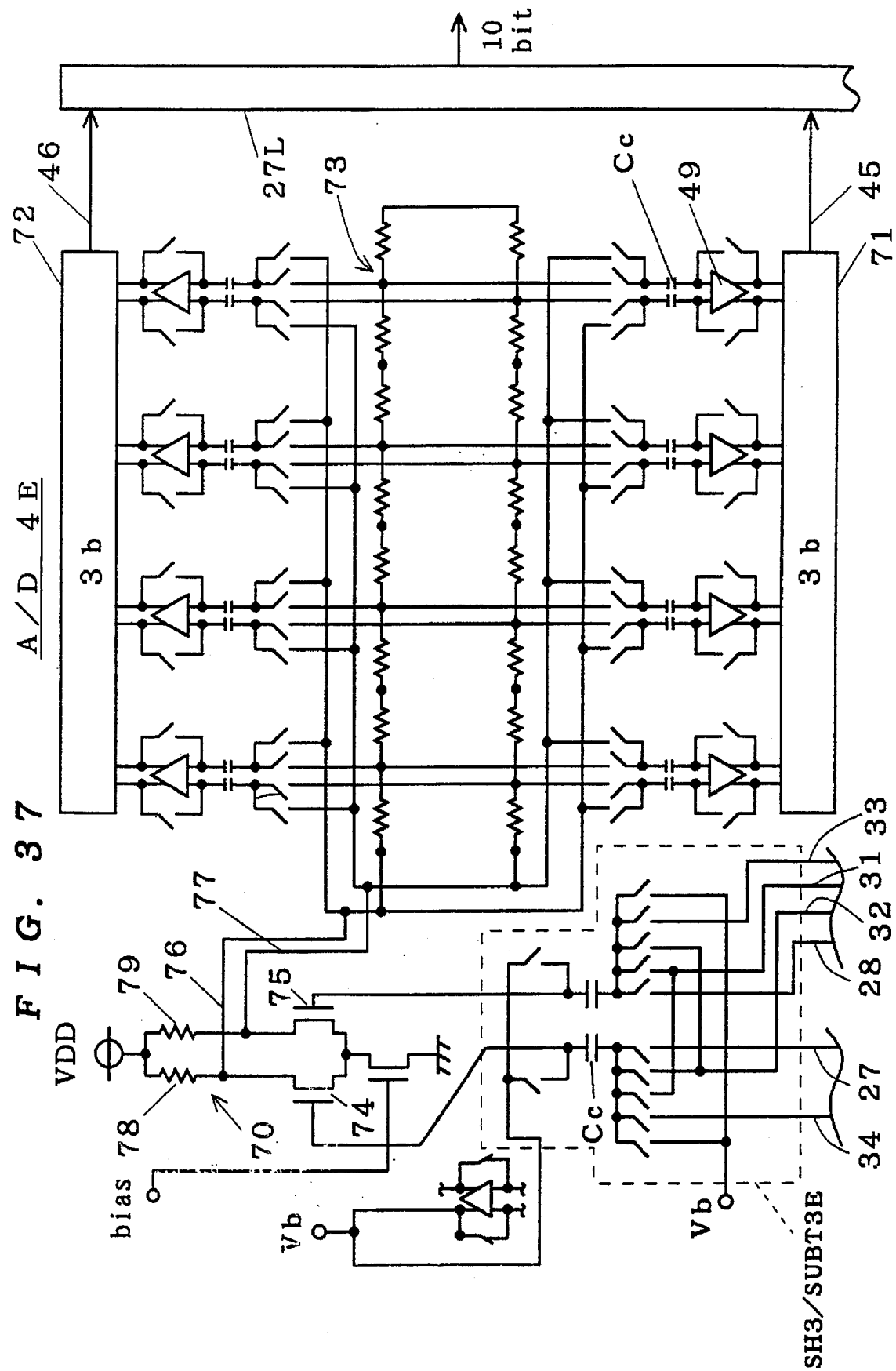
FIG. 37 is a drawing showing art example of construction of the A/D converter block in the final stage according to the fifth embodiment.

FIG. 37 is an example of construction of the fifth embodiment and indicates the A/D converter block A/D4E in the final stage (fourth stage in this case) and the subtraction block in the previous stage. In this example of construction, the circuit SHR3 and the circuits SH3/SUBT3 of the previous stage are constructed with single circuit SH3/SUBT3E, and the differential amplifiers DIFF31, DIFF32 of the first embodiment are constructed with single differential amplifier made of 2 MOS transistors 74, 75, the 2 outputs 76, 77 of this differential amplifier are used as both input signals and reference voltages at both ends of the ladder-type resistor of the A/D converter block A/D4E. The circuit SH3/SUBT3E is composed of a first switch circuit (corresponding to a portion where input signals 27, 34 are input), a second switch circuit (corresponding to a portion where input signals 28, 33 are input) and 2 coupling capacitors Cc. When the input signals 27, 28 are input in the first and the second switches respectively to be selected and output, respective switches connected to the other end of the respective coupling capacitors Cc are turned "ON" in synchronization with it and the bias voltage Vb is applied to the each other end of the two coupling capacitors Cc.

Figure 38:
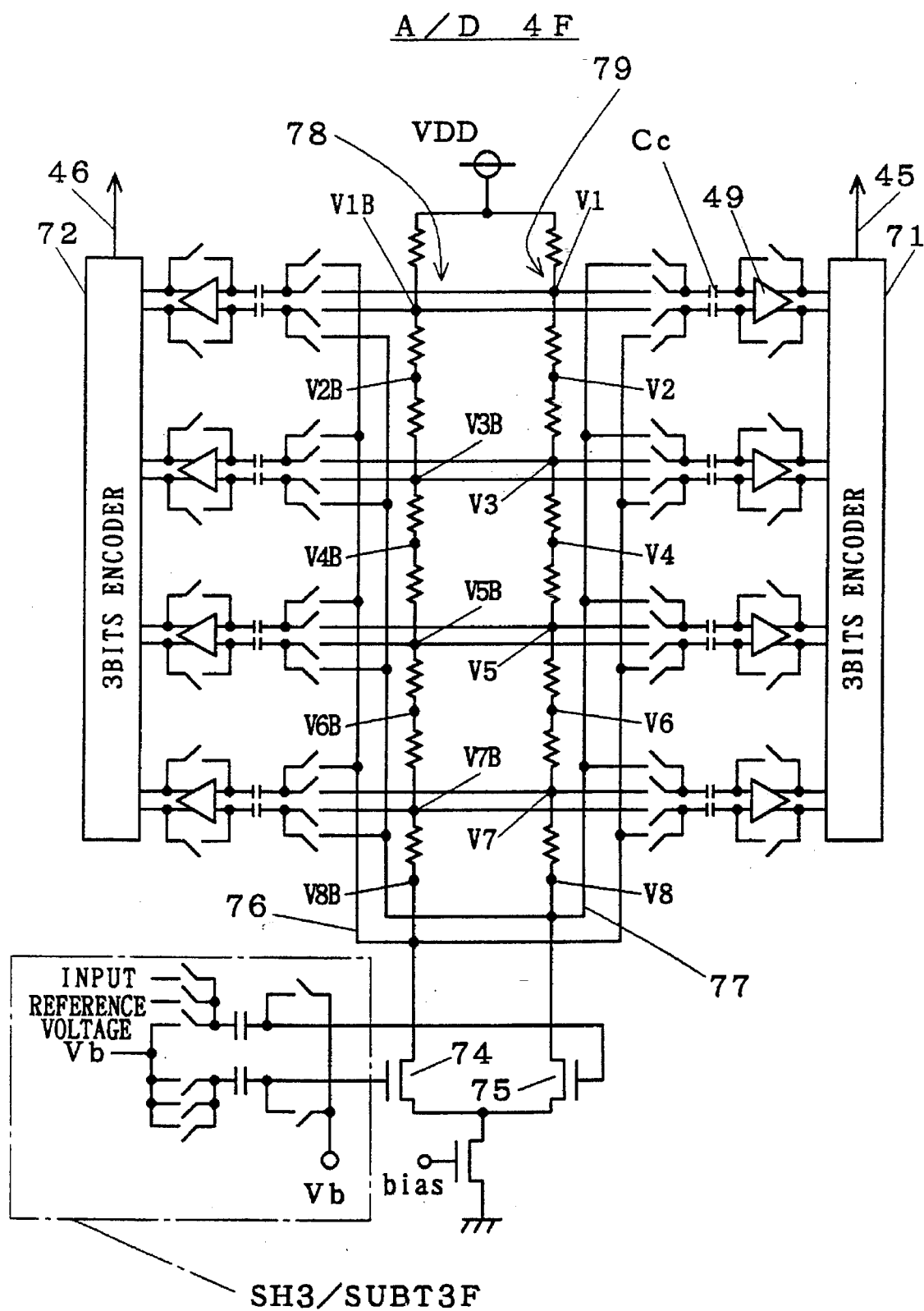
FIG. 38 is a drawing showing other example of construction of the A/D converter block in the final stage according to the fifth embodiment.

FIG. 38 is another example of construction of the fifth embodiment and indicates the A/D converter block A/D4F in the final stage (that is, fourth stage in this case) and the subtraction block in the previous stage. Also in this example of construction, the differential amplifier on the input signal path (corresponding to a differential amplifier DIFF31 of first embodiment) and the differential amplifier on the reference voltage path (corresponding to a differential amplifier DIFF32 of first embodiment) are constructed with single differential amplifier (74, 75), and the ladder-type resistor of the A/D converter block A/D4F in the fourth stage is formed with the load resistors of the differential amplifier (74, 75).

Namely, the S/H & subtracting circuit SH3/SUBT3F have a first input circuit portion and a second input circuit portion. The first input circuit portion is composed of 3 switches which receive the input voltage, the bias voltage and the reference voltage at the respective one ends, respectively, and are commonly connected to one another at the respective other ends and a coupling capacitor of which the input side terminal is connected to the other ends of those switches. The second input circuit portion is composed of 3 switches receiving the bias voltage as those inputs and a coupling capacitor. Moreover, this A/D converter is also provided with a differential amplifier composed of 2 MOS transistors 74, 75 (realized) the output side terminal of the coupling capacitor of the first input circuit portion and the output side terminal of the coupling capacitor of the second input circuit portion are connected to 2 input terminals of the differential amplifiers (74, 75), respectively. The load resistor of the differential amplifiers (74, 75) is constructed with ladder-type resistors consisting of a plural number of unit resistors connected in series.

And, the reference voltage terminals are serially connected to the respective taps which are connecting points of the ladder-type resistor and the input terminals are commonly connected to a specific tap of the ladder-type resistor, so that a plural number of differential amplifiers for voltage comparator 49 are provided.

Figure 39:
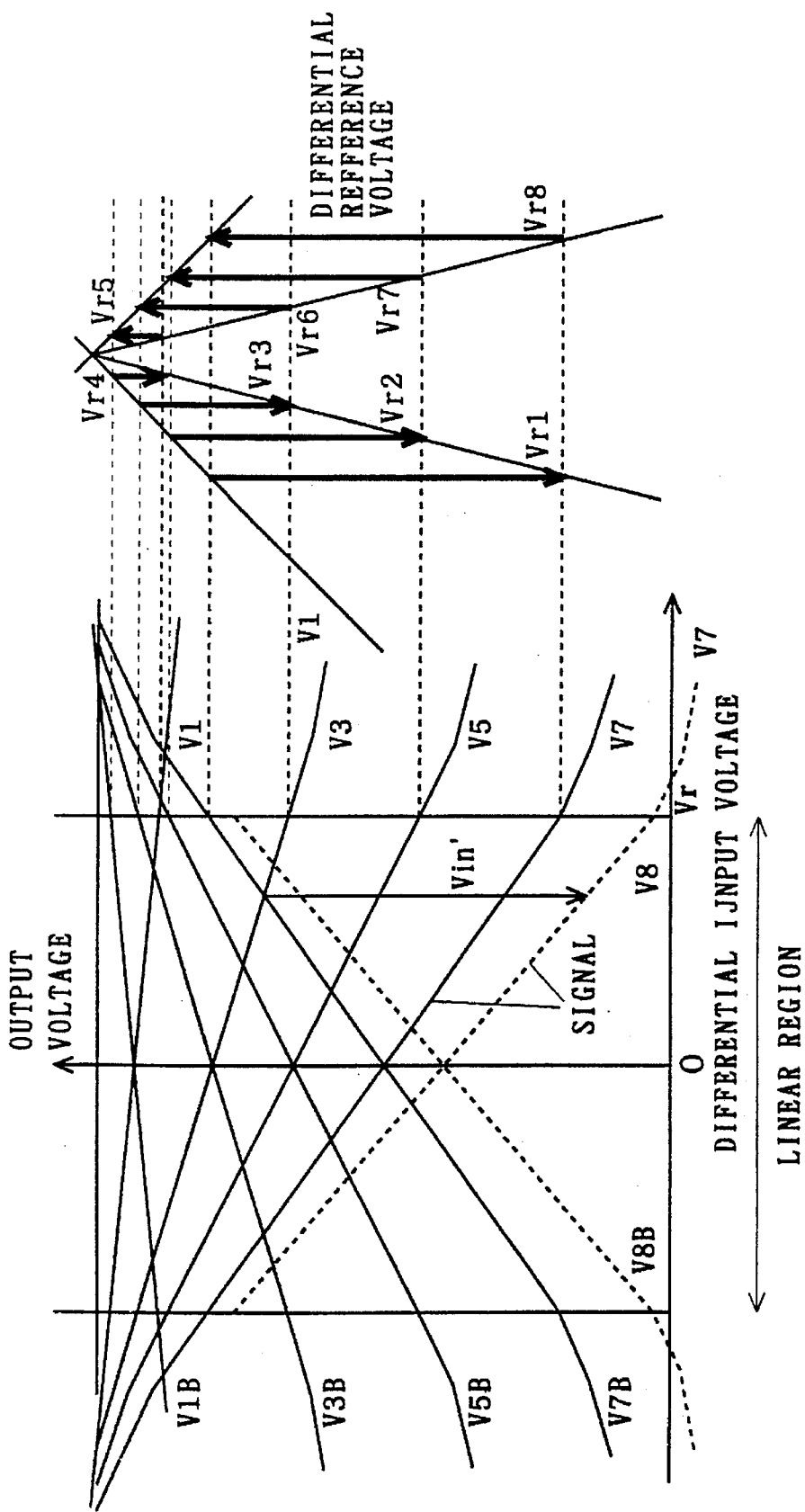
FIG. 39 is a drawing showing the relationship between reference voltage and input voltage in the A/D converter block according to the fifth embodiment.

FIG. 39 indicates the respective tap voltages applied to the train of voltage comparators (49) through the differential amplifiers (corresponding to amplifiers composed of transistors 74, 75 of FIG. 37 or FIG. 38) having one input circuit for both of the reference voltage and the input voltage against the differential input voltage of the A/D converter block concerned.

By adopting the form of taking out of tap voltage indicated in FIG. 39, the respective reference tap voltages uniformly vary in a region where the characteristics of the differential amplifiers change linearly, so that the input signals come to conform to this range of the reference tap voltages.

With the adoption of this construction, matching of the differential amplifiers on the reference voltage side and the input voltage side is no longer required, and it becomes possible to reduce displacement of range between the input signal and the reference voltage, so-called offset error and gain error and to construct a high-accuracy A/D converter or A/D converter blocks.

Two examples of the fifth embodiment shown in FIG. 37 and FIG. 38 correspond to a pipeline type A/D converter in which the A/D conversion block used in the linear areas shown in FIG. 39 is used in the final stage.

Figure 40:
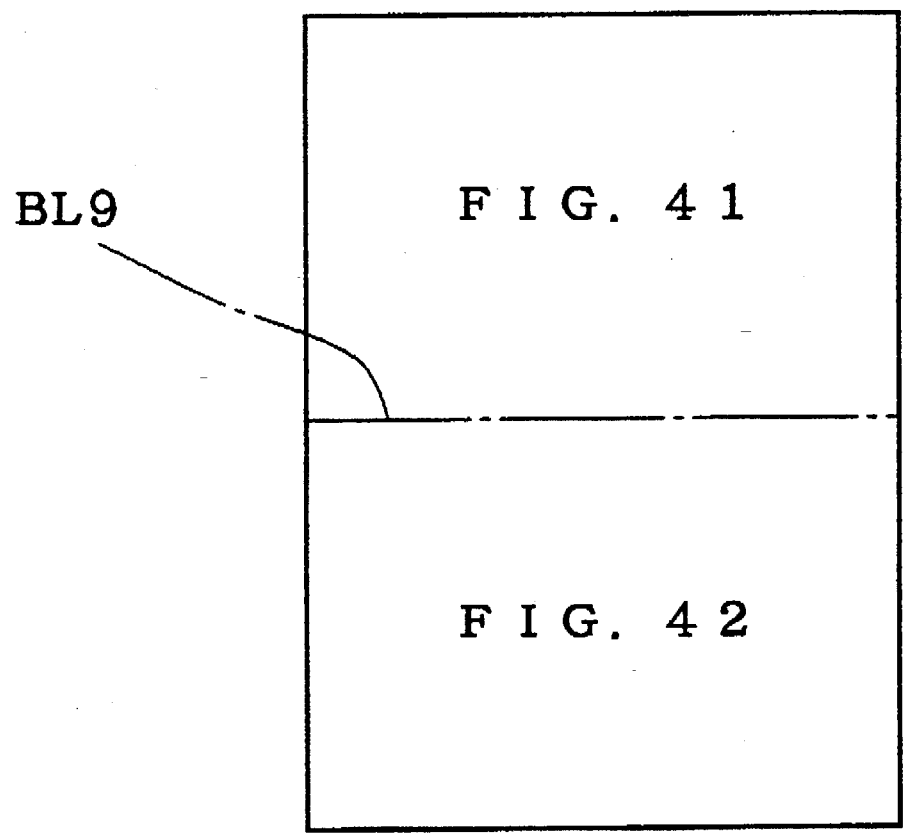
FIG. 40 is a timing chart showing the operations of the pipeline type A/D converter according to the fifth embodiment.
Figure 41:
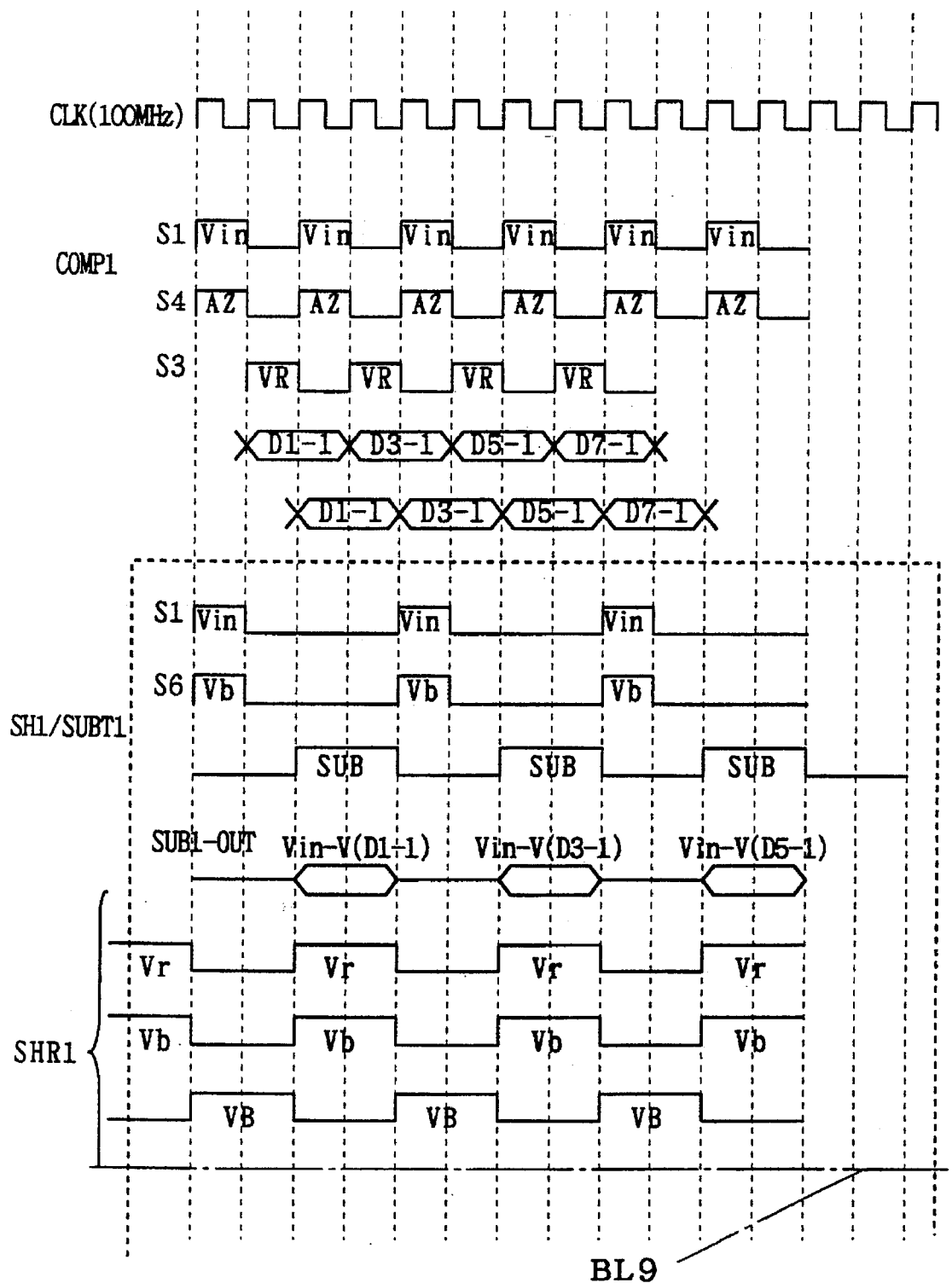
FIG. 41 is a timing chart showing the operations of the pipeline type A/D converter according to the fifth embodiment.
Figure 42:
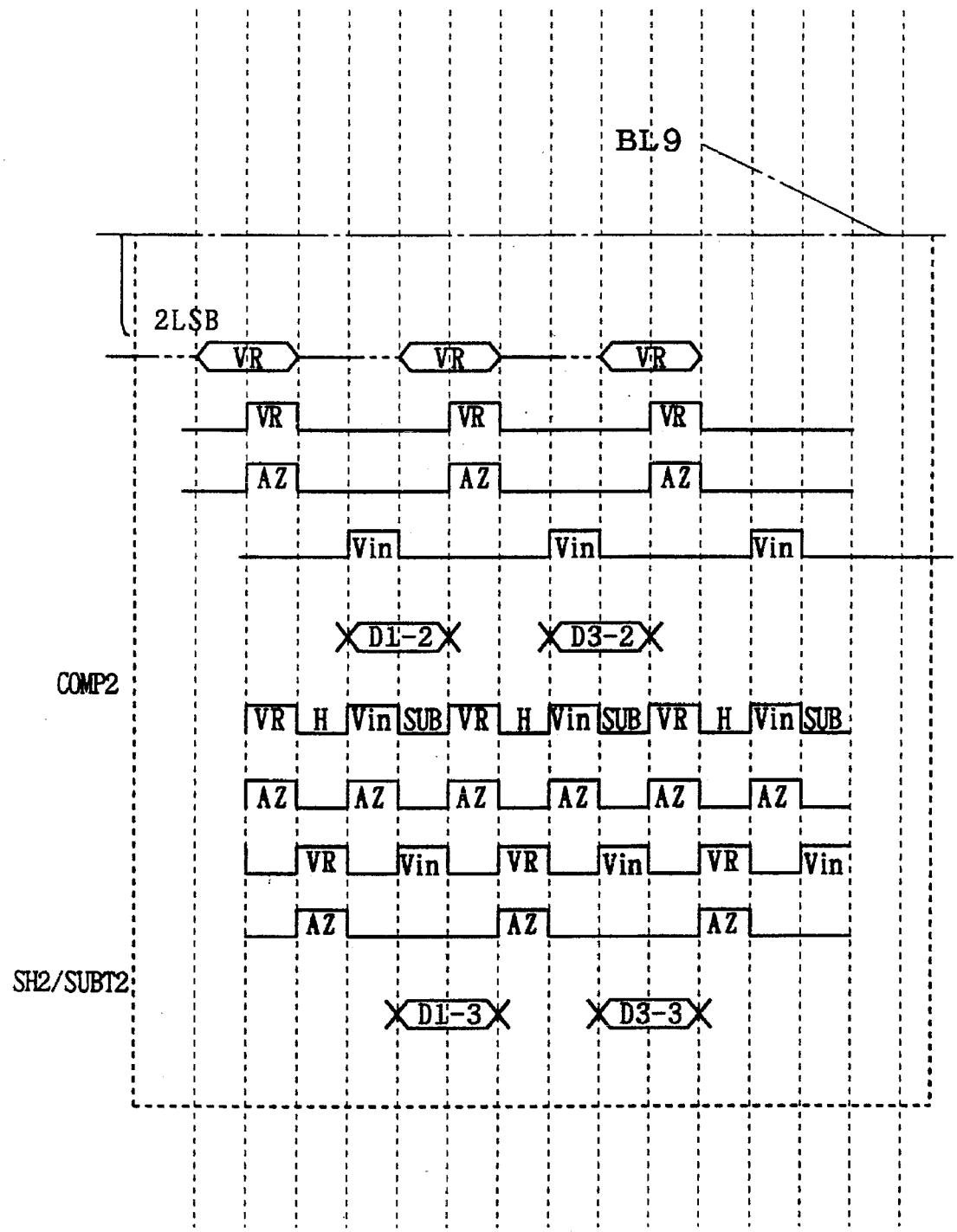
FIG. 42 is a timing chart showing the operations of the pipeline type A/D converter according to the fifth embodiment.

The timing chart of the fifth embodiment is given in FIG. 40 to FIG. 42 for reference.

Figure 43:
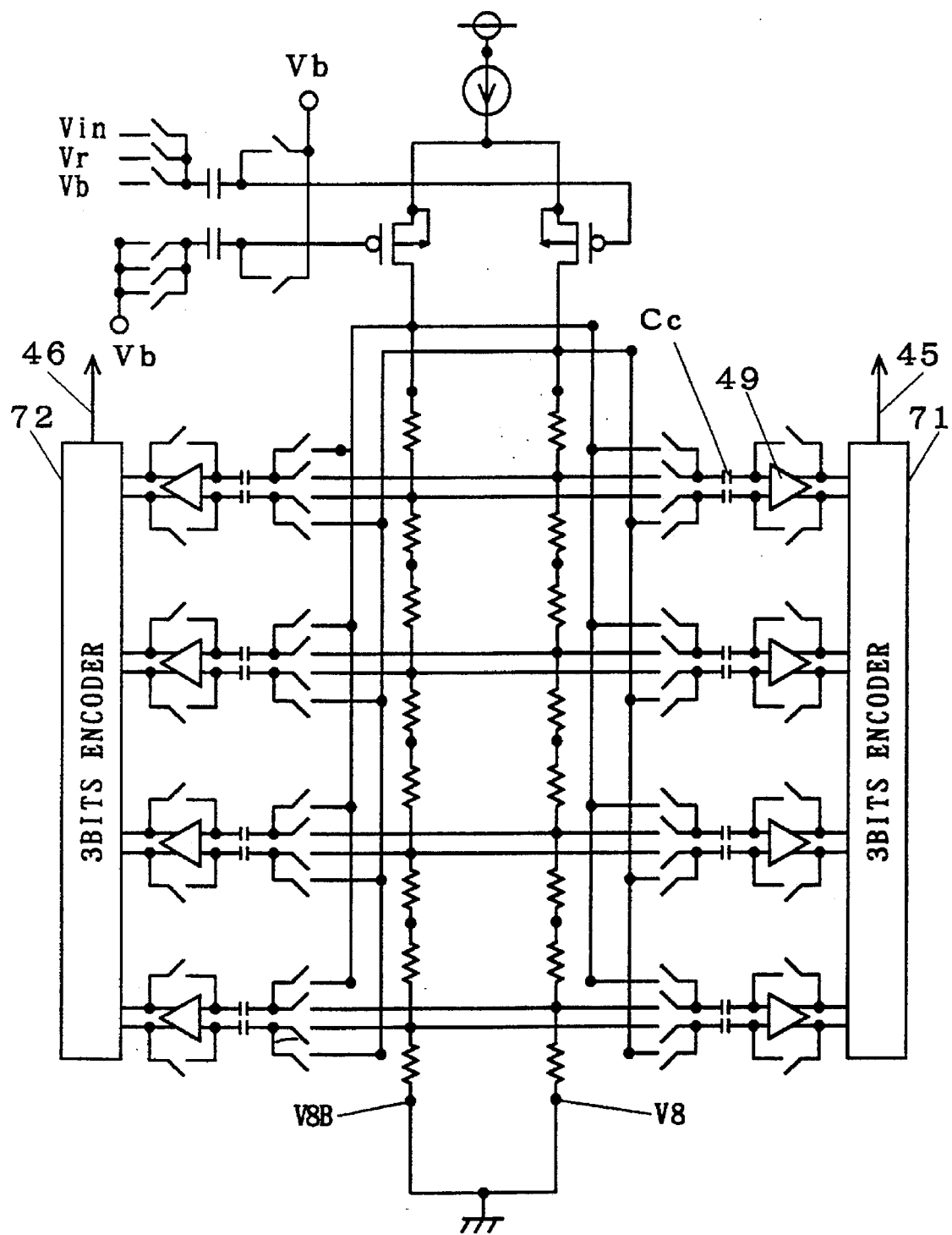
FIG. 43 is a drawing showing still other example of construction of the A/D converter block in the final stage according to the fifth embodiment.
Figure 44:
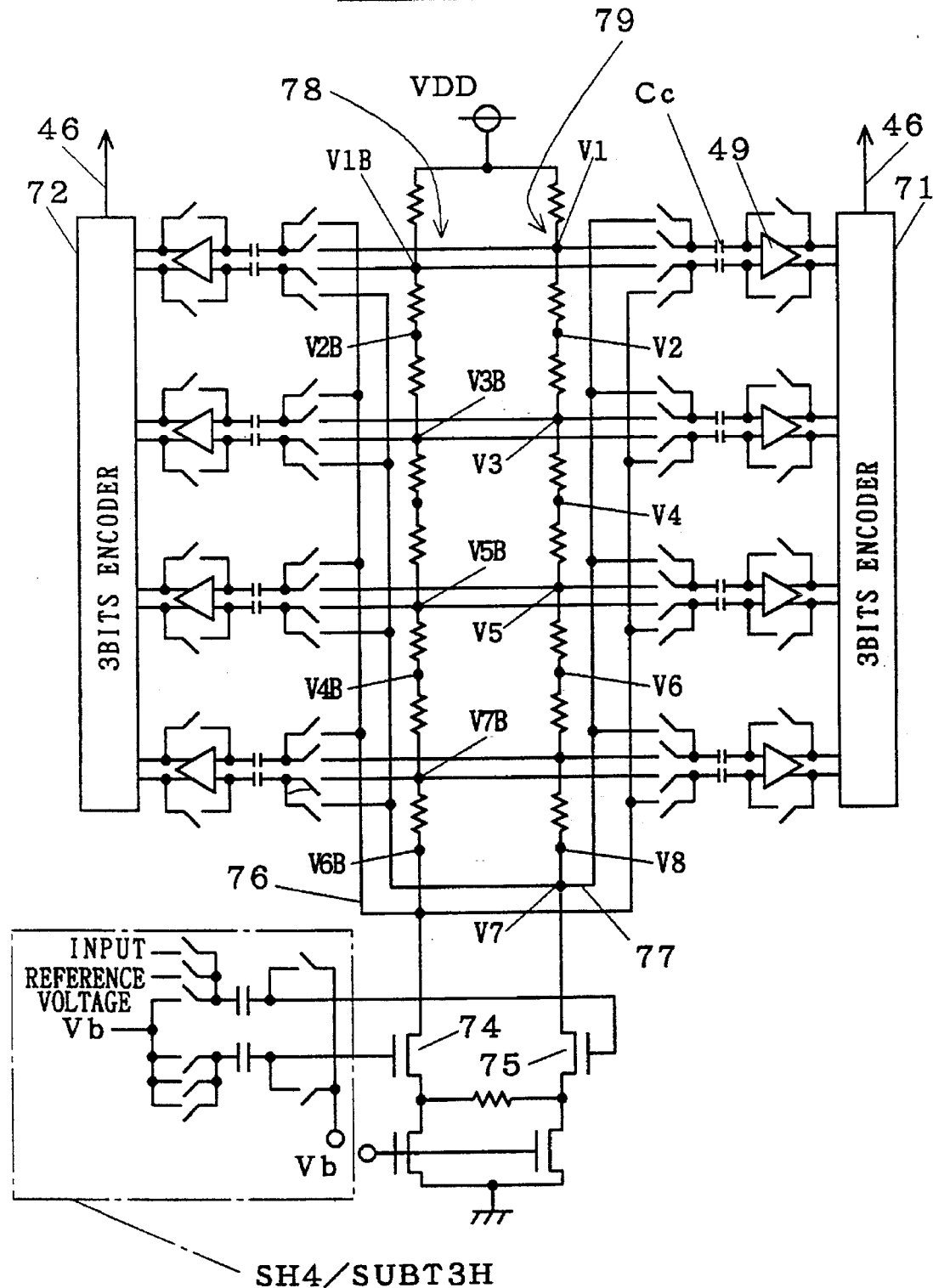
FIG. 44 is a drawing showing still other example of construction of the A/D converter block in the final stage according to the fifth embodiment.

Moreover, while the differential amplifiers (74, 75) used in FIG. 37 and FIG. 38 both have a differential pair constructed with NMOS transistors, those differential amplifiers may also be constructed with PMOS transistors instead (see FIG. 43), and it is also all right to use the degeneration type differential amplifiers (see FIG. 44) realized by inserting any resistor between the sources of MOS transistors of the differential pair.

Furthermore, while the load resistor of the differential pair in the differential amplifier is indicated with the resistor of passive element not only in the fifth embodiment but also in other embodiments, it may also be formed effectively with any active element such as PMOS transistor, etc.

Figure 45:
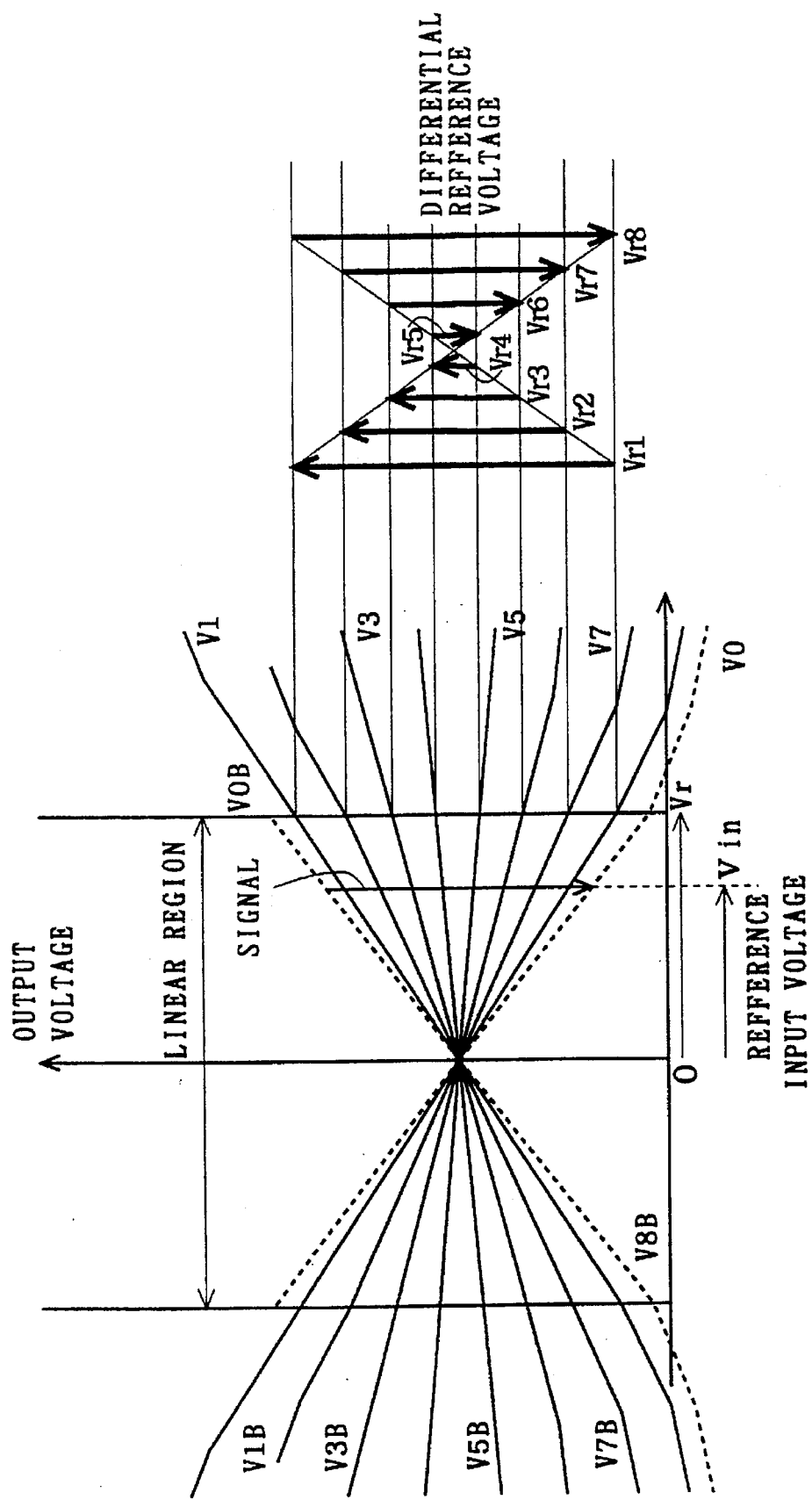
FIG. 45 is a drawing showing the relationship between reference voltage and input voltage in the respective A/D converter blocks in the second to the final stages of the first embodiment to the fourth embodiment.
Figure 46:
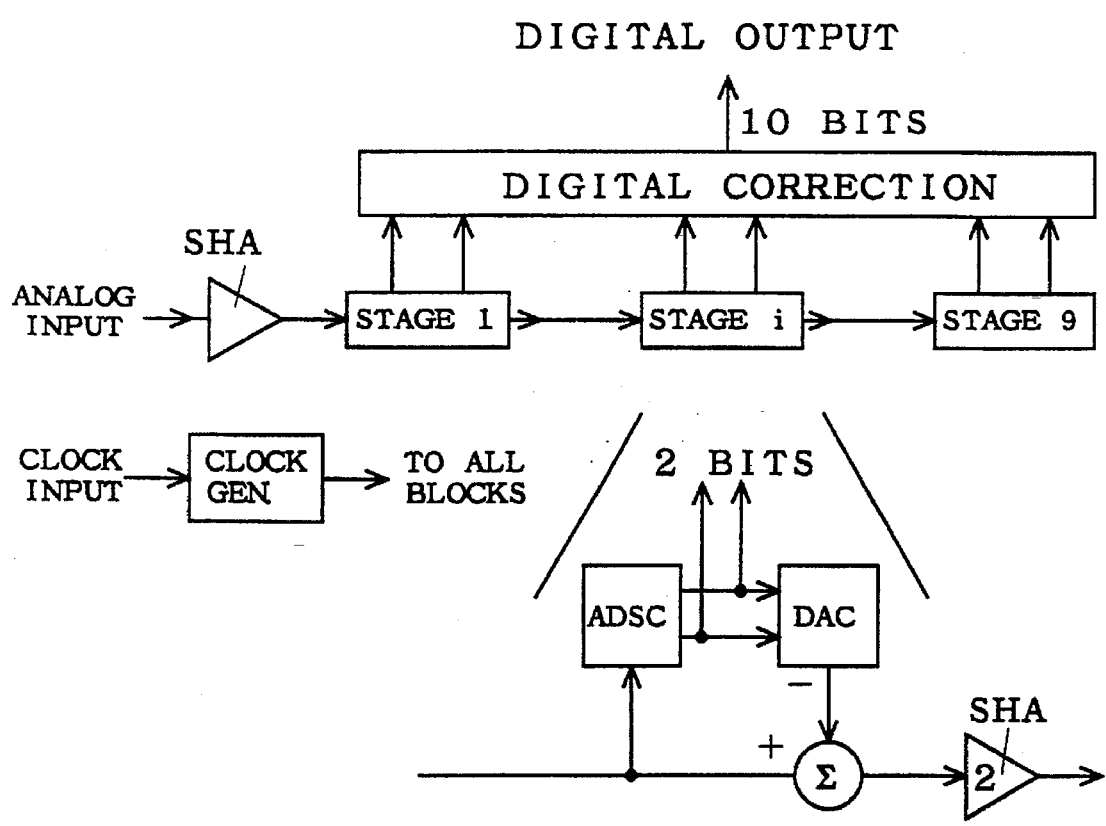
FIG. 46 is a drawing showing the construction of a conventional pipeline type A/D converter.
Figure 47:
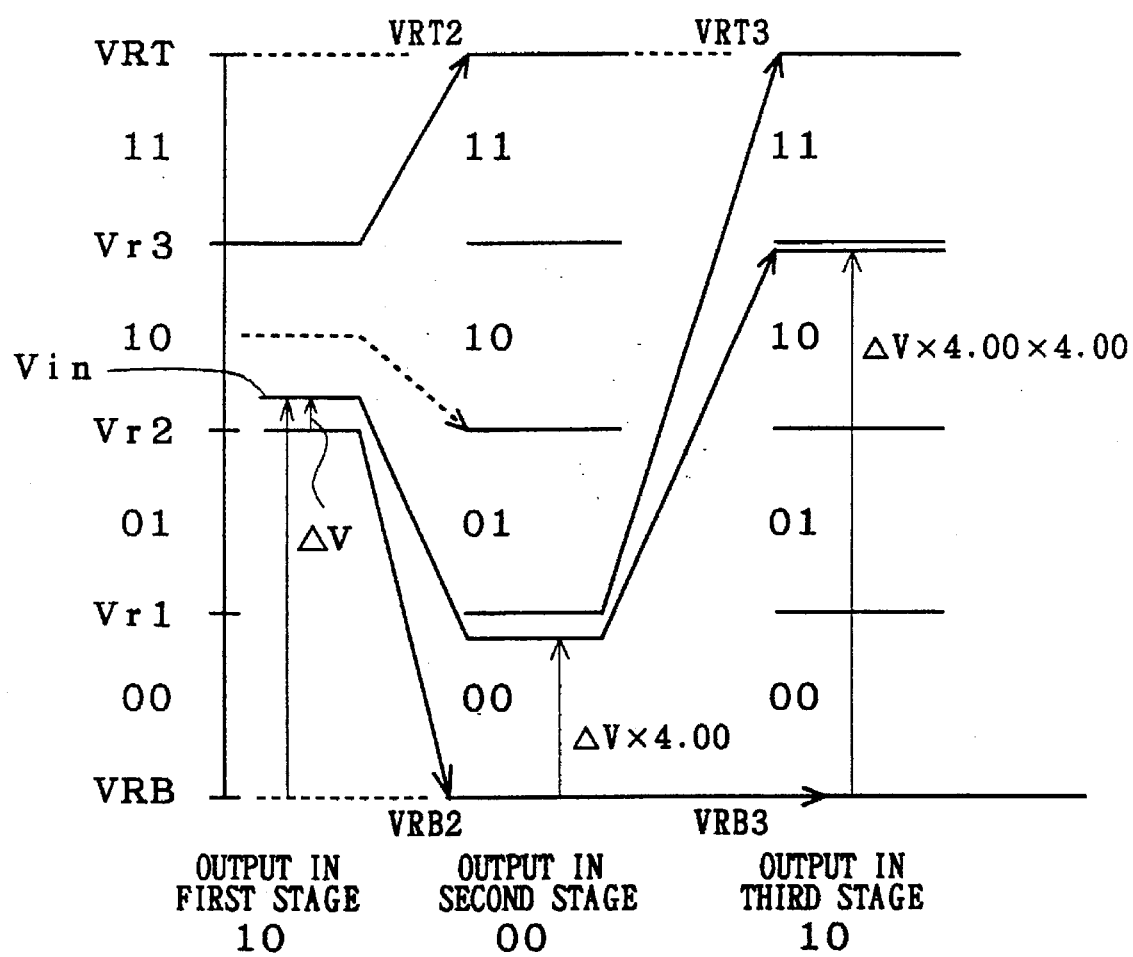
FIG. 47 is a drawing showing the operations of a conventional pipeline type A/D converter.
Figure 48:
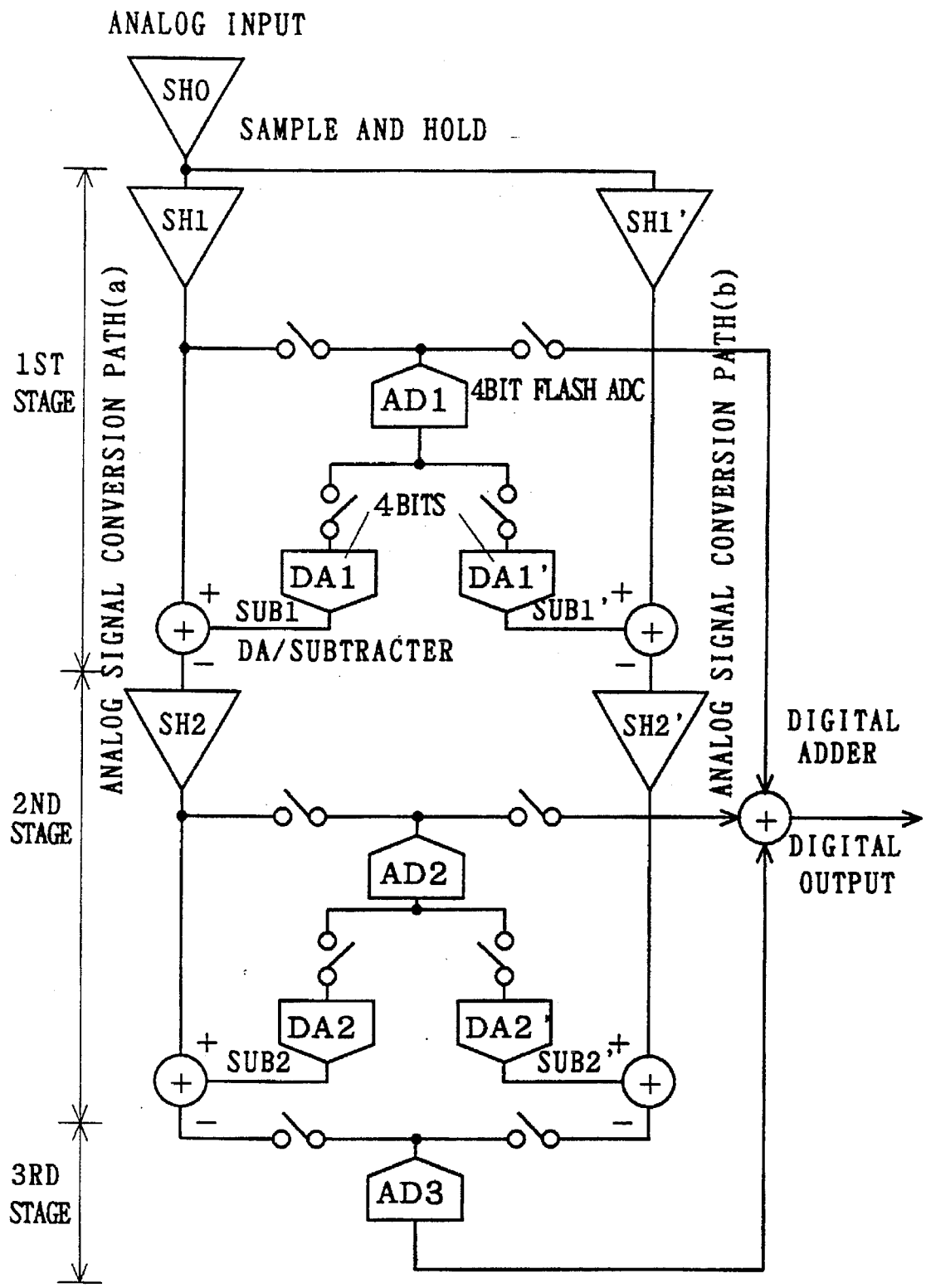
FIG. 48 is a drawing showing the construction of other conventional pipeline type A/D converter.

FIG. 45 indicates the relationship between the reference voltage and the input signal voltage in a case having the connection in the respective A/D converter blocks of the second to final stages of the first embodiment to the third embodiment, on the purpose of the comparison of those embodiments and the fifth embodiment.

While the invention has been shown and described in detail, the foregoing description is in all aspects illustrative and not restrictive. It is therefore understood that numerous modifications and variations can be devised without departing the scope of the invention.

We claim:

1. A pipeline type analog to digital converter comprising:

plural analog to digital converter stages connected in series, each stage comprising an analog to digital converter block for analog to digital converting analog input signals to a digital signal of a predetermined number of bits and for digital to analog converting a result of the analog to digital conversion to output a digital to analog conversion result, said input signals consisting of two differential input signals, each of said analog to digital converter blocks of the second to the final stages, comprising, first and second ladder-type resistors composed of plural serially connected resistors; and said pipeline type analog to digital converter further comprising in a path, between each stage from the second to the final stages, between said analog to digital converter block of a certain stage and said analog to digital converter block of its next stage, input signal S/H & subtracting means for sampling each of the input signals input to said analog to digital converter block of said certain stage at the same timing as inputting of said input signals to said analog to digital converter block of the certain stage and, at a time of holding, subtracting each of the two digital to analog outputs output by said analog to digital converter block of said certain stage from each of the corresponding sampled input signals to output the subtraction results, input signal differential amplifying means for differentially amplifying two outputs of said input signal S/H & subtracting means to output two outputs as input signals of said analog to digital converter block of said next stage and, at the same time, for applying said two outputs to opposite ends of said first ladder-type resistor in said analog to digital converter block of said next stage, reference voltage S/H means having the same circuit constants and the same circuit construction as said input signal S/H & subtracting means, for sampling and holding each of tap voltages taken out from a specific two taps inside said second ladder-type resistor in said analog to digital converter block of said certain stage, and reference voltage differential amplifying means for differentially amplifying two outputs of said reference voltage S/H means and for applying its two outputs, as reference voltages in said analog to digital converter block of said next stage, to opposite ends of said second ladder-type resistor in said analog to digital converter block of said next stage, and said input signal S/H & subtracting means and said reference S/H voltage means each alternately performing its respective sampling operation and holding operation.

2. A pipeline type analog to digital converter as defined in claim 1, wherein said specific two taps are selected so that the potential difference between a corresponding tap voltage and an intermediate value of first and second reference voltages applied respectively to opposite ends of said second ladder-type resistor correspond respectively to +0.5 LSB, −0.5 LSB.

3. A pipeline type analog to digital converter as defined in claim 1, wherein:

said analog to digital converter block of said first stage comprises an other ladder-type resistor equivalent to said second ladder-type resistor;

a signal which corresponds to one of said input signals in said first stage is a single-ended analog input signal;

another signal which corresponds to the other of said input signals in said first stage is a DC voltage equal to an intermediate value of an upper limit reference voltage and a lower limit reference voltage applied respectively to opposite ends of said other ladder-type resistor in said analog to digital converter block of said first stage, and the difference between two specific tap voltages in said other ladder-type resistor and said intermediate value of said upper and lower limit values of said reference voltage is a potential difference corresponding respectively to +0.5 LSB, −0.5 LSB;

said pipeline type analog to digital converter further comprising, in a path between said analog to digital converter block of said first stage and said analog to digital converter block of said second stage, other input signal S/H & subtracting means for sampling each of said analog input signal and said DC voltage input in said analog to digital converter block of said first stage at the same timing as inputting said analog input signal and said DC voltage input to said analog to digital converter block of said first stage and, at a time of holding, for subtracting each of two digital to analog outputs output by said analog to digital converter block of said first stage from the corresponding sampled analog input signal and DC voltage, to output the subtraction results;

other input signal differential amplifying means for differentially amplifying two outputs of said other input signal S/H & subtracting means to output two outputs as input signals of said analog to digital converter block of said second stage and, at the same time, for applying said two outputs to opposite ends of said first ladder-type resistor in said analog to digital converter block of said second stage;

other reference voltage S/H for means, provided with the same circuit constants and the same circuit construction as said other input signal S/H & subtracting means, for sampling and holding each of two predetermined tap voltages in said other ladder-type resistor in said analog to digital converter block of said first stage; and other reference voltage differential amplifying means for differentially amplifying two outputs of said reference voltage S/H means and for applying its two outputs, as said reference voltages in said analog to digital converter block of said second stage, to opposite ends of said second ladder-type resistor in said analog to digital converter block of said second stage, and said other input signal S/H & subtracting means and said other reference voltage S/H means each alternately performing its respective sampling operation and holding operation.

4. A pipeline type analog to digital converter comprising:

plural analog to digital converter stages connected in series, each stage comprising an analog to digital converter block for analog to digital converting an analog input signal to a digital signal of a predetermined number of bits and for digital to analog converting a result of the analog to digital conversion to output the digital to analog conversion result, said analog to digital converter block of the first stage directly receiving an analog input signal to be subjected to analog to digital conversion;

said analog to digital converter block of said first stage comprising a ladder-type resistor composed of plural serially connected resistors, and voltage comparators provided in correspondence to each of predetermined taps of said ladder-type resistor, said voltage comparators sampling said analog input signal at a certain timing and comparing the sampled analog input signal and a corresponding reference tap voltage at a time of holding; and said pipeline type analog to digital converter further comprising, in a path between said analog to digital converter block of said first stage and said analog to digital converter block of second stage, S/H & subtracting means for sampling said analog input signal at said certain timing and, at said time of holding, for performing subtraction of a digital to analog output of said analog to digital converter block of said first stage and the sampled analog input signal to output the result of said substraction, and amplifying means for amplifying an output of said S/H & subtracting means to output as the input signal of said analog to digital converter block of said second stage an output obtained on the basis of the amplification.

5. A pipeline type analog to digital converter as defined in claim 4, further comprising, in said path between said analog to digital converter block of said first stage and said analog to digital converter block of said second stage, S/H means, provided with the same circuit constants and the same circuit construction as said S/H & subtracting means, for sampling and holding two specific tap voltages in said ladder-type resistor; and reference voltage differential amplifying means for differentially amplifying respective outputs of said S/H means and for outputting an upper limit value and a lower limit value of reference voltages applied to said analog to digital converter block of said second stage, respectively, said S/H & subtracting means and said S/H means each alternately performing its respective sampling operation and holding operation.

6. A pipeline type analog to digital converter as defined in claim 5, wherein each of said analog to digital converter blocks in the second to final stages comprises, an other ladder-type resistor, and voltage comparators provided in correspondence to each of predetermined taps of said other ladder-type resistor, said voltage comparators sampling said input signal to be input to the respective analog to digital converter block at a certain next timing and for comparing, at a time of holding, said sampled input signal and a corresponding reference tap voltage on said other ladder-type resistor;

said pipeline type analog to digital converter further comprising, between each analog to digital converter block from said second stage to said final stage, other S/H & subtracting means for sampling said input signal at said next certain timing and, at said time of holding, for performing subtraction of a digital to analog output of the respective analog to digital converter block and said input signal which is being sampled by the respective block to output the result of said subtraction;

other amplifying means for differentially amplifying the output of said other S/H & subtracting means to output an amplified output as an input signal of said analog to digital converter block of the next stage;

other S/H means, provided with the same circuit constants and the same circuit construction as said other S/H & subtracting means, for sampling and holding each of two specific said reference tap voltages in said other ladder-type resistor in the respective analog to digital converter block and outputting respective outputs; and other reference voltage differential amplifying means for differentially amplifying the respective outputs of said other S/H means and for applying two outputs to opposite ends of said other ladder-type resistor in said analog to digital converter block of said next stage, said other S/H & subtracting means and said other S/H means each alternately performing its respective sampling operation and holding operation.

7. A pipeline type analog to digital converter as defined in claim 6, wherein;

said S/H & subtracting means comprises a first coupling capacitor which receives said analog input signal at its one end and a bias voltage at its other end during sampling, and receives said digital to analog output of said analog to the respective digital converter block at said one end and has said other end connected to an output terminal of said S/H & subtracting means during holding, and said S/H means comprises a second coupling capacitor which has the same value as said first coupling capacitor, said second capacitor having one end which receives said reference tap voltage taken out from said ladder-type resistor and an other end connected to said bias voltage during sampling, said second coupling capacitor receiving a constant voltage at its one end and having its other end connected to an output terminal of said S/H means during holding.

8. A pipeline type analog to digital converter as defined in claim 7, wherein each of said other S/H & subtracting means comprises a third coupling capacitor having one end which receives said input signal at said third coupling capacitor and an other bias voltage during sampling, another end which receives said digital to analog output of the respective analog to digital converter block at its one end and having its other end connected to an output terminal of said other S/H & subtracting means during holding, and each of said other S/H means comprises a further coupling capacitor which has the same value as said first coupling capacitor and has one end which receives said reference tap voltage taken out from said other ladder-type resistor and another end connected to said other bias voltage during sampling, and said another coupling capacitor receiving at its one end an other constant voltage and having its other end connected to an output terminal of said other S/H means during holding.

9. A pipeline type analog to digital converter as defined in claim 8, wherein said bias voltage applied to said S/H & subtracting means and said S/H means is also applied as a bias voltage of said voltage comparators in said analog to digital converter block of said first stage, and said other bias voltage applied to said other S/H & subtracting means and said other S/H means is also applied as a bias voltage of said other voltage comparators in the respective other analog to digital converter block.

10. A pipeline type analog to digital converter comprising:

a plurality of analog to digital converter stages connected in series, each stage comprising an analog to digital converter block for analog to digital converting an analog input signals to a digital signal of a predetermined number of bits and for digital to analog converting a result of the analog to digital conversion to output a digital to analog conversion result, said analog to digital converter block of the first stage directly receiving an analog input signal to be subjected to analog to digital conversion, and comprising a ladder-type resistor composed of plural serially connected resistors; and said pipeline type analog to digital converter further comprising, in a path between said analog to digital converter block of said first stage and said analog to digital converter block of the second stage, first S/H & subtracting means for sampling said analog input signal at a same timing as that of said analog to digital converter block of said first stage, for outputting a predetermined voltage value during sampling and, during holding, for subtracting a difference between the sampled value of said analog input signal and a value of the digital to analog output output by said analog to digital converter block of said first stage from said predetermined voltage value to output corresponding subtraction results;

second S/H & subtracting means for sampling two specific tap voltages in said ladder-type resistor at said same timing and outputting said predetermined voltage value during sampling and, during holding, for subtracting a difference between said intermediate reference tap voltage and said two specific tap voltages from said predetermined voltage value thereby to output corresponding subtraction results; and differential amplifying means for receiving outputs of said first and second S/H & subtracting means to obtain respective differential signals of said outputs and for outputting said differential signals to said analog to digital converter block of said second stage as said input signals and as reference signals, respectively.

11. A pipeline type analog to digital converter as defined in claim 10, wherein:

said analog to digital converter block of said first stage further comprises plural voltage comparators determined according to said predetermined number of bits and connected to predetermined ones of plural taps of said ladder-type resistor, and each of said voltage comparators compares a relative size of a difference between said analog input signal and an intermediate reference tap voltage and a difference between a reference tap voltage at said predetermined tap and said intermediate reference tap voltage, and said specific tap voltage is said intermediate reference tap voltage.

12. A pipe line type analog to digital converter comprising:

plural analog to digital converter stages connected in series, each stage comprising, an input signal differential amplifier having first and second inputs and first and second outputs and a reference voltage differential amplifier having first and second inputs and first and second outputs, both provided between successive stages for performing complementary differential operations, and an analog to digital converter block, comprising a ladder-type resistor having opposite ends coupled to two differential outputs of said reference voltage differential amplifier, and differential inputs for receiving two differential outputs of said input signal differential amplifier as input signals, for analog to digital converting said input signals to a result having a predetermined bit number and digital to analog converting the analog to digital conversion result and outputting the digital to analog conversion result, said ladder-type resistor having plural predetermined taps determined according to said predetermined bit number, each analog to digital converter block comprising, a comparison differential amplifier, having first and second inputs and first and second outputs, for comparison of voltages, a first switch provided between the first input and the first output of said comparison differential amplifier, for turning "on" when said input signal differential amplifier outputs said input signals and a bias voltage is applied to first and second inputs of said reference voltage differential amplifier, and for turning "off" when said reference voltage differential amplifier outputs two outputs at its first and second outputs and said bias voltage is applied to first and second inputs of said input signal differential amplifier, a second switch which is provided between the second input and the second output of said comparison differential amplifier, for turning "on" when said input signal differential amplifier outputs said input signals at its first and second outputs and said bias voltage is applied to the first and second inputs of said reference voltage differential amplifier, and for turning "off" when said reference voltage differential amplifier outputs said two outputs and said bias voltage is applied to the first and second inputs of said input signal differential amplifier, a first coupling capacitor having one end connected to said first input of said comparison differential amplifier and an other end connected to the first output of said input signal differential amplifier, a second coupling capacitor having one end connected to said first input of said comparison differential amplifier and another end connected to an other predetermined tap corresponding to the respective predetermined tap, a third coupling capacitor having one end connected to said second input of said comparison differential amplifier and another end connected to said predetermined tap, and a fourth coupling capacitor having one end connected to said second input of said comparison differential amplifier and another end connected to said second output of said input signal differential amplifier, a potential difference between a voltage at said predetermined tap and an intermediate reference tap voltage being equal to a potential difference between a voltage at said other predetermined tap and said intermediate reference tap voltage, said intermediate reference tap voltage corresponding to an average value of respective voltage values at both ends of said ladder-type resistor, and said first to fourth coupling capacitors all having one same capacity value.

13. A pipeline type analog to digital converter as defined in claim 12, further comprising in each of said stages:

a fifth coupling capacitor having one end connected to said first output of said input signal differential amplifier and another end connected to said first input of said input signal differential amplifier provided in a path between successive stages;

a sixth coupling capacitor having one end connected to the digital to analog output of said analog to digital converter block of the respective stage and another end connected to said other end of said fifth coupling capacitor;

a seventh coupling capacitor having one end connected the digital to analog output of said analog to digital converter block of the respective stage and another end connected to the second input of said input signal differential amplifier provided in said path between successive stages; and an eighth coupling capacitor having one end connected to the second output of said input signal differential amplifier and another end connected to said other end of said seventh coupling capacitor;

a third switch having one end connected to a bias voltage generating circuit for generating said bias voltage and another end connected to said other end of said fifth coupling capacitor, for turning "on" when said input signal differential amplifier outputs at its first and second outputs said input signals and said bias voltage is applied to said reference voltage differential amplifier, and for turning "off" when said reference voltage differential amplifier outputs said two outputs and said bias voltage is applied to said first and second inputs of said input signal differential amplifier;

a fourth switch having one end connected to said bias voltage generating circuit and another end connected to said other end of said seventh coupling capacitor, for turning "on" when said input signal differential amplifier outputs at its first and second outputs said input signals and said bias voltage is applied to said reference voltage differential amplifier, and for turning "off" when said reference voltage differential amplifier outputs at its first and second outputs said two outputs and said bias voltage is applied to the first and second inputs of said input signal differential amplifier, and the respective capacitor values of said fifth to eighth coupling capacitors being identical.

14. A pipeline type analog to digital converter comprising:

plural analog to digital converter stages connected to series, each stage comprising, an analog to digital converter block having a ladder-type resistor for analog to digital converting two input signals to a result having a predetermined number of bits, for digital to analog converting the analog to digital conversion result to output a digital to analog conversion result, and for transmitting, as reference voltages, reference tap voltages at two specific points of said ladder-type resistor to the next stage; and said pipeline type analog to digital converter further comprising, in a path between the stage preceding the final stage and said final stage, a first switch for selectively outputting one of said input signals transmitted form said stage preceding said final stage, two digital to analog output signals output by said analog to digital converter block of said stage preceding said final stage, a bias voltage and one of said reference tap voltages;

a second switch for selectively outputting an other of said input signals, said two digital to analog output signals, said bias voltage and an other of said reference tap voltages;

a first coupling capacitor having one end connected to an output of said first switch and an other end receiving said bias voltage in synchronization with the output of said one of said input signals from said first switch;

a second coupling capacitor having one end connected to an output of said second switch and an other end receiving said bias voltage in synchronization with the output of the other of said input signals from said second switch; and a differential amplifier having a one input connected to an other end of said first coupling capacitor, and other input connected to the other end of said second coupling capacitor, and first and second outputs being applied as said input signals to said analog to digital converter block of said final stage.

* * * * *